(12) United States Patent
Ooishi

(10) Patent No.: US 7,208,751 B2
(45) Date of Patent: Apr. 24, 2007

(54) NON-VOLATILE SEMICONDUCTOR MEMORY DEVICE ALLOWING SHRINKING OF MEMORY CELL

(75) Inventor: Tsukasa Ooishi, Hyogo (JP)

(73) Assignee: Renesas Technology Corp., Chiyoda-Ku, Tokyo (JP)

(*) Notice: Subject to any disclaimer, the term of this patent is extended or adjusted under 35 U.S.C. 154(b) by 4 days.

(21) Appl. No.: 10/389,753

(22) Filed: Mar. 18, 2003

(65) Prior Publication Data

US 2004/0051094 A1 Mar. 18, 2004

(30) Foreign Application Priority Data

Sep. 13, 2002 (JP) .............................. 2002-268026

(51) Int. Cl.
H01L 47/00 (2006.01)
H01L 27/10 (2006.01)
H01L 29/06 (2006.01)

(52) U.S. Cl. .................... 257/5; 257/2; 257/3; 257/4; 257/62; 257/529; 257/530; 365/182; 365/185

(58) Field of Classification Search ............... 257/5, 257/3, 4; 361/200, 163, 185.02, 185.03, 361/105
See application file for complete search history.

(56) References Cited

U.S. PATENT DOCUMENTS 5,526,308 A * 6/1996 Itoh ..................... 365/185.21
6,128,208 A 10/2000 Itoh et al.
6,141,241 A * 10/2000 Ovshinsky et al. ......... 365/163
6,191,979 B1 * 2/2001 Uekubo ................. 365/185.25
6,314,014 B1 * 11/2001 Lowrey et al. ............. 365/100
6,327,166 B1 12/2001 Itoh et al.
6,339,544 B1 * 1/2002 Chiang et al. ............. 365/163

(Continued)

FOREIGN PATENT DOCUMENTS

JP 2001-266565 9/2001

OTHER PUBLICATIONS

M. Gill et al., "Ovonic Unified Memory—A High-Performance Nonvolatile Memory Technology for Stand-Alone Memory and Embedded Applications", IEEE International Solid-State Circuits Conference, Feb. 5, 2002, Digest of Technical Papers, pp. 202-203.

*Primary Examiner*—Evan Pert
*Assistant Examiner*—Fazli Erdem
(74) *Attorney, Agent, or Firm*—Buchanan Ingersoll & Rooney PC

(57) ABSTRACT

Dummy cells are disposed in alignment with memory cells arranged in rows and columns in a memory array. The memory cell includes a variable resistance element and a select transistor having a collector connected to a substrate region and selecting the variable resistance element in response to a row select signal. Corresponding to a row of memory cells, there is provided a word line connecting to memory cells on corresponding row and transmitting the row select signal, and a word line shunting line electrically connected at predetermined intervals to each word line. Moreover, corresponding to a row of dummy cells and a column of dummy cells, there is provided substrate shunt lines electrically connected to the substrate region. The voltage distribution in the substrate region is eliminated to achieve stable operating characteristics of the memory cell transistor. In addition, a word line is driven at high speed by a word line shunt structure.

11 Claims, 32 Drawing Sheets

U.S. PATENT DOCUMENTS 6,483,754 B1* 11/2002 Agrawal ................ 365/189.04
6,816,404 B2* 11/2004 Khouri et al. .............. 365/163
2002/0131309 A1* 9/2002 Nishihara et al. ........... 365/200
2002/0142236 A1* 10/2002 Iwasaki et al. ................ 430/19
2003/0031045 A1* 2/2003 Hosotani .................... 365/158
2004/0012008 A1* 1/2004 Chen ............................. 257/2

* cited by examiner

MOD:L

NON-VOLATILE SEMICONDUCTOR MEMORY DEVICE ALLOWING SHRINKING OF MEMORY CELL

BACKGROUND OF THE INVENTION

1. Field of the Invention

The present invention relates to non-volatile semiconductor memory devices, particularly to a phase change memory in which the crystalline state changes according to the stored data. More specifically, the present invention relates to the technique for shrinking the components of a phase change memory.

2. Description of the Background Art

A non-volatile memory that stores data in a non-volatile manner is known as one type of a semiconductor memory device. Since data is stored in a non-volatile manner in such a non-volatile memory, data can be retained even if power is cut off. No power supply for data retention is required. Thus, non-volatile memories are widely utilized in various applications such as portable equipment.

As such a non-volatile memory, a magnetic memory that utilizes the magneto-resistance effect is known, in which the magnetic substance has a different resistance depending upon the direction of magnetic polarization. In the magnetic memory disclosed in Japanese Patent Laying-Open No. 2001-266565, for example, a closed magnetic circuit is formed in the memory cell. The direction of polarization of the magnetic element for data storage is set by altering the magnetic flux formed by the closed magnetic circuit according to stored data. In order to establish the direction of the magnetic flux in this closed magnetic circuit, the soft magnetic substance arranged in the closed magnetic circuit is heated to be converted into a paramagnetic substance.

This prior art approach requires the selection of a magnetic flux direction of the closed magnetic circuit corresponding to the stored data. In order to store 1-bit data, two soft magnetic substances must be disposed for the respective magnetic flux directions. Depending on the stored data, one soft magnetic substance is heated to open the closed magnetic circuit while the other soft magnetic substance is employed to set the direction of the magnetic flux formed in the closed magnetic circuit for determining the direction of magnetic polarization of the data storing magnetic element. Since two soft magnetic substances have to be disposed in order to selectively set one of the two magnetic flux directions for each memory cell of one bit, the area occupied by memory cell increases.

As a memory that stores data in a non-volatile manner by altering the physical state of a material, a phase change memory (OUM is known, which is disclosed, for example, in 2002 IEEE ISSCC Digest of Technical Papers 2002 February, pp. 202 to 203. A phase change memory takes advantage of the fact that the resistance change accompanies the change of the crystalline state. Such a phase change memory typically utilized that a chalcogenide layer is different in resistance between an amorphous state and a polycrystalline state. The crystalline state is altered by supplying a current flow to heat the chalcogenide layer by the Joule heat generated by the current for setting the crystalline state of the chalcogenide layer.

FIG. 44 schematically shows the layout of an array in a conventional phase change memory. In FIG. 44, memory cells arranged in three rows and three columns are depicted representatively.

Referring to FIG. 44, word lines WL0–WL2 are disposed corresponding to respective rows of memory cells MC. These word lines WL0–WL2 are each formed of a diffusion layer.

Corresponding to the columns of memory cells MC, bit lines BL0–BL2 are disposed, respectively. A memory cell MC includes a chalcogenide film CG storing data depending upon the crystalline state thereof, and a heater HT for heating the chalcogenide film CG. Although not explicitly depicted in FIG. 44, heater HT is coupled to a corresponding word line WL (WL0 to WL2) via a bipolar transistor.

FIG. 45 schematically shows a sectional structure taken along line 45A—45A shown in FIG. 44. Referring to FIG. 45, an N type impurity layer IMN is formed at the surface of a P type semiconductor substrate region SUB. Th N type impurity layers IMN constitute respective word lines WL0, WL1 and WL2. N type impurity layer IMN is formed continuously extending in the row direction. At the surface of N type impurity layer IMN, a P type impurity region IMP is formed corresponding to a memory cell location. P type impurity region IMP is connected to heater HT. A chalcogenide film CG is formed on and above heater HT. Bit line BL1 is formed extending in the column direction and is connected to chalcogenide film CG. Therefore, chalcogenide films CG of memory cells MC arranged in a column are electrically coupled at each respective one of bit line BL0–BL2.

Memory cell MC is constructed by a chalcogenide film CG, a heater HT, an impurity region IMP and an impurity layer IMN. A vertical PNP bipolar transistor is formed of impurity region IMP, impurity layer IMN and P type semiconductor substrate region SUB. N type impurity layer IMN functions as the base of the bipolar transistor and is set at an L (logical low) level for turning conductive the vertical bipolar transistor formed of impurity region IMP, impurity layer IMN, and semiconductor substrate region SUB.

In a data write mode, current flows from bit line BL (BL1 to BL2) to P type semiconductor substrate region SUB via the bipolar transistor in a conductive state. By the Joule heat at heater HT, chalcogenide film CG is heated, whereby the crystalline state thereof changes. Chalcogenide film CG has its crystalline state altered between an amorphous state and a polycrystalline state. In an amorphous state, chalcogenide film CG is high in resistance, and in general, this state is referred to as "reset state". In a polycrystalline state, chalcogenide film CG is low in resistance, and this state is referred to as a "set state".

To set an amorphous state or polycrystalline state, the write current pulse and the current amount are adjusted. In the aforementioned prior art document, the conditions set forth below are employed for writing data. Where chalcogenide film CG is to be set into an amorphous state, a voltage pulse of 0.8 to 0.9V and 8 ns (nano seconds) duration, for example, is applied to bit line BL (BL0–BL2). Where chalcogenide film CG is to be set into a polycrystalline state, a current pulse of approximately 0.5V and 85 ns, for example, is applied to the bit line. By altering the current pulse form according to the write data, chalcogenide film CG can be selectively set into an amorphous state of high resistance and a polycrystalline state of low resistance. The write current is supplied from an internal data line to a bit line via a column select gate.

In data reading, the amount of current flowing through chalcogenide film CG differs depending upon the crystalline state, and accordingly, the amount of current flowing through bit line BL (BL0–BL2) changes. In the aforementioned prior art document, an example is shown where the resistance in the amorphous state is 85 KΩ and the resistance in a crystalline state is 2KΩ. Also, as an example of the structure of the chalcogenide film, a Ge.Sb.Te alloy film is shown. Data is read out by detecting the amount of current flowing through this bit line.

FIG. 46 represents an electrical equivalent circuit of the memory cell arrangement shown in FIG. 44. In FIG. 46, memory cells MC are arranged in three rows and three columns. Memory cell MC includes a variable resistance element VR having a resistance thereof changing according to the stored information, and a transistor element TR rendered conductive, when a corresponding word line WL (WL0–WL2) is selected, to electrically couple a corresponding variable resistance element VR to a collector line CK (CK0–CK2).

Variable resistance element VR is connected to a bit line BL (BL0–BL2) arranged at a corresponding column. Variable resistance element VR includes a chalcogenide film CG and a heater HT shown in FIG. 45. Transistor element TR is formed of impurity region IMP, N type impurity layer IMN and substrate region SUB shown in FIG. 45. Corresponding to each column of memory cells MC, there are arranged collector lines CK0–CK2 each having the collectors of the transistor elements connected. As shown in FIG. 45, these collector lines CK0–CK2 are coupled to semiconductor substrate region SUB, and are each biased to, for example, the ground voltage.

When a memory cell MC located at the crossing between bit line BL1 and word line WL1 is selected in the memory array equivalent circuit of FIG. 46, word line WL1 is set to, for example, an L level of the ground voltage, and unselected word lines WL0 and WL2 are maintained at an H level of the power supply voltage level. In such a state, transistor element TR of memory cell MC is rendered conductive in accordance with the L level signal on word line WL1, and variable resistance element VR is coupled to collector line CK1 (semiconductor substrate region SUB).

In data writing, one of a reset current Irst and a set current Iset for setting the chalcogenide layer in variable resistance element VR to a reset state and a set state, respectively, is supplied to bit line BL1 according to the write state. By this current, current flows from bit line BL1 to collector line CK1 (substrate region) via transistor TR. The heater in variable resistance element VR is heated by the Joule heat, whereby the chalcogenide layer is set to the reset state (amorphous state) or the set state (polycrystalline state).

Unselected bit lines BL0 and BL2 are set at an L level of, for example, the ground voltage. At this stage, even when word line WL1 is in a selected state and the corresponding transistor element TR is rendered conductive, no current flows since the corresponding bit line BL and collector line CK (semiconductor substrate region) are at the same voltage level. Therefore, the resistance of the variable resistance element does not change in the unselected memory cell.

In data reading, a readout current is caused to flow into a selected bit line (for example, BL1). This readout current flows to collector line CK (for example, CK1) via variable resistance element VR and transistor element TR. This bit line current is detected by a sense amplifier in a readout circuit not shown, whereby the memory cell data is read out.

FIG. 47 shows, in more detail, the electrical equivalent circuit of FIG. 46. As already described, word line WL (WL0–WL2) is formed of an impurity layer and is associated with an RC component based on the diffusion resistance and the junction capacitance. In FIG. 47, a diffusion resistance Rpw connected to word line WL2 is depicted as a representative parasitic resistance.

Collector line CK (CK0–CK2) is a semiconductor substrate region, and therefore, collector lines CK0–CK2 are interconnected together. In this case, substrate resistance Rps contributes to the parasitic resistance component. In addition, there is present a parasitic capacitance such as the junction capacitance between the substrate region and the diffusion layer (impurity layer). In FIG. 47, substrate resistance Rps connected to collector line CK0, and a substrate resistance Rps between collector lines CK0 and CK1, and between collector lines CK1 and CK2 are depicted as the representative substrate resistance.

Word line WL cannot be driven to a selected state at high speed by such parasitic RC component. There is a problem that the access time becomes longer.

It is to be noted that transistor element TR in memory cell MC is a bipolar transistor, or is a current driven type transistor. When a potential distribution is generated in a selected word line, the operation characteristics of the transistor element TR included in these memory cells MC will be changed to change the amount of current flowing through the selected memory cell. There is a problem that data writing and reading cannot be performed correctly.

When a potential distribution is generated in collector line CK (CK0–CK2) by substrate resistance Rps, the amount of current flowing from bit line BL (BL0–BL2) to a corresponding collector line CK via transistor element TR of memory cell MC will differ in data writing. Thus, there is a similar problem that data writing and reading cannot be performed accurately.

Particularly, when the memory cell size is shrunk greatly, the entire volume of the chalcogenide layer becomes smaller, the change in resistance corresponding to stored data will become smaller, resulting in a smaller change in current amount. In such a case, the problem of potential distribution on word line WL and collector line CK caused by diffusion resistance Rpw and substrate resistance Rps becomes more severe.

In data writing, the bottom portion of the chalcogenide film included in variable resistance element VR connected to the heater causes phase-change by the heat from the heater. In such arrangement, phase-change does not occur over the entire chalcogenide film. The aforementioned prior art document describes that the volume of the portion that causes phase-change in the chalcogenide film is small, and therefore, the energy required for data writing can be saved to allow reduction of power consumption. Such partial heating serves to prevent the heating from affecting an unselected bit line. However, if the entire chalcogenide film becomes smaller in accordance with miniaturization of memory cells, the resistance cannot be changed sufficiently according to the stored data in the case when phase change is effected at only a portion of the small chalcogenide film. In is difficult to accurately write/read data in such a situation.

SUMMARY OF THE INVENTION

An object of the present invention is to provide a non-volatile semiconductor memory device and non-volatile memory cell that can have the memory cell size reduced without degradation in memory characteristics.

Another object of the present invention is to provide a non-volatile semiconductor memory device and non-volatile memory cell that can write and read data at high speed correctly.

A non-volatile semiconductor memory device according to a first aspect of the present invention includes a plurality of memory cells arranged in rows and columns and each having the physical state set according to stored data to store data in a non-volatile manner, and a plurality of dummy cells arranged in alignment with the plurality of memory cells in at least one of a row and column direction and each having a layout identical to that of the memory cell.

According to a second aspect of the present invention, a non-volatile memory cell includes a phase change element having the crystalline state changed according to stored data, a heater element coupled to the phase change element to heat the phase change element, and a heat blocking layer formed at a region in at least one of a region between the heater element and a semiconductor substrate region and a region between the phase change element and a data transfer line to block propagation of heat from the heater element.

According to a third aspect of the present invention, a non-volatile semiconductor memory device includes a plurality of bit lines each extending in a column direction, and a plurality of memory cells arranged in rows and columns. The plurality of memory cells are arranged such that a plurality of bit lines are disposed corresponding to the respective columns. Each memory cell includes a phase change element having a width substantially identical to a row-direction width of a bit line in a corresponding column, and having the crystalline state changed according to stored data.

By arranging dummy cells of the same layout in alignment with the memory cells, regularity of the layout pattern can be maintained by the dummy cells even when the size of memory cells is reduced. Therefore, fine-feature memory cells maintaining the proper layout can be formed.

Arrangement of the dummy cells provides the advantage that the regularity of the memory cell layout will not be interrupted by the shunt line, even where a shunt structure directed to reducing of the resistance in the substrate or word line is employed.

Moreover, the provision of a heat blocking layer between a heater element and a substrate region or between a phase change element and a data transfer line provides the advantage of preventing the heat generated in a data write operation from adversely exerting an adjacent memory cell. By virtue of this heat blocking layer, heat can be concentrated at the phase change layer so as to heat the entire of the phase change layer to cause phase change. Therefore, even if the cell size is reduced, change in resistance can be caused to a sufficient level in the phase change layer.

By forming the phase change layer in self-alignment with the bit line so as to have a width substantially equal to that of the bit line, the phase change layer can be reduced in size. Accordingly, the memory cell size can be reduced.

Even if the line width is reduced in accordance with scaling down of elements, forming an impurity region connected to the heater of the memory cell transistor into a shunt structure achieves a reduced resistance of the impurity region and enables prevention of generation of a voltage distribution in the impurity region. Therefore, data can be written and read correctly.

In a data read operation, memory cell data is compared with the data from two dummy cells to generate internal read out data based on the comparison result. Therefore, even if the bit line current is reduced in accordance with ultra-miniaturization of the elements, data can be read out accurately. If data of 1 bit is stored by two memory cells, data can be read out accurately even if the memory cell size is reduced to cause reduction in the bit line current.

In a data write operation, data of 1 bit can be readily stored by two memory cells by writing complementary data into memory cells in a second operation mode. Therefore, data can be stored accurately even if the memory cell size is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
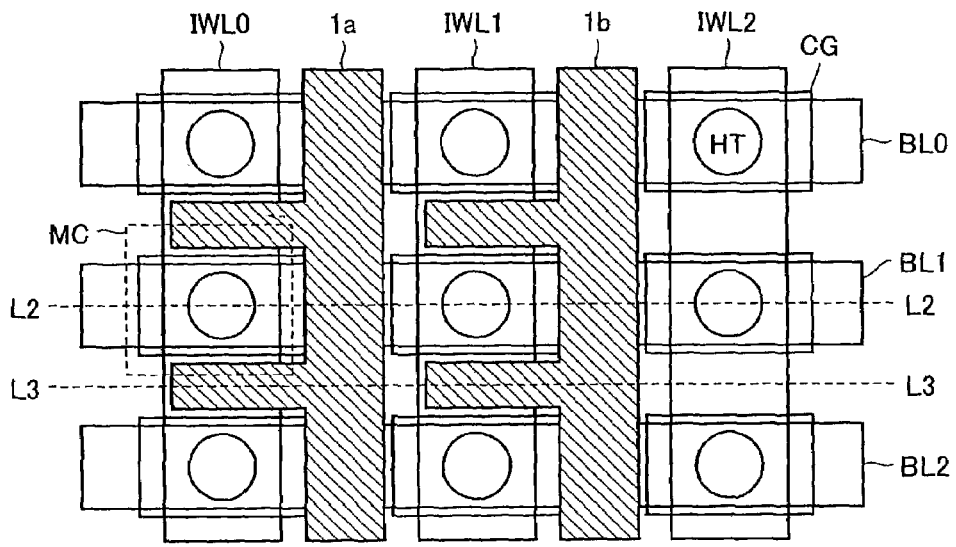
FIG. 1 schematically shows the layout of a memory array in a semiconductor memory device according to a first embodiment of the present invention.

FIG. 1 schematically shows the layout of the memory array of a non-volatile semiconductor memory device according to a first embodiment of the present invention. FIG. 1 shows the layout of memory cells MC arranged in three rows and three columns. Referring to FIG. 1, word lines WL0–WL2 are provided corresponding to the respective rows of memory cells MC, and bit lines BL0–BL2 are disposed corresponding to the respective columns of memory cells MC, as in the conventional example. Word lines WL0–WL2 are each formed of an impurity layer located at the surface of a semiconductor substrate. Word lines WL0–WL2 each extend continuously in the row direction.

Memory cell MC includes a chalcogenide film CG of a rectangular feature coupled to bit line BL (indicating generically BL0–BL2), a heater HT for heating chalcogenide film CG, and a transistor element formed between this heater and a substrate region not shown. In FIG. 1, the transistor element included in memory cell MC is not depicted.

Word line shunting lines 1a, 1b . . . are disposed parallel to word lines WL0–WL2 at respective regions between word lines WL0–WL2. In FIG. 1, two word line shunting lines 1a and 1b are depicted representatively. Each of word line shunting lines 1a and 1b includes a projection region extending in the column direction at a region between memory cells adjacent in the row direction. The word line shunting line is electrically connected to the impurity layer of the word line formed at a lower layer through this projection region. Word line shunting lines 1a and 1b are formed having a sawtooth configuration so as to surround the heater of each memory cell MC.

Word line shunting lines 1a and 1b are interconnection lines located below bit line BL, and is a conductive film of low resistance formed at a layer lower than chalcogenide film CG. By making electrical contact between these word lines WL0–WL2 and word line shunting lines 1a and 1b of low resistance at the region between memory cells MC in the row direction, the electrical resistance of word line WL (indicating generically WL0–WL2) formed of an impurity layer is reduced equivalently. Accordingly, voltage distribution in word line WL can be reduced. Even if the diffusion resistance is increased, the electrical equivalent resistance of word line WL can be made small enough to allow a word line to transmit a word line select signal at high speed.

Figure 2:
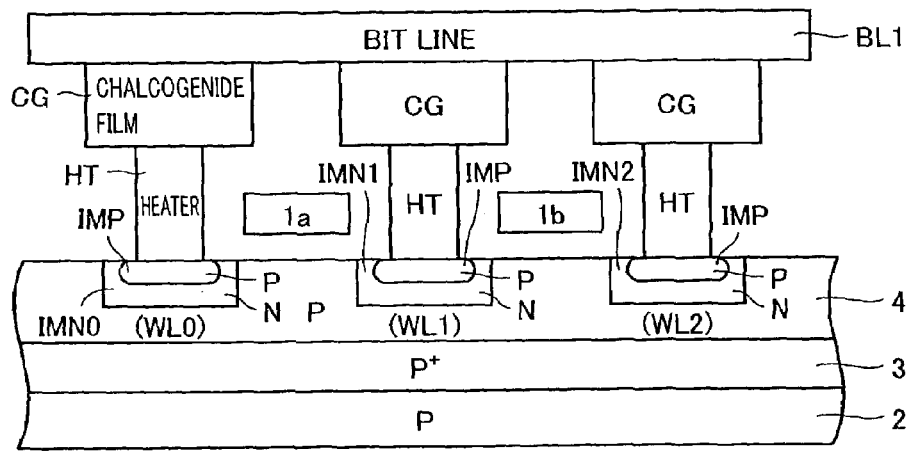
FIG. 2 schematically shows a sectional structure taken along line L2—L2 of FIG. 1.

FIG. 2 schematically shows a sectional structure taken along line L2—L2 of FIG. 1. Referring to FIG. 2, a high-concentration P type (P+) impurity region 3 is formed at the surface of a semiconductor substrate region 2. A P type semiconductor substrate region 4 is formed on high-concentration P type impurity layer 3.

Word lines WL0–WL2 are formed by N type impurity layers IMN0–IMN2 extending along the row direction and formed in a column direction spaced apart from each other at the surface of P type semiconductor substrate region 4.

At the surface of N type impurity layers IMN0–IMN2, a P type impurity region IMP is formed corresponding to heater HT of the memory cell. P type impurity region IMP is electrically connected to heater HT of a corresponding memory cell. A chalcogenide film CG is formed above heater HT. Chalcogenide film CG is electrically connected to bit line BL1.

Word line shunting lines 1a and 1b are disposed at the region between heaters HT. By forming word line shunting lines 1a and 1b at a layer lower than chalcogenide film CG, electrical contact with N type impurity layer IMN (indicating IMN0–IMN2 generically) formed at the surface of substrate region 4 is facilitated when to be made. The height of the entire memory cell is not required to increase unnecessarily even if such word line shunting lines are arranged.

Figure 47:
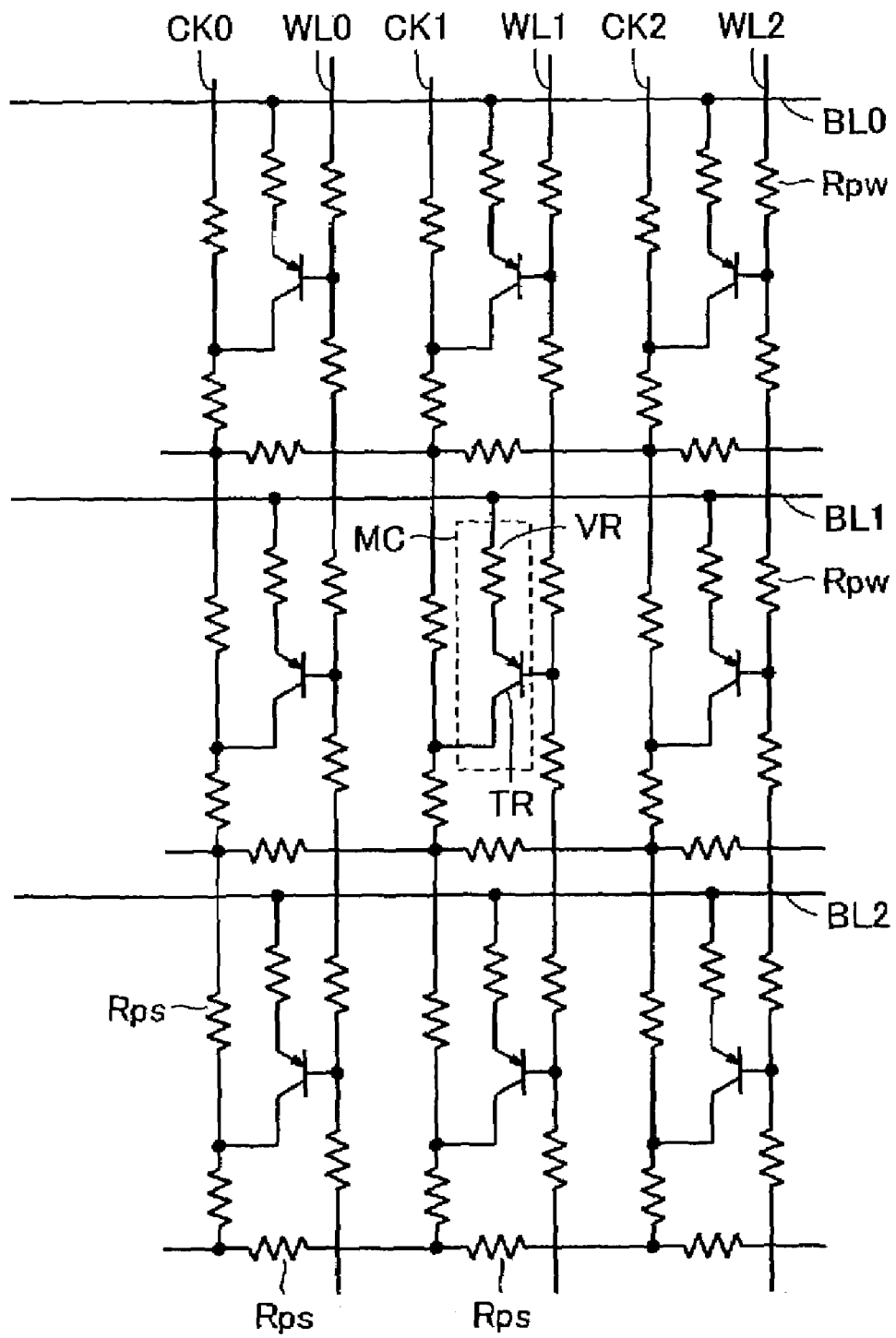
FIG. 47 represents the parasitic resistance of the memory cell array of FIG. 46.

Semiconductor substrate region 4 functions as a collector region of a select transistor of memory cell MC. The select transistor of memory cell MC is formed of impurity region IMP, N type impurity layer IMN, and P type semiconductor substrate region 4, as in the conventional case. By forming a P type impurity layer 3 of high concentration at a layer below semiconductor substrate region 4, the equivalent resistance of semiconductor substrate region 4 can be reduced. Therefore, the substrate resistance Rps component of collector line CK (CK0–CK2) shown in FIG. 47 can be reduced.

Figure 3:
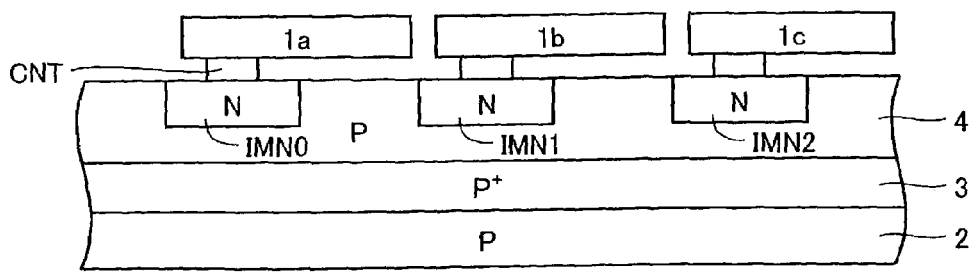
FIG. 3 schematically shows a sectional structure taken along line L3—L3 of FIG. 1.

FIG. 3 schematically shows a sectional structure taken along line L3—L3 of FIG. 1. In the layout of FIG. 3, no memory cell MC is present. The sectional structure of the region between memory cell MC is shown in FIG. 3. At the surface of semiconductor substrate region 4, impurity layers IMN0, IMN1 and IMN2 are formed extending in the row direction and word line shunting lines 1a and 1b are formed projecting in the column direction. Each of word line shunting lines 1a and 1b is electrically connected to corresponding impurity layers IMN0–IMN1 via a contact CNT. In FIG. 3, a word line shunting line 1c arranged at the right side of word line WL2 shown in FIG. 1 is depicted. Word line shunting line 1c is electrically connected to a corresponding impurity layer IMN2 via contact CNT.

In FIG. 3, word line shunting lines 1a–1c extend in the column direction to make electrical contact with corresponding impurity layers IMN0–IMN2, respectively, in the region where there is no memory cell MC and heater HT. Specifically, word line shunting lines 1a–1c extend linearly in the row direction at the region between heaters HT in the column direction, and make electrical contact with word lines WL0–WL2, respectively, at the region between adjacent memory cells in the row direction. Therefore, a word line shunt structure can be implemented to reduce resistance of word line WL without affecting the layout of memory cell MC.

Figure 4:
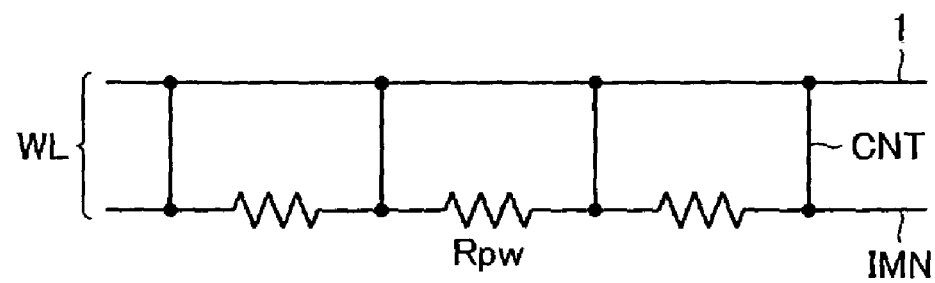
FIG. 4 shows an electrically equivalent circuit of a word line shunting line of FIG. 1.

FIG. 4 is an electrical equivalent circuit of the word line shown in FIGS. 1–3. Referring to FIG. 4, impurity layer IMN has a parasitic resistance Rpw corresponding to the diffusion resistance thereof. A word line shunting line 1 of low resistance is provided for this impurity layer IMN. Word line shunting line 1 is electrically connected to impurity layer IMN via contacts CNT. Therefore, parasitic resistance Rpw of impurity layer IMN is short-circuited by word line shunting line 1 of low resistance to reduce the equivalent resistance of word line WL. Thus, a signal can be transmitted via word line WL at high speed. Furthermore, the voltage distribution of the word line can be reduced to allow a selected memory cell to be driven to a selected state accurately for operation under the same condition.

In this word line shunt structure, word line WL is constructed by impurity layer IMN and word line shunting line 1.

Figure 5:
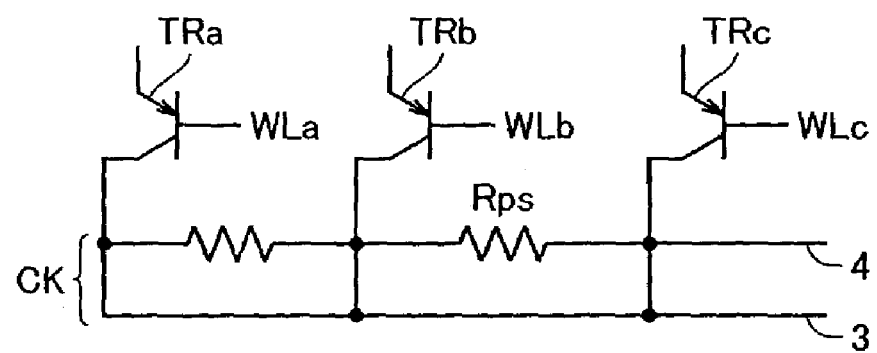
FIG. 5 shows an electrical equivalent circuit of a transistor having the structure shown in FIGS. 2 and 3.

FIG. 5 shows an electrical equivalent circuit of collector line CK. Collector line CK is constructed by high-concentration P type impurity layer 3 and P type substrate region 4. Impurity layer 3 and substrate region 4 are provided commonly to the memory cells arranged in the memory cell array, and have all the collectors of the transistors of memory cells MC coupled in common. Impurity layer 3 and substrate region 4 are biased at, for example, the ground voltage level. In FIG. 5, memory cell transistors TRa–TRc are depicted representatively. Memory cell transistors TRa–TRc have their bases connected to word lines WLa–WLc, respectively. The collectors of memory cell transistors TRa–TRc are coupled to substrate region 4 and high-concentration P type impurity layer 3.

Substrate region 4 has parasitic resistance Rps corresponding to the substrate resistance. High-concentration P type impurity layer 3 has a small resistance value, and short-circuits parasitic resistance Rps. Therefore, the resistance of collector line CK can be reduced to eliminate voltage distribution in collector line CK, as in the word shunt line. Thus, current can flow stably during data writing/reading at a selected memory cell to allow data to be written/read out correctly.

High-concentration P type impurity layer 3 may be formed of an epitaxially-grown impurity layer at the surface of semiconductor substrate 2. Alternatively, high-concentration P type impurity layer 3 may be formed of an ion implanted layer with the implantation energy controlled.

Figure 6:
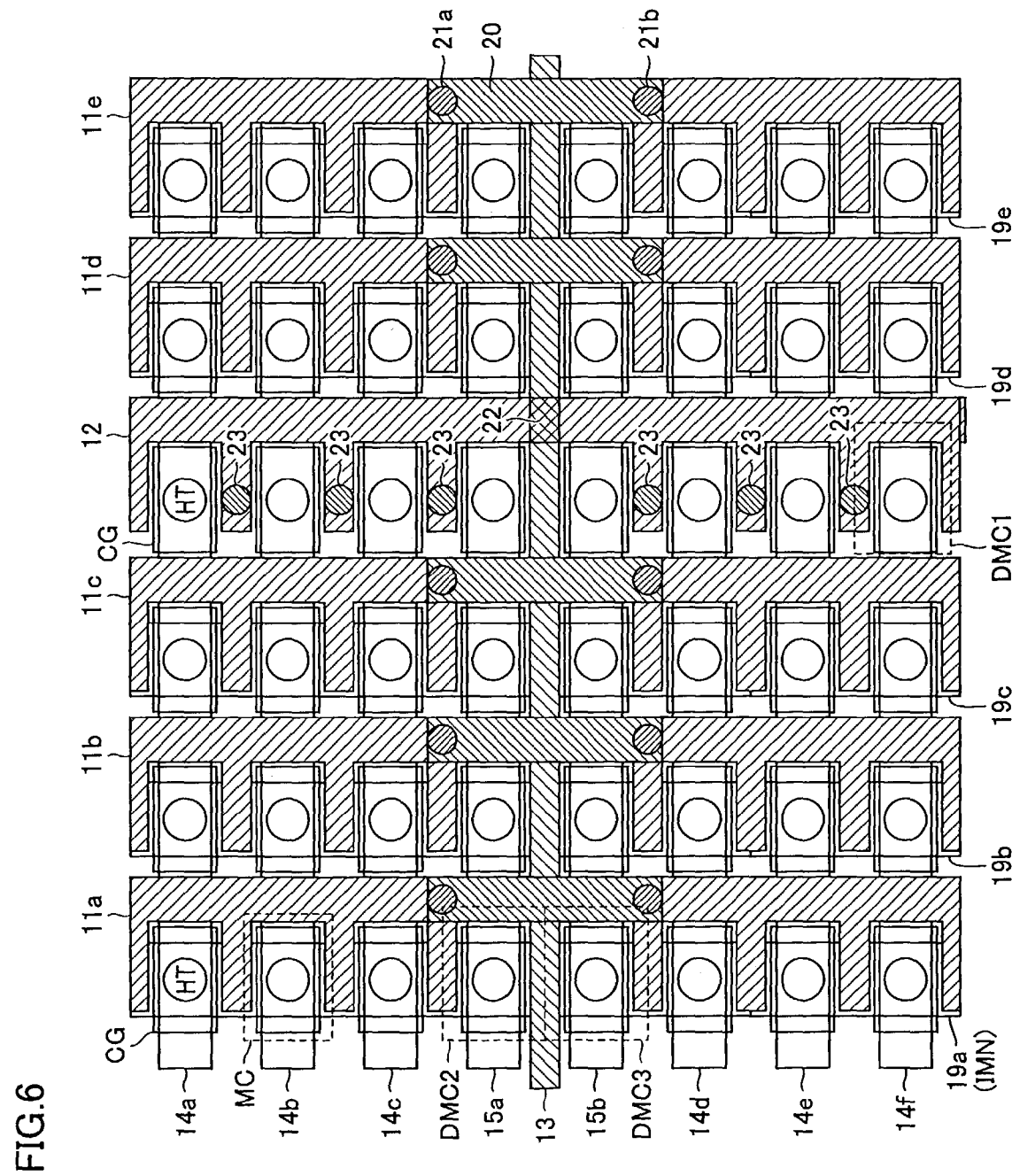
FIG. 6 specifically shows a layout of the memory array in a non-volatile semiconductor memory device according to the first embodiment of the present invention.

FIG. 6 specifically shows the layout of the memory array of a non-volatile semiconductor memory device according to the first embodiment of the present invention. In FIG. 6, memory cells MC are arranged in rows and columns. Memory cell MC includes chalcogenide film CG and heater HT. Corresponding to the respective rows of memory cells MC, impurity layers 19a–19e are arranged extending continuously in the row direction. Impurity layers 19a–19e correspond to impurity layer IMN (IMN0–IMN2) shown in FIGS. 2 and 3. The select transistor included in memory cell MC is formed between a corresponding impurity layer 19 (indicating 19a–19e generically) and a region beneath heater HT.

Word line shunting lines 11a–11e are arranged corresponding to the respective rows of memory cells MC. Each of word line shunting lines 11a–11e includes a projection extending in the column direction at a region between memory cells adjacent in the row direction in a corresponding memory cell row to be electrically connected to the corresponding impurity layer 19 (19a–19e) located below the projection region.

A dummy cell DMC1 is disposed in arrangement in one column between the memory cell rows. Dummy cell DMC1 has a layout identical to that of memory cell MC, and includes chalcogenide film CG and heater HT. A collector line shunting line 12 is disposed extending in the row direction corresponding to the row of dummy cell DMC1.

Collector line shunting line 12 is electrically connected to the substrate region via a contact 23 at regions between dummy cells DMC1 adjacent in the row direction.

A diffusion word line is not formed for dummy cell DMC1. A P type substrate region is exposed at this dummy cell row. Heater HT is coupled with the P type substrate region. In this structure, the contact resistance between heater HT and the P type substrate region is made large enough for dummy cell DMC1. This prevents the flow of current from a selected bit line to the P type substrate region via dummy cell DMC1 when a memory cell on a column identical to that of dummy cell DMC1 is selected.

Alternatively, a dummy diffusion word line (N type impurity layer) can be formed for a row of dummy cells DMC1, and the contact between collector line shunting line 12 and the substrate region may be formed at the region between dummy cell DMC1 and the memory cell. In such a structure, heater HT of dummy cell DMC1 is coupled to the substrate region via the N type impurity layer. By fixing the dummy diffusion word line to the H level voltage, the flow of current through heater HT at dummy cell DMC1 can be reliably prevented.

Even if the contact between collector line shunting line 12 and the substrate region is formed so as to be in alignment with contact region 22 in such arrangement, the contact region for the collector line shunting line and the substrate can be disposed appropriately since a heater is not formed at both sides of the contact region in the row direction. Current flow via dummy cell DMC1 can be prevented reliably to allow data to be written and read out accurately.

Collector line shunting line 12 has a layout pattern identical to that of word line shunting line 11 (indicating 11a–11e generically). Therefore, even if collector line shunting line 12 is disposed, the feature of the layout pattern of word line shunting line 11 will not be interrupted. Word line shunting line 11 and collector line shunting line 12 can be patterned correctly in the photolithography process. By arranging dummy cell DMC1 having a layout pattern identical to that of memory cell MC correspondingly to collector line shunting line 12, the regularity of pattern repetition in the column direction of memory cells MC is not interrupted. Therefore, memory cells can be patterned accurately even if memory cells MC are scaled down in size.

The sectional structure of collector line shunting line 12 is similar to the sectional structure of word line shunting line 11, with the modification that the collector line shunting line is electrically connected to the substrate region via a P type substrate region or P type impurity region instead of the N type impurity layer of diffusion word line 1 (such as 1a).

At the contact region 23 for making an electrical contact between a collector line shunting line and a substrate region, P type impurities may be implanted to the surface of the substrate region. Moreover, collector line shunting line 12 may be electrically connected to the substrate region directly. Since collector line shunting line 12 is a metal line of low resistance, non-ohmic contact would be less possibly made even if the substrate region is electrically connected to the collector line shunting line directly.

Collector line shunting line 13 extending in the column direction is arranged between memory cells adjacent in the row direction. Collector line shunting line 13 is electrically connected to collector line shunting line 12 extending in a row direction at a contact region 22. Collector line shunting line 13 makes electrical contact with the substrate region, and therefore, it is provided at an interconnection layer identical to or close to the layer of word line shunting line 11. In order to prevent butting between collector line shunting line 13 and word line shunting lines 11a–11e, word line shunting lines 11a–11e are formed crossing over collector line shunting line 13 at an upper interconnection 20 at the crossing region with collector line shunting line 13.

Upper interconnections 20 are electrically connected to a corresponding word line shunting lines 11a–11e via contacts 21a and 21b. Word line shunting lines 11a–11e are electrically connected by means of upper interconnection 20. Therefore, the repetitivity in pattern of memory cell MC and word line shunting line 11 would be deteriorated by providing collector line shunting line 13 extending in the column direction. Also, a word line shunt structure cannot be applied to the memory cells adjacent to collector line shunting line 13 extending in the column direction. Therefore, bit lines 15a and 15b disposed corresponding to collector line shunting line 13 are maintained at a normally unselected state, and the memory cells connected to bit lines 15a and 15b are respectively used as dummy cells DMC2 and DMC3.

Each column of memory cells MC has bit lines 14a–14f arranged extending in the column direction. Bit lines 14a–14f each have memory cells MC of a corresponding column connected. By arranging dummy bit lines 15a and 15b, the affect of a deviation in patterning at the repeated pattern boundary region would appear only on dummy cells DMC2 and DMC3 even if the repetitive pattern of memory cell MC and word line shunting line 11 in the column direction is interrupted. Therefore, dummy bit lines 15a and 15b connected to dummy cells DMC2 and DMC3 are maintained in a normally unselected state. Accordingly, data can be stored using memory cells MC that are patterned accurately. Even if memory cells are made fine in size, memory cells can be patterned accurately despite the provision of word line shunting line 11 and collector line shunting lines 12 and 13. Thus, the memory cell characteristics can be ensured.

The structure of FIG. 6 assumes that collector line shunting line 13 extending in the column direction is formed at an interconnection layer identical to or close to a layer for word line shunting line 11. Alternatively, such a structure may be employed, in which collector line shunting line 113 extending in the column direction is formed in a layer above word shunt line 11, and word line shunting lines 11a–11e are formed extending along the row direction continuously and electrical connection is made between collector line shunting line 13 located above word line shunting line 11 with collector line shunting line 12 extending in the row direction at contact region 22. In other words, an interconnection line in a layer identical to that of upper layer interconnection 20 is employed for collector line shunting line 13 extending in the column direction.

By forming collector line shunting lines 12 and 13 so as to extend in the row direction and column direction over the memory array and making connection in between at the crossing region, the collector line shunting line is formed in a meshed shape to allow the collector line shunting line to have a further reduced resistance. A collector line shunting line of a meshed shape structure provides the advantage of suppressing voltage distribution in the collectors of the select transistors in the memory cells. Thus, data can be written and read out accurately.

Figure 7:
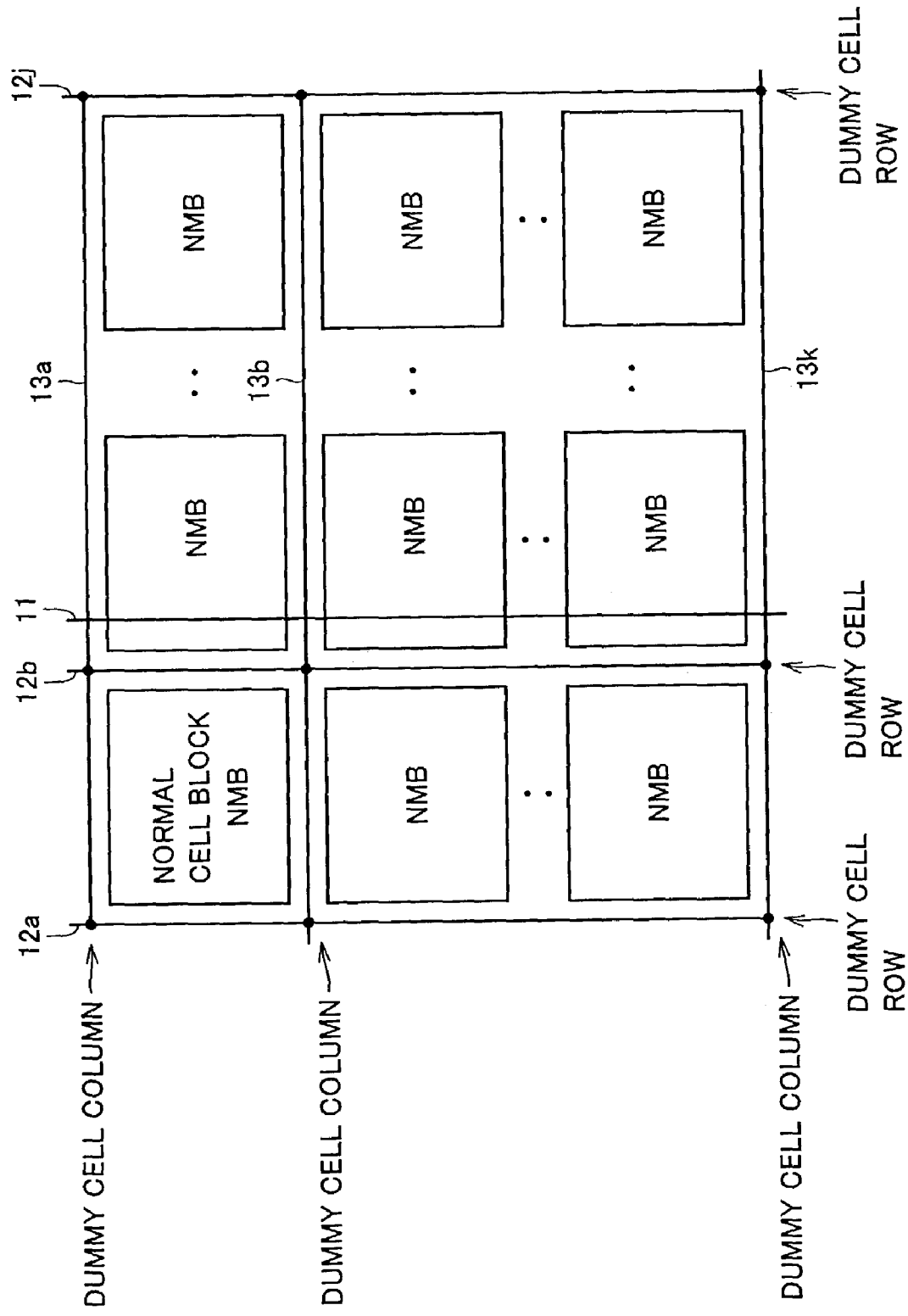
FIG. 7 schematically shows arrangement of the substrate shunting line of the layout shown in FIG. 6.

FIG. 7 schematically shows the entire arrangement of the memory array. Referring to FIG. 7, the memory array is divided into a plurality of normal cell blocks NMB in the row direction and in column direction. At the region between normal cell blocks NMB and outside thereof, collector lines 12a, 12b, . . . 12j are disposed in the row direction. At the region between normal cell blocks NMB adjacent in the column direction, collector line shunting lines 13a, 13b . . . 13k are disposed extending in the column direction.

Dummy cells (DMC1) are arranged in alignment in the row direction corresponding to each of the regions where collector line shunting lines 12a, 12b, . . . 12j are disposed. Dummy cells (DMC2, DMC3) are arranged in alignment in the column direction in each of the regions corresponding to collector line shunting lines 13a, 13b, . . . 13k extending in the column direction. Collector line shunting lines 12a–12j and collector line shunting lines 13a–13k are electrically connected at respective crossings.

Since these collector line shunting lines are arranged in a meshed shape over the memory array, the resistance thereof can be made small enough.

Since the collector line is provided by the substrate region, the substrate resistance can be further reduced by the collector shunting lines, to further reduce the voltage distribution in the substrate region.

By disposing dummy cells also along the outer perimeter of the memory array, pattern deviation can be suppressed in the array boundary region of normal cells. Memory cells can be patterned accurately even if the memory cells are made fine in size. Thus, the operation characteristics of a memory cell can be ensured even in the case of ultra-miniaturized memory cells.

In FIG. 7, one word line shunting line 11 is shown representatively. The interval of collector line shunting lines 12a–12j and 13a–13k needs only to be determined appropriately according to the resistance of the entire collector line shunting lines and the interconnection region available to the collector line shunting lines. Collector line shunting lines 12a–12j and 13a–13k are fixed to, for example, the ground potential, as is done for the substrate region.

According to the first embodiment of the present invention, at least the memory cell transistor collector line or word line is formed into a shunt structure, in which at least one of these collector lines and word lines are lined with an interconnection line of low resistance. Thus, a non-volatile semiconductor memory device with no voltage distribution for the memory cells, that can operate stably and at high speed even when ultra-miniaturization is effected, can be implemented.

Dummy cells are arranged corresponding to these shunting lines. The pattern continuity for memory cells and word lines can be maintained. Pattern deviation will not occur even in the case of ultra-miniaturization of memory cells. Thus, a non-volatile semiconductor memory device that operates stably can be implemented.

Although not explicitly shown in the layout of FIG. 6, a P type impurity layer of high concentration is formed under the memory cell formation region.

Second Embodiment

Figure 8:
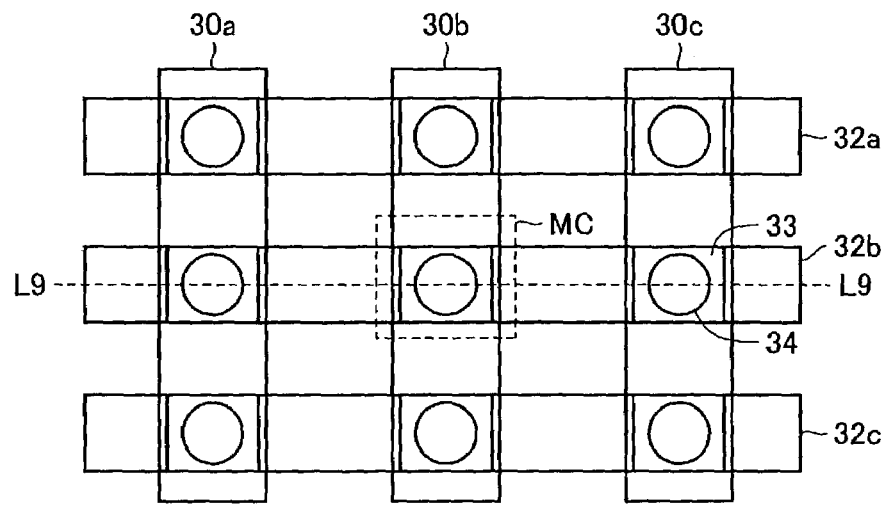
FIG. 8 schematically shows the layout of a memory cell array according to a second embodiment of the present invention.

FIG. 8 schematically shows an arrangement of the array of a non-volatile semiconductor memory device according to a second embodiment of the present invention. FIG. 8 shows memory cells MC arranged in three columns and three rows representatively, either. N type impurity layers 30a–30c functioning as word lines are formed corresponding to the respective rows of memory cells MC and extending continuously in the row direction. Conductive layers 32a–32c are formed extending continuously in the column direction so as to cross impurity layers 30a–30c, respectively. Conductive layers 32a–32c function as bit lines BL.

Memory cell MC includes a phase change element 33 with a chalcogenide film, and a heater element 34 with a heater that heats the chalcogenide film of phase change element 33. In each memory cell MC, phase change element 33 has a width in a row direction substantially identical to that of conductive layers (bit line conductive layer) 32a–32c that function as bit lines. In the row direction, phase change element 33 is patterned with bit line conductive layers 32a–32c being a mask. The length of phase change element 33 in the row direction is made substantially identical to the length (width) of bit line conductive layers 32a–32c. Phase change element 33 is formed smaller in width than impurity layers 30a–30c corresponding to word lines.

In the layout of the memory cells MC, etching is effected with conductive layers 32a–32c being a mask, following formation of a band-like interconnection extending continuously in the row direction, similarly to impurity layers 30a–30c, to separate each memory cell. Phase change element 33 is formed in self alignment to the bit line conductive layer. Therefore, a large margin for phase change element 33 is not required in consideration of the overlap with a bit line, as compared to the case where phase change element 33 is patterned individually. The layout area of memory cells MC can be reduced.

Figure 9:
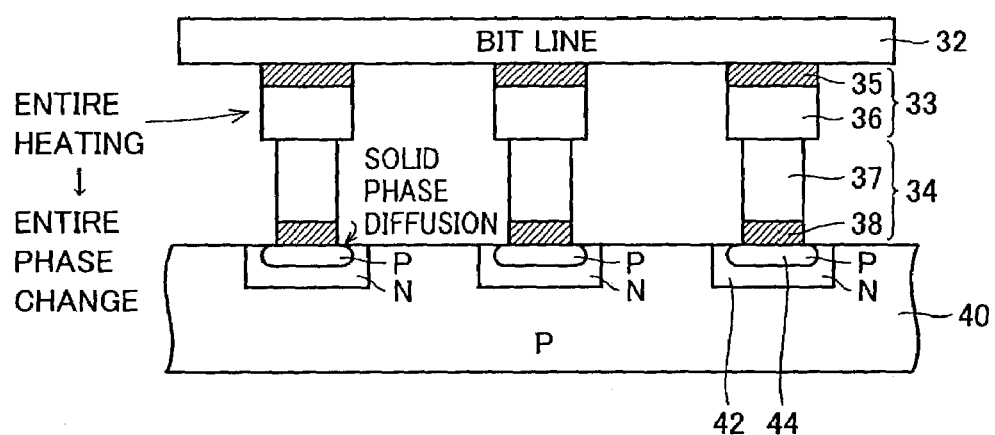
FIG. 9 schematically shows a sectional structure taken along line L9—L9 of FIG. 8.

FIG. 9 schematically shows a sectional structure taken along line L9—L9 of FIG. 8. Referring to FIG. 9, an N type impurity layer 42 selectively extending in a row direction is formed corresponding to each memory cell row at the surface of P type semiconductor substrate region 40. At the surface of N type impurity layer 42, a P type impurity region 44 that makes the emitter of the bipolar transistor of memory cell MC is formed corresponding to each memory cell.

Heater element 34 includes a heater 37 that generates heat by Joule heat during feeding of current, and a heat propagation block layer 38 provided between heater 37 and N type impurity layer 42 to prevent propagation of heat generated by heater 37. Heat propagation block layer 38 preferably includes the group III element such as boron B, aluminum Al or arsenic As, and forms a P type impurity region 44 through solid phase diffusion. Accordingly, the emitter region of the select bipolar transistor can be formed in self alignment to the heater to reduce the area occupied by the bipolar transistor.

Heat propagation block layer 38 prevents the constituent material contained in heater 37 from diffusing into the P type impurity region to degrade the memory cell transistor characteristics. In order to prevent lattice mismatch between P type impurity layer 44 and heater 37, heat propagation block layer 38 has a lattice constant intermediate the lattice constants of heater 37 and P type impurity region to improve adherence between heater 37 and P type impurity region 44. Heat propagation block layer 38 needs only to be formed of a material of low heat conductivity and that has a lattice constant intermediate the lattice constant of heater 38 and the lattice constant of the P type impurity region.

Phase change element 33 includes a chalcogenide film 36 having its crystalline state set through the heating by heater 37, and a heat propagation block layer 35 connected between chalcogenide film 36 and bit line conductive layer 32. Chalcogenide film 36 contains a chalcogen group element such as sulfur S, selenium Se, or tellurium Te. The heat propagation block layer 35, arranged between chalcogenide film 36 and bit line conductive layer 32, can be used as a buffer layer for establishing lattice matching, and reliably couples electrically the chalcogenide film 36 and bit line conductive layer 32, while suppressing the lattice mismatch at chalcogenide film 36.

Heat propagation block layer 35 also prevents transmission of the heat generated by chalcogenide film 36 via bit line conductive layer 32. Therefore, heat transmission to an unselected memory cell and other can be prevented to prevent erroneous operation caused by heating.

Furthermore, heat propagation block layer 35 prevents a constituent material contained in the bit line conductive layer 32 from diffusing into chalcogenide film 36 to degrade the property of chalcogenide film 36.

Therefore, as for a component of heat propagation block layer 35, any material can be utilized that has low heat conductance and a lattice constant intermediate the lattice constants of the chalcogenide film and the bit line conductive layer, and that has a low diffusion constant or does not adversely affect the property of the chalcogenide film even if the component is diffused to the chalcogenide film.

In order to suppress increase of the fabrication steps, heat propagation block layer 35 and chalcogenide film 36 are preferably formed of materials that can be etched in the same fabrication step. In addition, heater 37 and heat propagation block layer 38 are formed of preferably materials that can be etched (patterned) in the same fabrication step.

Heat propagation block layers 35 and 38 are formed sandwiching heater 37 and chalcogenide film 36, and therefore, the heat generated at heater 37 and chalcogenide film 36 can be prevented from being transmitted to the select transistor and bit line conductive layer 32. Thus, the heat can be confined within the memory cell region.

The heat generated by heater 37 can be used efficiently to heat chalcogenide film 36 to cause phase change over the entirety of chalcogenide film 36. Accordingly, the resistance of chalcogenide film 36 can be changed greatly according to the stored data even if chalcogenide film 36 has a small volume. Thus, the area occupied by chalcogenide film 36 can be reduced to achieve ultra-micro fabrication of memory cells.

A method of fabricating a non-volatile semiconductor memory device according to the second embodiment will be described hereinbelow.

Figure 10A:
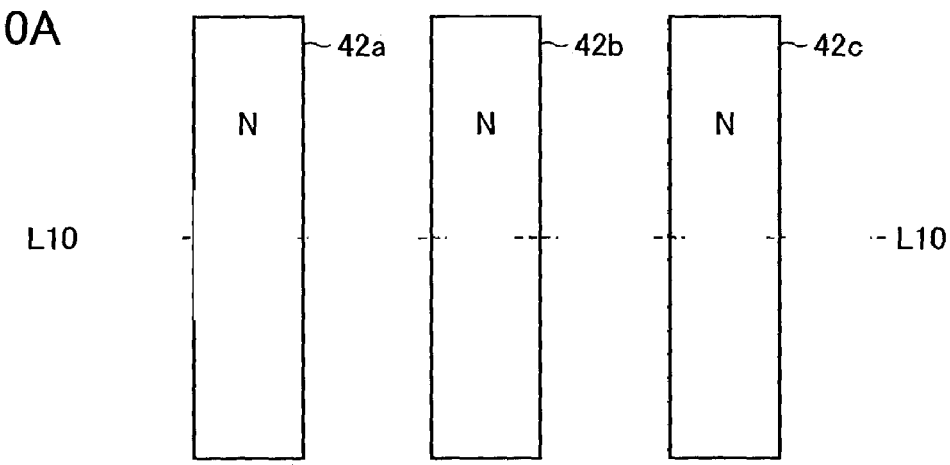
FIG. 10A shows a plan layout of a non-volatile semiconductor device according to a fabrication step of the second embodiment.

Step A:

As shown in FIG. 10A, N type impurity layers 42a, 42b and 42c are formed extending continuously in the row direction at the surface of the substrate region. These N type impurity layers 42a–42c are formed through a process similar to a normal process of forming a diffusion layer through ion implantation.

Figure 10B:
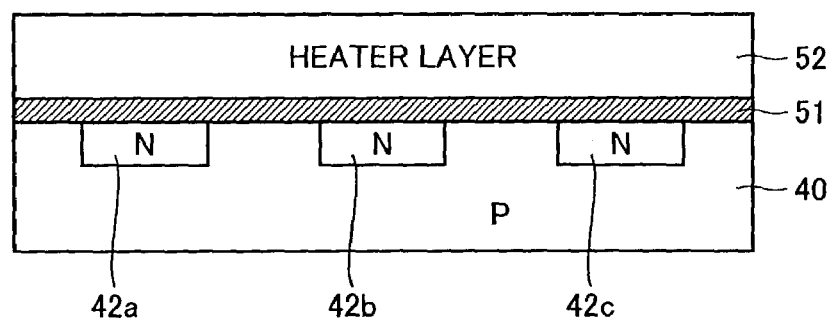
FIG. 10B schematically shows a sectional structure taken along line L10—L10 of FIG. 10A.

Then, N type impurity layers 42a–42c are formed at predetermined intervals at the surface of P type substrate region 40, as shown in the sectional structure of FIG. 10B illustrating a sectional structure taken along line L10—L10 in FIG. 10A. Diffusion word lines are formed by the N type impurity layers 42a–42c.

In forming a memory cell transistor, a P type buried layer of high concentration may be formed in the substrate region prior to formation of N type impurity layers 42a–42c, as in the first embodiment.

After diffusion word lines are formed, a heat propagation block layer 51 and a heater layer 52 are sequentially deposited all over the substrate. Heat propagation block layer 51 and heater layer 52 may be formed through vapor phase deposition method such as MOCVD (Metal Organic Chemical Vapor Deposition), or through MBE (Molecular Beam Epitaxy) method.

Figure 11A:
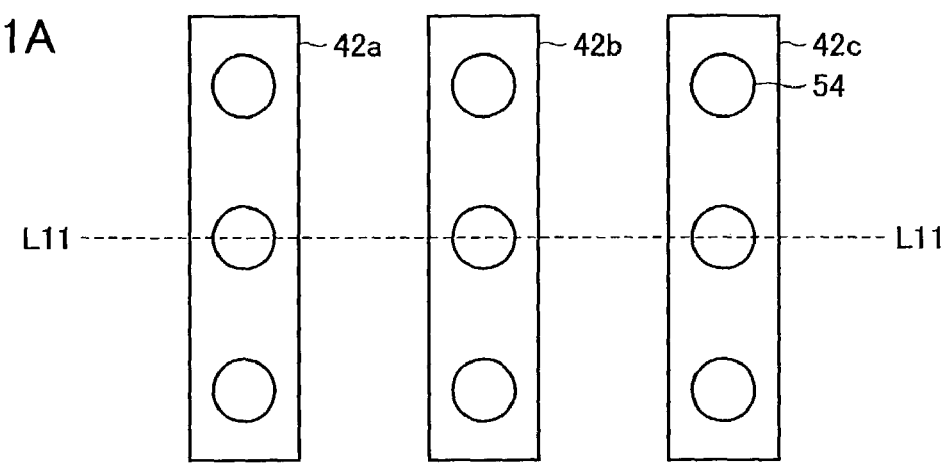
FIG. 11A shows a plan layout of a non-volatile semiconductor device according to a fabrication step of the second embodiment.

Step B:

Referring to FIG. 11A, following coating with a resist film over the entire surface, the resist film is patterned such that resists 54 remain only at the positions corresponding to the heater elements of the memory cells. Resists 54 are formed in alignment with impurity layers 42a–42c, being located corresponding to the heater element regions of memory cells.

Figure 11B:
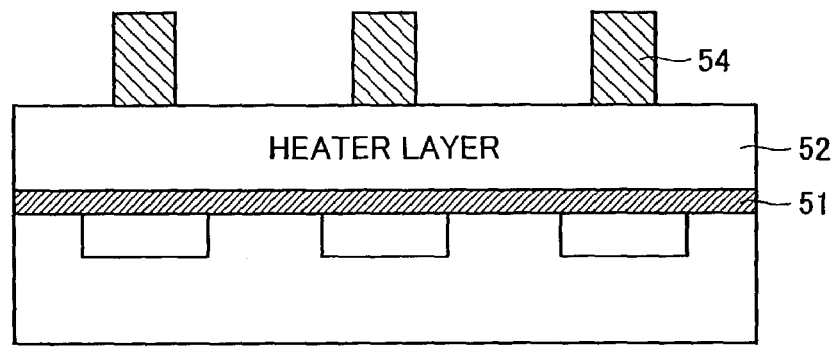
FIG. 11B schematically shows a sectional structure taken along line L11—L11 of FIG. 11A.

As shown in FIG. 11B, resist 54 is formed corresponding to the memory cell location on heater layer 52. Etching is effected with resist 54 being a mask, to perform the patterning of heater layer 52 and heat propagation block layer 51.

Figure 12A:
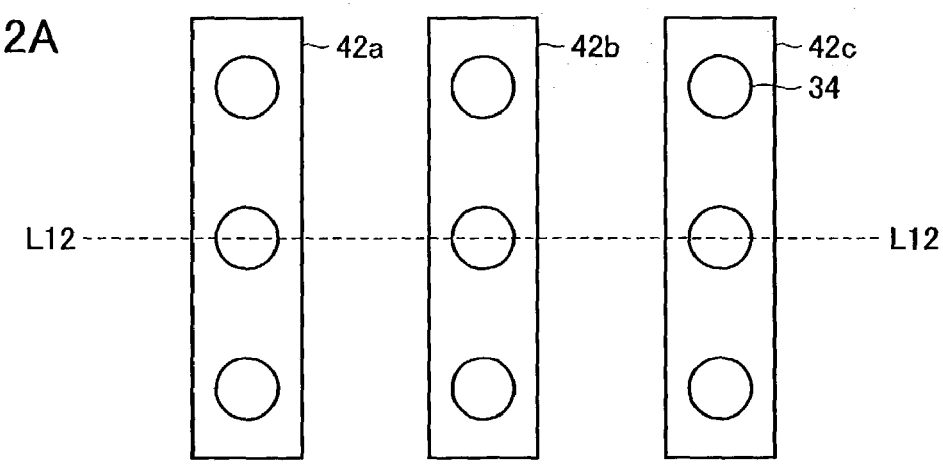
FIG. 12A shows a plan layout of a non-volatile semiconductor device according to a fabrication step of the second embodiment.
Figure 12B:
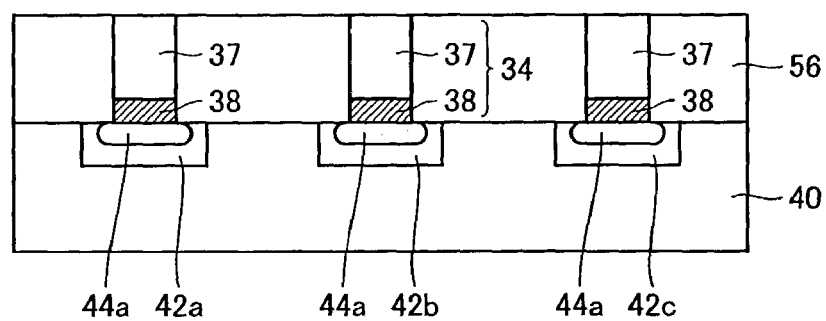
FIG. 12B schematically shows a sectional structure taken along line L12—L12 of FIG. 12A.

Step C:

When resist 54 is removed following etching/patterning of heater layer 51 and heat propagation block layer 52, heater elements 34 are formed at predetermined intervals in alignment with N type impurity layers 42a–42c, as shown in FIG. 12A. Following formation of heater element 34, an interlayer insulation film 56 is formed on a surface of semiconductor substrate region 40 to isolate heater element 34 for each memory cell, as shown in FIG. 12B. Heater 37 and heat propagation block film 38 are formed corresponding to each memory cell. Here, FIG. 12B shows a sectional structure taken along line L12—L12 of FIG. 12A.

By applying a heating process under a predetermined temperature condition, P type impurities diffuse into respective N type impurity layers 42a–42c formed thereunder by the solid phase diffusion from heat propagation block films 38 in heater elements 34, resulting in formation of P type impurity regions 44a. P type impurity region 44a functions as the emitter of a memory cell transistor. Through the solid phase diffusion, the emitter region of the memory cell transistor can be formed in self alignment to heater element 34. Thus, the emitter area can be reduced. The solid phase diffusion also provides the advantage that the PN junction between impurity region 44a and impurity layers 42a–42c can be made shallow to reduce the emitter resistance.

Following formation of interlayer insulation film 56, the surface of interlayer insulation film 56 and heater 37 are planarized by CMP (Chemical Mechanical Polishing), for example.

Figure 13A:
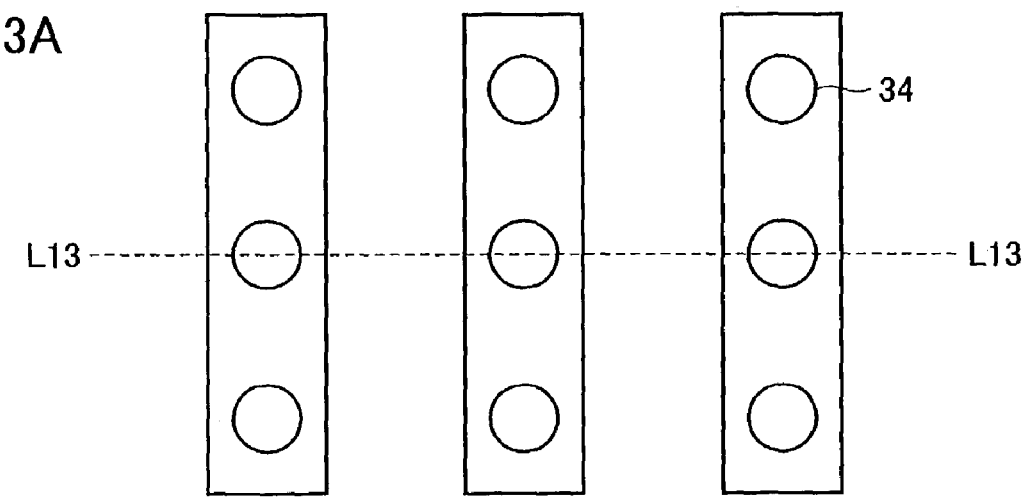
FIG. 13A shows a plan layout of the non-volatile semiconductor device according to a fabrication step of the second embodiment.
Figure 13B:
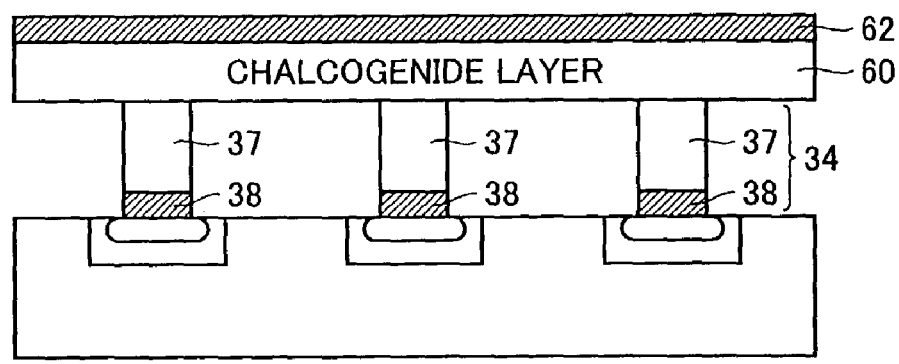
FIG. 13B schematically shows a sectional structure taken along line L13—L13 of FIG. 13A.

Step D:

After forming an emitter layer by means of heat diffusion from heater element 34, a chalcogenide layer and a heat propagation block layer are sequentially stacked. Although not explicitly shown in FIG. 13A, chalcogenide layer 60 and heat propagation block layer 62 are stacked over the entire array, as shown by the sectional structure in FIG. 13B taken along line L13—L13 of FIG. 13A. An interlayer insulation film 56 shown in FIG. 12B is formed under chalcogenide layer 60, which in turn is coupled to heater 37. Heat propagation block film 38 is formed beneath heater 37. Heat propagation block layer 38 functions to prevent diffusion of the material of heater 37 into the substrate region in the thermal processing at step D.

Figure 14A:
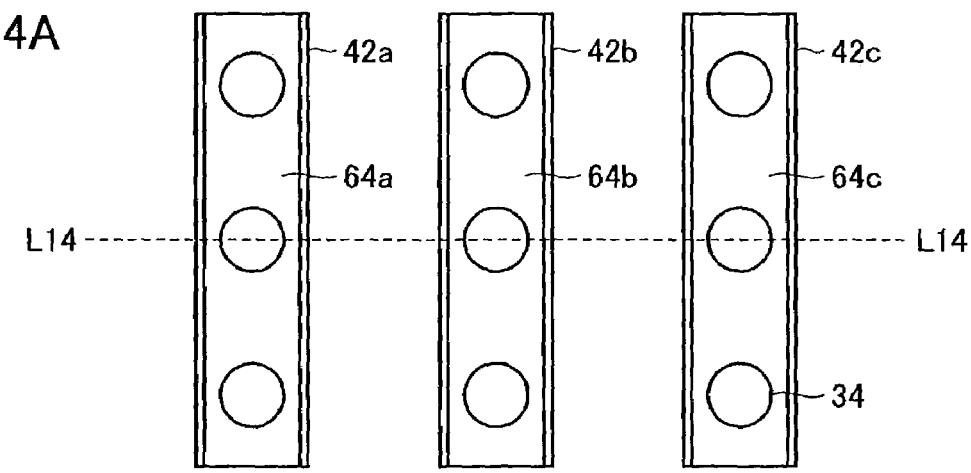
FIG. 14A shows a plan layout of the non-volatile semiconductor device according to a fabrication step of the second embodiment.

Step E:

Following formation of a resist layer all over the entire surface of heat propagation block layer 62, the resist layer is patterned. These patterned resist films 64a-64c are in alignment with impurity layers 42a–42c, and formed continuously extending in the row direction, as shown in FIG. 14A. Resist films 64a–64c are formed slightly smaller in width than impurity layers 42a–42c, respectively. By the heat diffusion after ion implantation, impurity layers 42a–42c will grow larger in width than the smallest line width (design rule), and slightly larger than resist films 64a–64c.

Figure 14B:
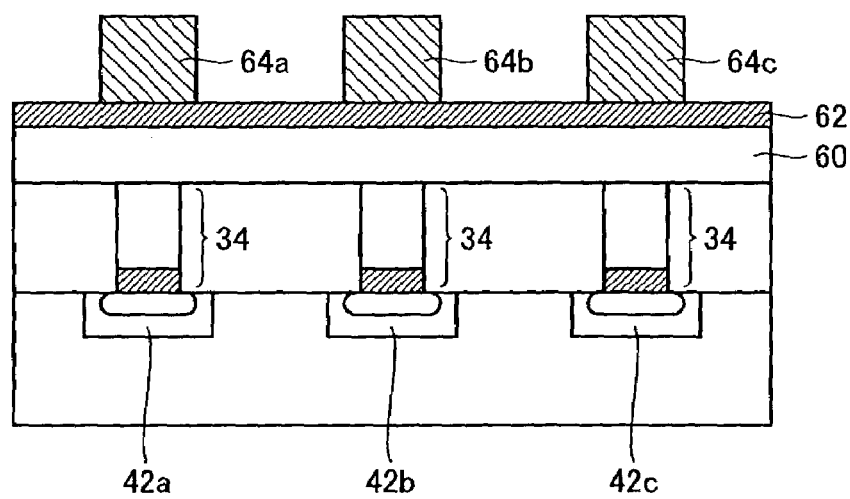
FIG. 14B schematically shows a sectional structure taken along line L14—L14 of FIG. 14A.

In this case, resist films 64a–64c are formed, in alignment with impurity layers 42a–42c formed thereunder, on heat propagation block layer 62, as shown in FIG. 14B. In this state, chalcogenide layer 60 formed on heater element 34 is formed all over the array, and is not yet patterned.

At this stage, heat propagation block layer 62 and chalcogenide layer 60 are etched with resist films 64a–64c being a mask, to pattern heat propagation block layer 62 and chalcogenide layer 60. Heat propagation block layer 62 and chalcogenide layer 60 are etched simultaneously in this etching step.

Figure 15A:
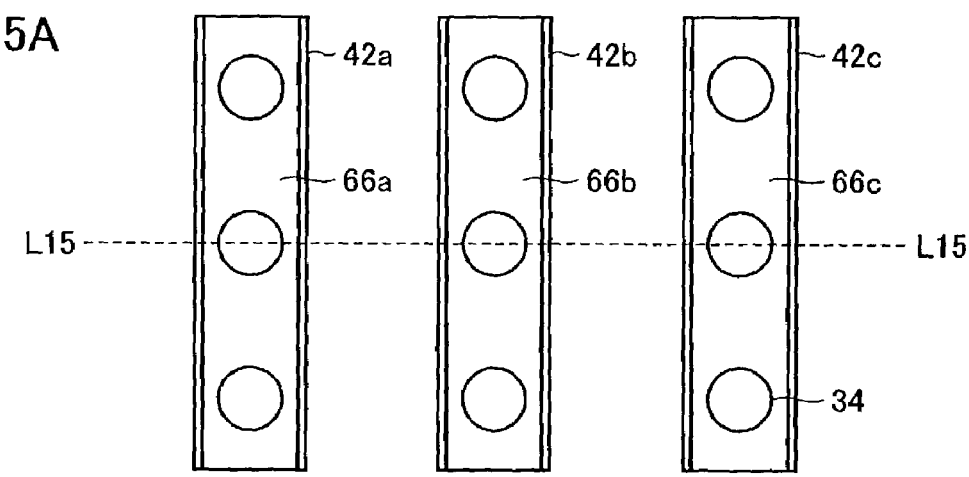
FIG. 15A shows a plan layout of the non-volatile semiconductor device according to a fabrication step of the second embodiment.

Step F:

By performing an etching process using resist films 64a–64c shown in FIGS. 14A and 14B as a mask, chalcogenide/heat propagation block layers 66a–66c are formed extending continuously in the row direction and in alignment with impurity regions 42a–42c, as shown in FIG. 15A. Chalcogenide/heat propagation block layers 66a–66c are coupled to heater element 34 located thereunder.

Figure 15B:
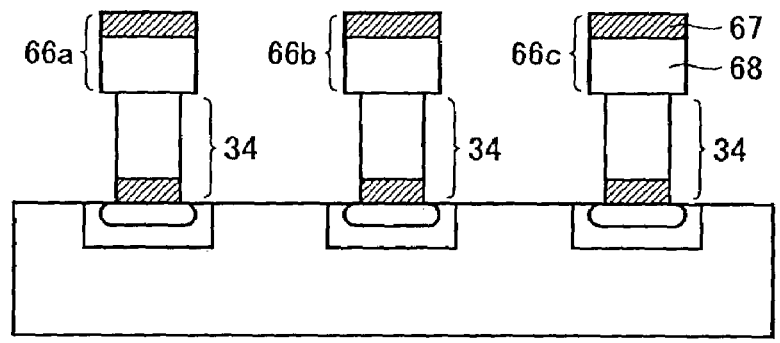
FIG. 15B schematically shows a sectional structure taken along line L15—L15 of FIG. 15A.

As shown in FIG. 15B, chalcogenide/heat propagation block layer layers 66a–66c isolated for each row are formed. Each of chalcogenide/heat propagation block layers 66a–66c includes a chalcogenide layer 68 coupled to heater element 34, and a heat propagation block layer 67 formed on chalcogenide layer 68. Chalcogenide layer 68 and heat propagation block layer 67 are formed in a band shape continuously in the row direction.

Figure 16A:
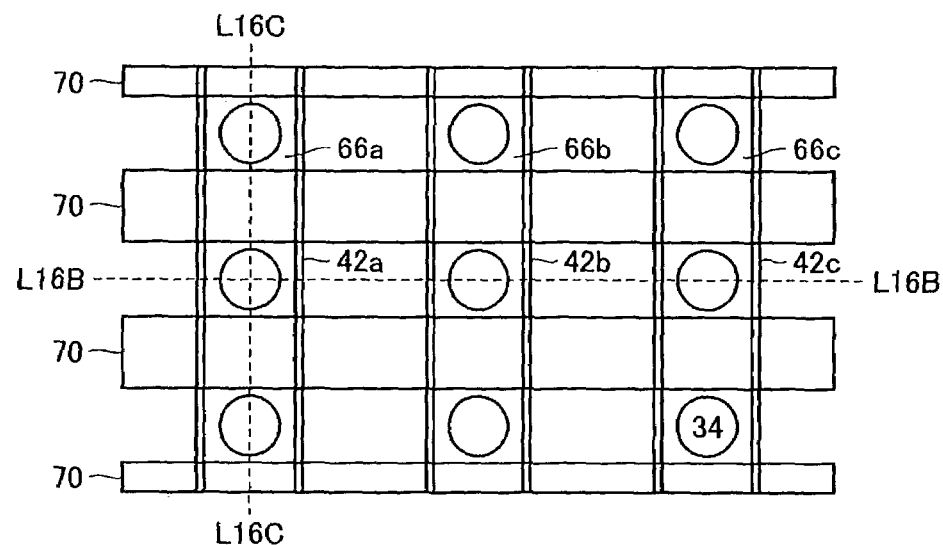
FIG. 16A shows a plan layout of the non-volatile semiconductor memory device according to a fabrication method of the second embodiment.

Step G:

An insulation film 70 is formed at the region between memory cells adjacent in the row direction, as shown in FIG. 16A. Specifically, a band-like trench is formed by insulation films 70 corresponding to a region having a bit line formed therein. In a direction crossing insulation film 70, chalcogenide/heat propagation block layers 66a–66c formed in the previous step F are arranged in alignment with impurity layers 42a–42c, respectively. Heater element 34 is formed in the memory cell formation region.

Figure 16B:
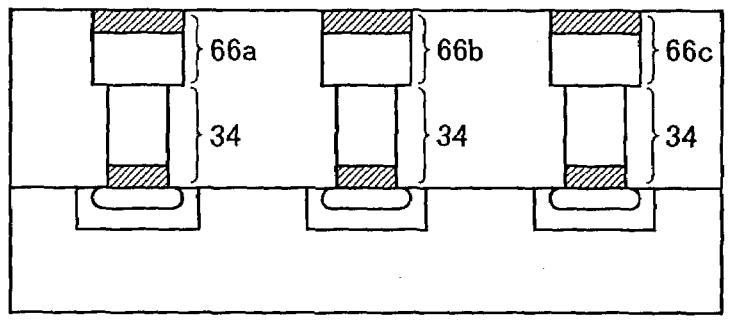
FIG. 16B shows a sectional structure taken along line L16B—L16B of FIG. 16A.

As shown in FIG. 16B, insulation film 70 is not formed at the region in which memory cells are arranged in alignment in the column direction. Chalcogenide/heat propagation block layers 66a–66c of respective memory cell rows, together with heater element 34 located thereunder, are isolated by the interlayer insulation film.

Figure 16C:
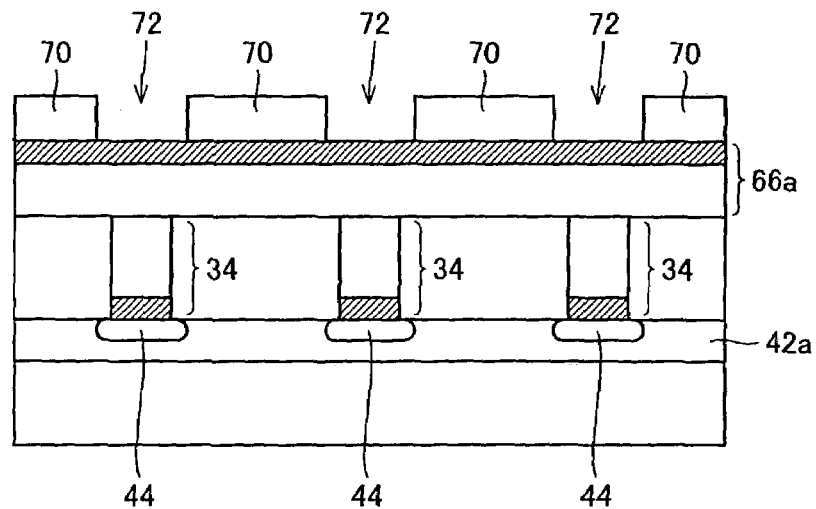
FIG. 16C schematically shows a sectional structure taken along line L16C—L16C of FIG. 16A.

As shown in FIG. 16C indicating a sectional structure taken along line L16C—L16C of FIG. 16A, impurity layer 42a is disposed extending continuously in the row direction at the surface of the semiconductor substrate region. In the memory cell formation region, heater element 34 is formed. Moreover, an impurity region 44 is formed, at the surface of impurity layer 42a, corresponding to each heater element 34. Chalcogenide/heat propagation block layer 66a is disposed extending continuously in the row direction.

An insulation film 70 is formed extending in the column direction on chalcogenide/heat propagation block layer 66a. Insulation film 70 is not disposed in the memory cell formation region. Specifically, the region forming a bit line is defined by a trench region 72 between insulation films 70. The process of forming a trench region by insulation films to expose an underlying layer is known as the Damascene process in formation of a copper (Cu) interconnection. This Damascene process is utilized for bit line formation.

Figure 17A:
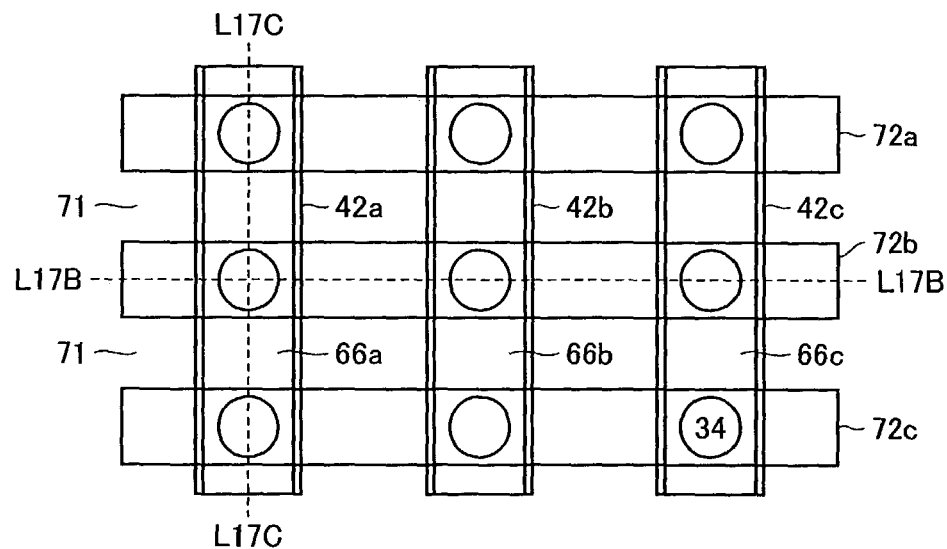
FIG. 17A shows a plan layout of the non-volatile semiconductor memory device according to a fabrication step of the second embodiment.

Step H:

As shown in FIG. 17A, a conductive material forming the bit line is deposited in a trench region formed by insulation film 70 shown in FIG. 16. Then, an etching process is applied to planarize the surface by a process such as CMP. Thus, as shown in FIG. 17A, bit line conductive layers 72a–72c are formed extending continuously in the column direction. An insulation film 71 corresponding to insulation film 70 is formed at the region between bit line conductive layers 72a–72c. In FIG. 17A, there are shown impurity layers 42a–42c corresponding to word lines, chalcogenide/heat propagation block layers 66a–66k arranged parallel to impurity layers 42a–42c, and heater elements 34.

Figure 17B:
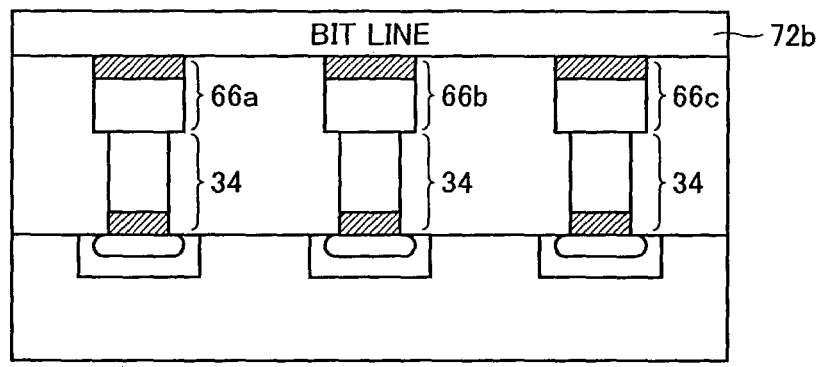
FIG. 17B schematically shows a sectional structure taken along line L17B—L17B of FIG. 17A.

Referring to FIG. 17B indicating a sectional structure taken along line L17B—L17B of FIG. 17A, bit line conductive layer 72b is formed extending continuously in the column direction. Chalcogenide/heat propagation block layers 66a–66k disposed at predetermined intervals in the column direction are connected to bit line conductive layer 72b. Heater elements 34 are connected to chalcogenide/heat propagation block layers 66a–66c, respectively.

Figure 17C:
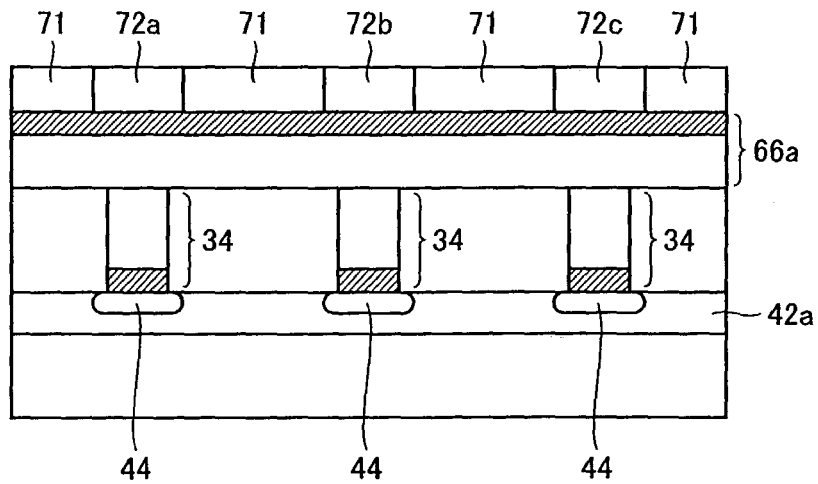
FIG. 17C schematically shows a sectional structure taken along line L17C—L17C of FIG. 17A.

As shown in FIG. 17C indicating a sectional structure taken along line L17C—L17C of FIG. 17A, bit line conductive layers 72a, 72b and 72c are formed at trench regions 72 shown in FIG. 16C, to be coupled to underlying chalcogenide/heat propagation block layer 66a. Insulation films 71 are formed between bit line conductive layers 72a–72c. Insulation film 71 is an etched film of insulation film 70 shown in FIGS. 16A–16C by CMP. Therefore, in the state in which bit line conductive layers 72a–72c are formed, chalcogenide/heat propagation block layers 66a–66c are each formed extending continuously in the row direction.

A set of heater element 34 and impurity region 44 formed thereunder are formed isolatedly in the column direction according to the memory cell region. The process of burying material forming the bit line conductive layer in the trench region between the insulation films, followed by patterning by CMP etching corresponds to the plating process utilized in the formation process of a Cu interconnection. This process is advantageous in that bit lines can be formed at fine pitches even if a material such as copper, on which fine-geometry etching is difficult to apply, is employed.

Figure 18A:
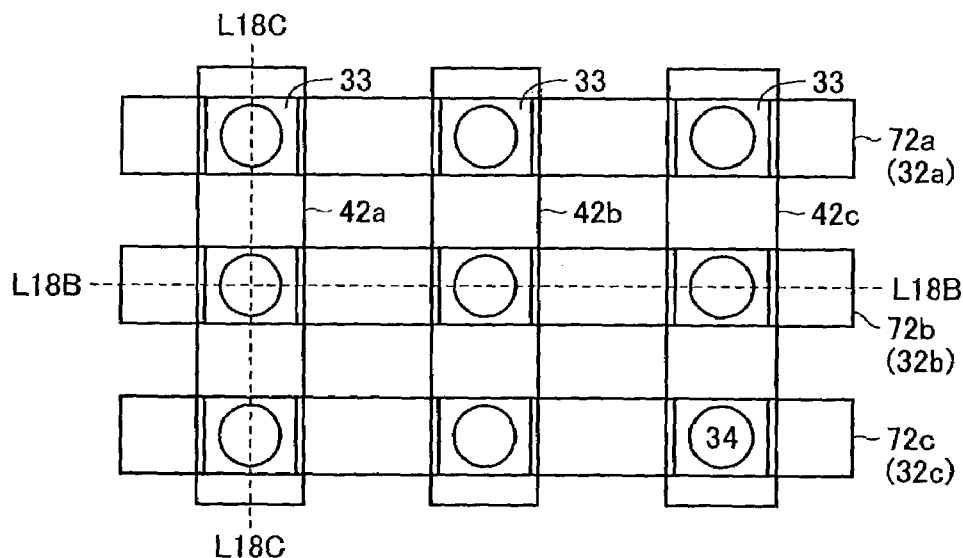
FIG. 18A shows a plan layout of the non-volatile semiconductor memory device according to a fabrication step of the second embodiment.

Step I:

Insulation film 71 shown in FIG. 17C is etched away to expose the surface of bit line conductive layers 72a–72c and the surface of heat propagation block layers 66a–66c. Under this state, etching is applied using bit line conductive layers 72a–72c as a mask, to etch the chalcogenide/heat propagation block layer, as shown in FIG. 18A. Therefore, the chalcogenide/heat propagation block layer is left only at the region crossing the bit line, and is separated at the other region between the bit lines. This chalcogenide/heat propagation block layer is separated for each memory cell in the row direction. Accordingly, phase change element 33 for each memory cell is disposed corresponding to the crossing between impurity layers 42a–42c and bit line conductive layers 72a–72c.

Copper (Cu) interconnection can not be easily etched by means of normal etching. Therefore, by using bit line conductive layers 72a–72c formed of Cu, for example, as the mask in the etching process, the chalcogenide layer and heat propagation block layer can be etched and patterned. In the etching process (patterning) of chalcogenide/heat propagation block layers 66a–66c, dimension control is effected in self alignment to bit line conductive layers 72a–72c in the row direction. Therefore, the layout area of memory cells can be reduced.

Figure 18B:
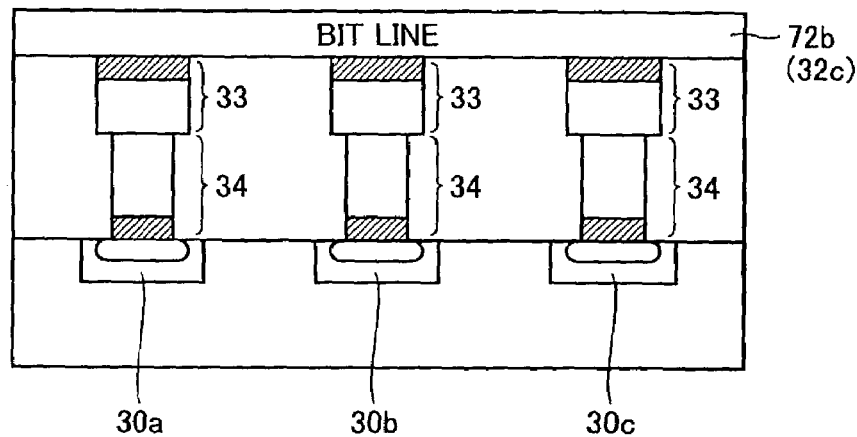
FIG. 18B shows a sectional structure taken along line L18B—L18B of FIG. 18A.

FIG. 18B shows a sectional structure taken along line L18B—L18B of FIG. 18A. Bit line conductive layer 72b extends linearly in the column direction to form bit line 32c. Diffusion word lines 30a–30c are formed corresponding to the respective rows. Heater element 34 and phase change element 33 are arranged corresponding to each of diffusion word lines 30a–30c.

Figure 18C:
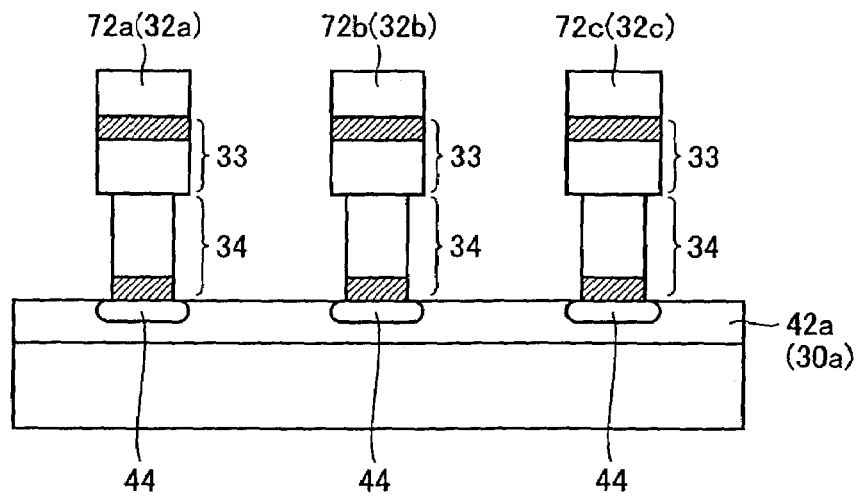
FIG. 18C schematically shows a sectional structure taken along line L18C—L18C of FIG. 18A.

Referring to FIG. 18C showing a sectional structure taken along line L18C—L18C of FIG. 18A, an impurity layer 42a forming diffusion word line 30a is disposed extending continuously in the row direction. Impurity regions 44 are formed corresponding to the locations of memory cell columns. Corresponding to impurity region 44, heater element 34 and phase change element 33 are formed corresponding to each memory cell. Corresponding to the columns, bit line conductive layers 72a–72c are formed spaced apart. At the pitch of bit lines 32a–32c, memory cells are formed.

The width in the row direction of phase change elements 33 is made substantially identical to the width in the row direction of corresponding bit line conductive layers 72a–72c. Phase change element 33 is formed in self alignment to the bit line conductive layer, whereby a bit line conductive layer and a phase change element can be overlapped with each other accurately.

By forming the chalcogenide layer and heat propagation block layer extending continuously in the row direction and applying patterning process with the bit line being the mask, memory cells can be formed at the smallest width in the row direction. Also, the superposition margin of the chalcogenide layer and heat propagation block layer with the bit line is not required, so that the memory cell size can be minimized. Accordingly, the layout area of memory cells can be reduced to allow memory cells to be disposed at high density.

According to the second embodiment of the present invention, etching is performed with the bit line being a mask after the phase change layer of memory cells is formed extending continuously in the row direction. It is not necessary to take into account a margin for the superposition between a bit line and a phase change element, so that memory cells can be formed in the smallest area.

The emitter region of the memory cell transistor is formed by solid phase diffusion from the heater element. The memory cell transistor can be thus formed in the smallest area. Moreover, the PN junction of the memory cell transistor can be made shallow, improving the memory cell transistor characteristics. Therefore, memory cells that allow data writing/reading at high speed and in a stable manner can be implemented even if memory cells are ultra-microfabrication.

A heat propagation block layer is arranged for the heater layer to suppress heat propagation. Thus, the adverse effect of the heat generated in the write operation on an unselected memory cell can be prevented even with ultra-miniaturized cells.

By the heat propagation block layer, heat can be concentrated at the phase change element, causing phase change over the entire phase change element. Therefore; the resistance can be changed significantly according to data even if a phase change element of small volume is used. Data can be stored stably using ultra-miniaturized memory cells.

The usage of the heat propagation block layer provides the advantage that diffusion of unnecessary material between the bit line and chalcogenide layer and between the heater and the substrate region (impurity region), as well as lattice mismatch can be suppressed. Therefore, memory cell characteristics can be maintained stably.

Third Embodiment

Figure 19:
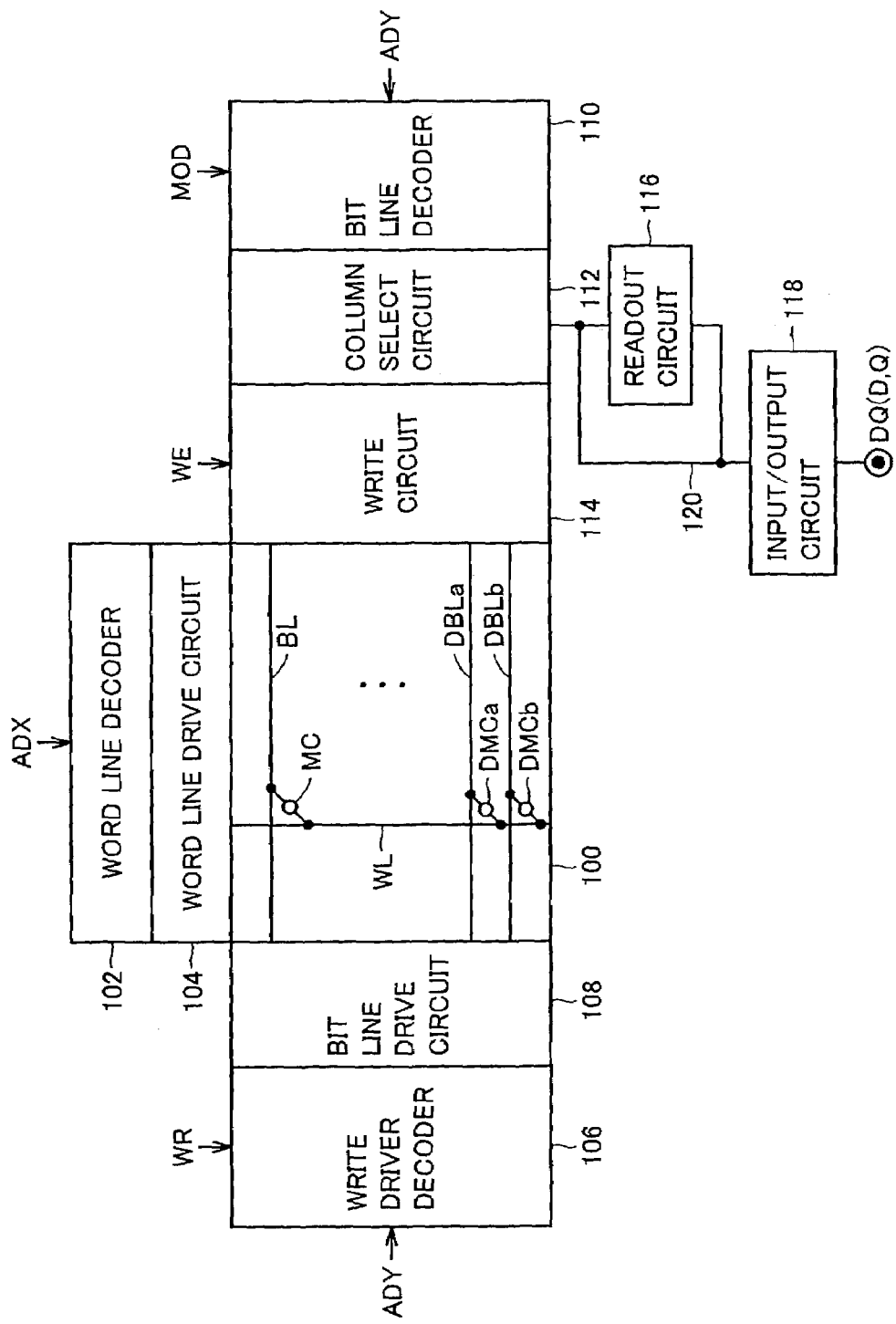
FIG. 19 schematically shows an entire structure of a non-volatile semiconductor memory device according to a third embodiment of the present invention.

FIG. 19 schematically shows an entire construction of a non-volatile semiconductor memory device according to a third embodiment of the present invention. Referring to FIG. 19, the non-volatile semiconductor memory device includes a memory cell array 100 having memory cells MC arranged in rows and columns. Memory cell MC includes a variable resistance element with a phase change element, and a select transistor for selecting this variable resistance element.

In memory cell array 100, a word line WL is disposed corresponding to a row of memory cells MC. Corresponding to each column of memory cells MC, a bit line BL is disposed. Moreover, dummy cells DMCa and DMCb are arranged in alignment with each row of memory cells MC. A dummy cell DMCa is connected to a dummy bit line DBLa, and a dummy cell DMCb is connected to a dummy bit line DBLb. Memory cell MC and dummy cells DMCa and DMCb are connected to one word line WL. Dummy cells DMCa and DMCb store data complementary to each other fixedly.

For the reference symbol of the dummy cell, DMC identical to that of the geometry dummy cell shown in the embodiment with reference to FIG. 7 is used. However, the dummy cell in the third embodiment is not a geometry dummy cell that maintains a pattern of normal memory cells, but stores data for generating reference data in a data read operation of a selected memory cell. Although these dummy cells DMCa and DMCb allow data to be written/read out, they cannot be accessed externally in a normal operation mode.

Since the regularity of the layout pattern with respect to normal memory cells in the boundary region is maintained when dummy cells DMCa and DMCb are arranged at the end area of the memory cell array. Therefore, the same reference characters DMC as in the second embodiment is employed for the dummy cell in the third embodiment despite the difference in function from the dummy cell in the second embodiment.

By disposing dummy cells DMCa and DMCb in alignment with memory cells MC in memory cell 100 in the row direction, dummy cells DMCa and DMCb can be produced in the same fabrication step with the same layout pattern (same structure) as memory cell MC. Accordingly, dummy cells DMCa and DMCb can be made identical in characteristics to memory cell MC. Moreover, the parasitic resistance and parasitic capacitance can be made the same between bit line BL and dummy bit lines DBLa and DBLb. By comparing the stored data (read out current) between selected memory cell MC and dummy cells DMCa and DMCb, data can be read out accurately.

The non-volatile semiconductor memory device further includes a word line decoder 102 for decoding a word line address signal ADX to generate a word line select signal specifying a word line in memory cell array 100, a word line drive circuit 104 for driving a selected word line to a selected state according to a word line select signal from word line decoder 102, a write drive decoder 106 rendered active in activation of a write designation signal WR to decode a bit line address signal ADY to select a bit line of a data writing target, and a bit line drive circuit 108 for supplying a write voltage (current) pulse at the time of writing data into a selected bit line according to an output signal from write driver decoder 106.

Write driver decoder 106 selects a bit line of a writing target, and is responsive to write data for generating a control signal to supply a write current pulse to the target bit line according to a write control signal applied from a write circuit 114 described later. Bit line drive circuit 108 supplies a write current pulse to a selected bit line according to an output signal from write driver decoder 106 in data writing. Bit line. drive circuit 108 is maintained at an output high impedance state during periods other than the data write operation.

In the third embodiment, the write current pulse is not transmitted from the internal data line to a selected bit line. By utilizing write drive decoder 106, write data can be latched to be written successively into selected memory cells. Data can be readily written into a selected bit line even if the number of bit lines selected simultaneously is changed according to the operation mode.

Write circuit 114 responds to activation of a write activation signal WE for generating a write control signal to a selected bit line based on write data. The write control signal from write circuit 114 is applied to write driver decoder 106. Data writing is executed to the selected bit line.

Write activation signal WE is rendered active when data is to be actually written into a selected memory cell in activation of write designation signal WR. Write designation signal WR instructs that the operation mode is a data write mode.

The non-volatile semiconductor memory device further includes a bit line decoder 110 for decoding a bit line address signal ADY to generate a bit line select signal that specifies a selected bit line, a column select circuit 112 for selecting a corresponding bit line according to a bit line select signal from bit line decoder 110 to couple the bit line of the selected column to an internal data bus 120, a readout circuit 116 for generating internal readout data based on the data read onto internal data bus 120, and an input/output circuit 118 coupled to internal data bus 120 to input/output external data DQ.

A mode designation signal MOD is applied to bit line decoder 110. This mode designation signal MOD specifies a 1-bit/2-cell mode of storing 1-bit data with two memory cells, and a 1-bit/1-cell mode of storing 1-bit data by one memory cell. Bit line decoder 110 generates a signal for selecting two bit lines BL when mode designation signal MOD designates a 1-bit/2-cell mode, and generates a signal for selecting one bit line when mode designation signal MOD designates a 1-bit/1-cell mode.

Mode designation signal MOD may be applied externally or generated internally in a fixed manner. This mode designation signal MOD may be stored in an internal register or the like according to an external instruction and then generated from the internal register.

Readout circuit 116 includes a differential amplify circuit to compare the data read out onto the selected bit line BL with the data read out on dummy bit lines DBLa and DBLb to generate an internal readout data according to the comparison result in a 1-bit/1-cell mode. In a 1-bit/2-cell mode, readout circuit 116 amplifies differentially the data of two bit lines (normal bit line) selected at the same time to generate an internal readout data.

By switching the data storage mode between the 1-bit/2-cell mode and the 1-bit/1-cell mode according to mode designation signal MOD, the storage capacity can be changed depending on application of the non-volatile memory. Moreover, a particular address region can be set to the 1-bit/2-cell mode. For example, when a large volume of data such as image data and audio data is handled, any error of 1 bit would not significantly affect the data process. Therefore, data is stored in the 1-bit/1-cell mode in such a case. In contrast, an error of 1 bit data may cause erroneous operation as in data such as code. Reliability of data is greatly required in the case of data such as code. In such a case, data is stored in the 1-bit/2-cell mode. Thus, data can be stored reliably even if the memory cells are ultra-miniaturized.

The structure of each component will be described specifically hereinbelow.

[Structure of Array]

Figure 20:
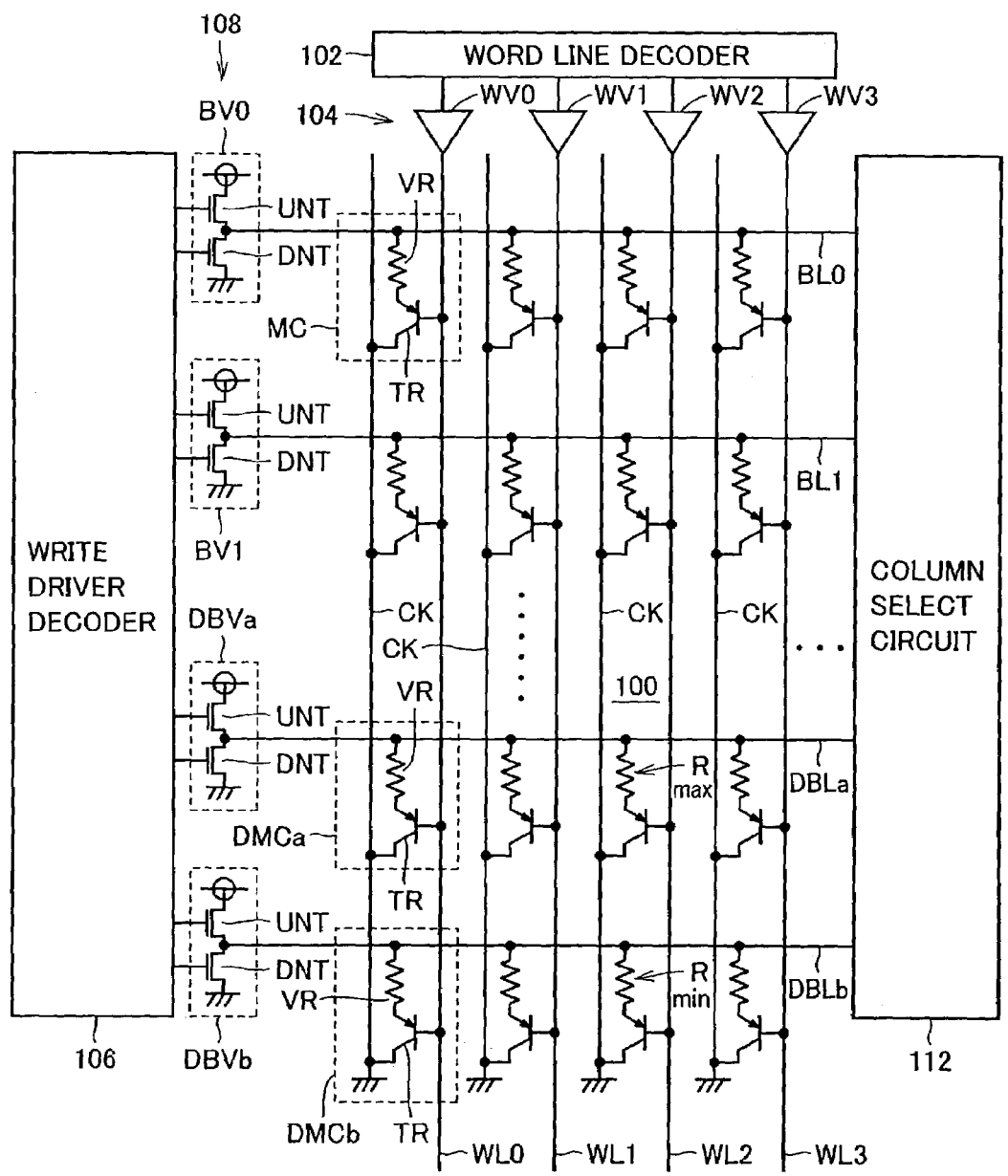
FIG. 20 specifically shows a structure of the memory cell array of FIG. 19.

FIG. 20 shows a construction of memory cell array 100, bit line drive circuit 108 and word line drive circuit 104 of FIG. 19. Referring to FIG. 20, memory cells are arranged in rows and columns in memory cell array 100. Dummy cells DMCa and DMCb are disposed corresponding to each row of memory cells MC. Memory cell MC and dummy cells DMCa and DMCb each have the same structure, and each include a select transistor TR and a variable resistance element VR having a resistance varied according to e storage data. Variable resistance element VR includes a phase change element having a resistance changed according to the crystalline state, and a heater for heating the phase change element.

Corresponding to each row of memory cells MC, word line WL (WL0–WL3) is disposed. Corresponding to each column of memory cells MC, bit line BL (BL0, BL1) is disposed.

Corresponding to the row of dummy cell DMCa, dummy bit line DBLa is disposed. Corresponding to the column of dummy cell DMCb, an internal bit line DBLb is disposed. Dummy cells DMCa and DMCb are connected to word line WL on a corresponding row.

FIG. 20 shows that a collector line is disposed for each row of memory cells MC, DMCa and DMCb. Collector line CK is formed of the substrate region, and therefore collector line CK arranged corresponding to each memory cell row is connected in common. Collector line CK is fixed at the ground potential in the arrangement of FIG. 20.

The phase change element of variable resistance element VR of dummy cell DMCa is set to an amorphous state, and has a resistance value Rmax. In dummy cell DMCb, the phase change element (variable resistance element VR) is set to a polycrystalline state, and has a resistance value Rmin. Resistance value Rmax is larger than resistance value Rmin. Therefore, a dummy cell DMCa of a high resistance state is connected to dummy bit line DBLa whereas a dummy cell DMCb of a low resistance state is connected to dummy bit line DBLb.

Memory cell MC has variable resistance element (phase change element) VR set to either a high resistance state or a low resistance state. When one column is selected in column select circuit 112, the complementary data appearing on dummy bit lines DBLa and DBLb are compared with the data of the selected memory cell, and thus, data of the selected memory cell can be read out accurately even if the current flowing through the selected memory cell is small.

Word line drive circuit 104 includes a word line driver WV provided corresponding to word line WL. In FIG. 20, word line drivers WV0–WV3 provided corresponding to word lines WL0–WL3, respectively, are depicted representatively. Word line drivers WV0–WV3 maintain an output signal at an H level (power supply voltage level) when the corresponding word line is at an unselected state, and sets the word line of a selected state to an L level (ground voltage level).

Bit line drive circuit 103 includes a bit line driver BV provided corresponding to bit line BL, and dummy bit line drivers DBVa and DBVb provided corresponding to dummy bit lines DBLa and DBLb, respectively. In FIG. 20, bit line drivers BV0 and BV1 provided corresponding to bit lines BL0 and BL1 are depicted representatively.

These bit line driver BV (BV0, BV1) and dummy bit line drivers DBVa and DBVb have the same structure, and each include a pull up transistor UNT and a pull down transistor DNT.

Bit line driver BV (indicating BV0 and BV1 generically) and dummy bit line drivers DBVa and DBVb are set at an output high impedance state at the period other than a data write operation. In data read, current is supplied from the internal data bus to bit line BL (indicating BL0 and BL1 generically) provided corresponding to the selected column and to dummy bit lines DBLa and DBLb via column select circuit 112. The current flowing to the selected memory cell differs depending upon the stored data in the selected memory cell. Dummy cell DMCa is set at a high resistance state while dummy cell DMCb is set at a low resistance state. Therefore, the amount of current flowing through the selected bit line is close to the current flowing to one of dummy bit lines DBLa and DBLb. Detection is made on which of the dummy bit lines causes the current flow closer to the amount of current flowing through the selected bit line, and internal data is read out based on the result of detection.

In data writing, bit line driver BV provided to the bit line corresponding to the selected column is rendered active. In writing the high resistance state, bit line driver BV supplies a voltage of an H level in a short period pulse form to a corresponding bit line, and then renders the pull down transistor conductive after completion of the pull up operation of the selected bit line. In the selected memory cell, the crystalline state of the phase change element of variable resistance element VR enters a fused state by the heating, and is then rapidly quenched to enter an amorphous state. When a low resistance state is to be set, bit line driver BV pulls up the corresponding bit line to the power supply voltage level, and then renders the pull down transistor conductive to gradually reduce the current flowing to the selected bit line. Following completion of the bit line pull up operation, only pull down is executed. In this case, variable resistance element (phase change element) VR has its crystalline state slowly cooled down from the fused state to transition into a polycrystalline state. Consequently, a low resistance state is implemented.

This operation control in writing is executed by write driver decoder 106 based on a write control signal from write circuit 114 shown in FIG. 19.

Figure 21:
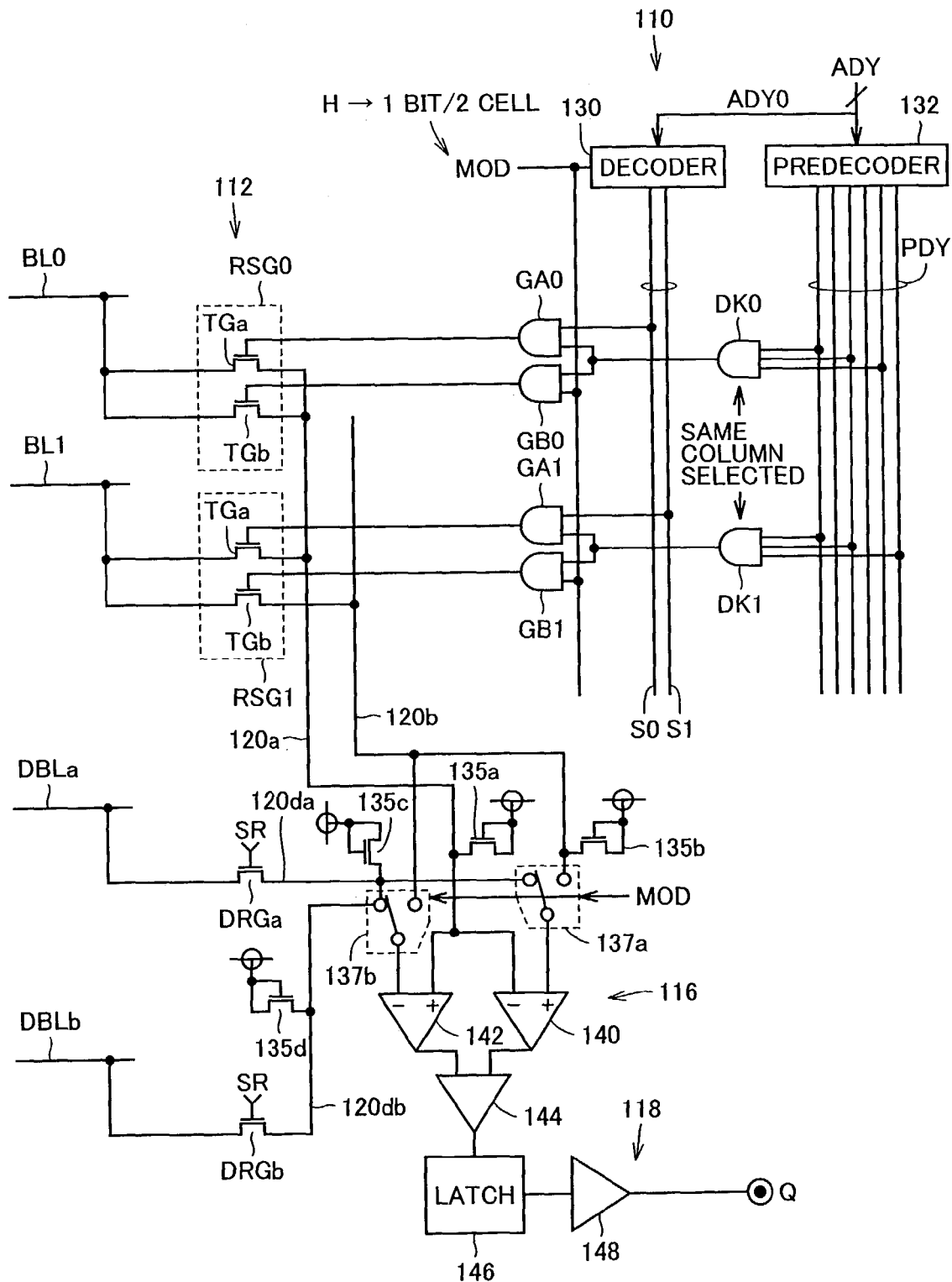
FIG. 21 specifically shows a structure of the column select circuit, bit line decoder, and readout circuit of FIG. 19.

FIG. 21 shows a structure of column select circuit 112, bit line decoder 110 and readout circuit 116 of FIG. 19. Referring to FIG. 21, bit line decoder 110 includes a decoder 130 receiving a particular address bit ADY0 of a bit line address signal ADY and a mode designation signal MOD to generate decode signals S0 and S1 of 2 bits, a predecoder 132 for predecoding the remaining bits other than address signal bit ADY0 of bit line address signal ADY to generate a predecode signal PDY, and a decode circuit DK provided corresponding to each bit line BL and receiving predecode signals of a predetermined combination of predecode signal PDY. In FIG. 21, decode circuits DK0 and DK1 provided corresponding to bit lines BL0 and BL1 are depicted representatively.

Mode designation signal MOD designates the 1-bit/2-cell mode storing 1-bit data by memory cells of 2 bits when set at an H level, and designates the 1-bit/1-cell mode storing 1-bit data by a memory cell of 1-bit when set at an L level.

A particular address bit ADY0 specifies the even number or odd number of the bit lines. Decoder 130 renders active either decode signal S0 or S1 in the 1-bit/1-cell mode, and maintains decode signals S0 and S1 at an inactive state in the 1-bit/2-cell mode .

Bit line decoder 110 further includes a gate circuit GA arranged corresponding to each respective bit line BL and receiving an output signal of a corresponding decode circuit DK and one of decode signals S0 and S1 from decoder 130, and a gate circuit GB disposed corresponding to each respective bit line BL and receiving an output signal of a corresponding decode circuit DK and mode designation signal MOD.

In the construction shown in FIG. 21, gate circuits GA0 and GB0 are provided for bit line BL0. Gate circuit GA0 receives decode signal S0 and the output signal from decode circuit DK0. Gate circuit GB0 receives mode designation signal MOD and the output signal from decode circuit DK0.

Gate circuits GA1 and GB1 are provided for bit line BL1. Gate circuit GA1 receives decode signal S1 from decoder 130 and the output signal from decode circuit DK1. Gate circuit GB1 receives mode designation signal MOD and the output signal from decoder circuit DK1.

In the construction of bit line decoder 110, two bit lines are selected according to predecode signal PDY output from predecoder 132. FIG. 21 shows that decode circuits DK0 and DK1 receive a different combination of predecode signal PDY. However, decode circuits DK0 and DK1 are driven to a selected state at the same time. In other words, decode circuits DK0 and DK1 are selected at the same time in both the 1-bit/1-cell mode and 1 bit/2-cell mode.

Decoder 130 performs a decoding operation, when mode designation signal MOD is at an L level, to generate decode signals S0 and S1 according to address signal bit ADY0. Therefore, in the 1-bit/1-cell mode, one bit line is specified according to the signals S0 and S1 from among the two columns of bit lines specified by predecode signal PDY.

Decoder 130 sets decode the signals S0 and S1 both at the fixed level of L when mode designation signal MOD is at an H level to designate the 1 bit/2-cell mode. In this case, gate circuits GB0 and GB1 are selected according to the output signals from corresponding decode circuits DK0 and DK1.

In the 1-bit/2-cell mode, data of memory cells of 2 bits are read out. A set of bit lines selected simultaneously in this 1-bit/2-cell mode may be formed of adjacent bit lines or of bit lines located remote from each other. In the 1-bit/2-cell mode, the memory cells connected to bit lines selected simultaneously store complementary data.

Column select circuit 112 includes a read select gate RSG provided corresponding to each respective bit line BL. In FIG. 21, read select gates RSG0 and RSG1 are provided corresponding to bit lines BL0 and BL1, respectively. Read column select gates RSG0 and RSG1 each include a column select gate TGa rendered conductive according to an output signal from a corresponding gate circuit GA (GA0–GA1) to couple a corresponding bit line BL (BL0, BL1) to internal data line 120a, and a column select gate TGb rendered conductive according to an output signal of a corresponding gate circuit GB (GB0, GB1) to couple bit lines in a pair (BL0, BL1) to internal data lines 120a and 120b, respectively.

FIG. 21 shows an example of a structure, in which bit lines BL0 and BL1 are coupled to internal data lines 120a and 102b, respectively, when the output signals of gate circuits GB0 and GB1 both attain an H level.

Column select circuit 112 further includes select gates DRGa and DRGb responsive to activation of a read out timing signal SR for coupling dummy bit lines DBLa and DBLb to internal reference data lines 120da and 120 db, respectively. Read out timing signal SR is rendered active in a data read mode. Read out timing signal SR is generated by a circuit having an identical structure to the circuit including decode circuit DK and gate circuit GA or GB. In response to activation of predecoder 132 and decoder 130, read out timing signal SR is rendered active at a timing same as the timing of activation of the column select signal generated from gate circuit GA or GB.

This read out timing signal SR may be constantly maintained at an inactive state in the 1-bit/2-cell mode.

Readout circuit 116 includes current supply elements 135a–135d provided corresponding to internal data lines 120a and 120b and internal reference data lines 120da and 120db, respectively. Current supply elements 135e–135d are each formed of a diode-connected N-channel MOS transistor in the structure shown in FIG. 21. By current supply elements 135a–135d, the bit line corresponding to the selected column and dummy bit lines DBLa and DBLb are supplied with current in data reading.

In FIG. 21, current supply elements 135a–135d are shown each supplying a current constantly. However, current supply elements 135a–135d may be configured to receive at power supply nodes an output current supplied from a current source formed of a current mirror circuit, for example, which is rendered active in data reading.

Moreover, current supply elements 135a–135d may be electrically coupled via a switching transistor to the power node that supplies a voltage of a predetermined level when the data read out designation signal is active. Such a voltage of the power node needs to be at the voltage level at which the voltage change in the internal data line caused by the current flowing to the bit line and the dummy bit line is detected by the next-stage differential amplifier circuits 140 and 142 at the most sensitive region thereof.

Read circuit 116 further includes a select circuit 137a for selecting one of internal reference data line 120da and internal data line 120a according to mode designation signal MOD, a select circuit 137b for selecting one of internal reference data line 120db and internal data line 120b according to mode designation signal MOD, a differential amplify circuit 140 for amplifying differentially the data on internal data line 120a and the data on the data line selected by select circuit 137a, a differential amplify circuit 142 for amplifying differentially the data on the data line selected by select circuit 137b and the data on internal data line 120a, an amplify circuit 144 for further amplifying the output signals of differential amplifier circuits 140 and 142, and a latch 146 for latching the output signal of amplify circuit 144.

Select circuits 137a and 137b select internal reference data lines 120da and 120db, respectively, when mode designation signal MOD designates the 1-bit/1-cell mode. When mode designation signal MOD designates the 1-bit/2-cell mode, select circuits 137a and 137b both select internal data line 120b.

Differential amplify circuits 140 and 142 receive the data signal on internal data line 120a at different inputs of their complementary inputs from each other. According to the structure shown in FIG. 21, differential amplify circuit 140 receives the signal on internal data line 120a at its negative input whereas differential amplify circuit 142 receives the signal on internal data line 120a at its positive input. Differential amplify circuits 140 and 142 each function as an analog amplify circuit providing a signal output according to the potential difference of the received signals.

Differential amplify circuit 144 amplifies differentially, in a digital manner, the signals differentially amplified in an analog manner by differential amplify circuits 140 and 142, to generate a binary signal. Differential amplify circuits 140 and 142 are each formed of, for example, a current mirror type amplifier whereas differential amplify circuit 144 is formed of a cross-coupled latch type amplifier.

Latch 146 is provided to adjust the external read out timing of internal data. Latch 146 also functions to shorten the operating period of differential amplify circuits 140 and 142 to reduce current consumption.

Input/output circuit 118 includes an output buffer 148 that buffers the data latched by latch 146, to generate external read out data Q. Output buffer 148 is rendered active according to a read activation signal (not shown) in a data read mode, to buffer the latch data of latch 146 for generating external data Q.

Figure 22:
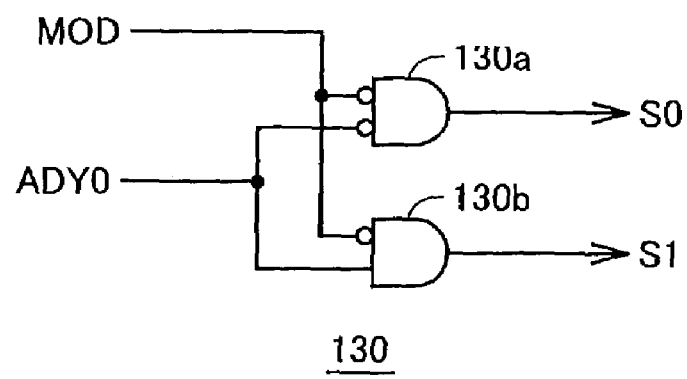
FIG. 22 shows an example of a construction of the decoder of FIG. 21.

FIG. 22 shows an example of a construction of decoder 130 shown in FIG. 21. Referring to FIG. 22, decoder 130 includes a gate circuit 130a receiving a mode designation signal MOD and a bit line address bit ADY0, and a gate circuit 130b receiving the mode designation signal MOD and the address bit ADY0.

Gate circuit 130a sets decode signal S0 at an H level when mode designation signal MOD and bit line address signal bit ADY0 are both at an L level. Gate circuit 130b sets decode signal S1 at an H level when mode designation signal MOD is at an L level and bit line address signal bit ADY0 is at an H level.

When mode designation signal MOD is at an H level to specify the 1-bit/2-cell mode, decode signals S0 and S1 output from gate circuits 130a and 130b are fixed at an L level.

Figure 23:
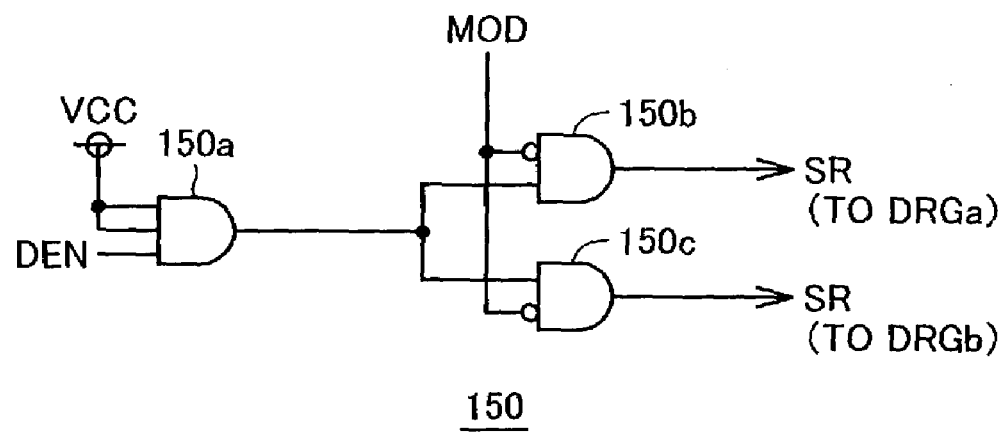
FIG. 23 shows an example of a construction of the portion related to generation of a dummy bit line select signal of FIG. 21.

FIG. 23 shows an example of a construction of the portion of generating read out timing signal SR of FIG. 21. Referring to FIG. 23, read out timing signal generation circuit 150 includes a gate circuit 150a receiving power supply voltage VCC and a decode enable signal DEN, a gate circuit 150b receiving mode designation signal MOD and an output signal of gate circuit 150a to generate a read out timing signal SR to select gate DRGa of FIG. 21, and a gate circuit 150c receiving the output signal of gate circuit 150a and mode designation signal MOD to generate a read out timing signal SR to select gate DRGb of FIG. 21.

Gate circuit 150a has a structure similar to that of decode circuit DK of FIG. 21, and outputs a signal of an H level when decode enable signal DEN is rendered active. Decode enable signal DEN corresponds to a delayed signal of the predecode activation signal that provides the activation timing of predecoder 132 of FIG. 21. Decode enable signal DEN is activated at the timing similar to the timing at which the prdecode signal PDY from predecoder 132 activated in response to this predecode activation signal attains a definite state. The signal propagation delay of gate circuit 150a is made identical to the signal propagation delay of decode circuit DK (DK0, DK1).

Gate circuits 150b and 150c each drive read out timing signal SR to an H level in accordance with the output signal of gate circuit 150a when mode designation signal MOD is at an L level. When mode designation signal MOD is at an H level, read out timing signals SR from gate circuits 150b and 10c are each maintained at an L level. Read out timing signal SR is rendered active according to the output signal of gate circuit 150a only in the 1-bit/1-cell mode. In the 1-bit/2-cell mode, read timing signal SR is fixed at an L level, and dummy bit lines DBLa and DBLb are normally isolated from internal reference data lines 120da and 120db.

By setting the signal propagation delay of gate circuits 150a, 150b and 150c identical to those of decode circuit DK and gate circuits GA and GB for column selection, the timing of connection of a selected bit line to the internal data line can be set identical to the timing of connection of the dummy bit line to the internal reference data line in the 1-bit/1-cell mode.

Figure 24:
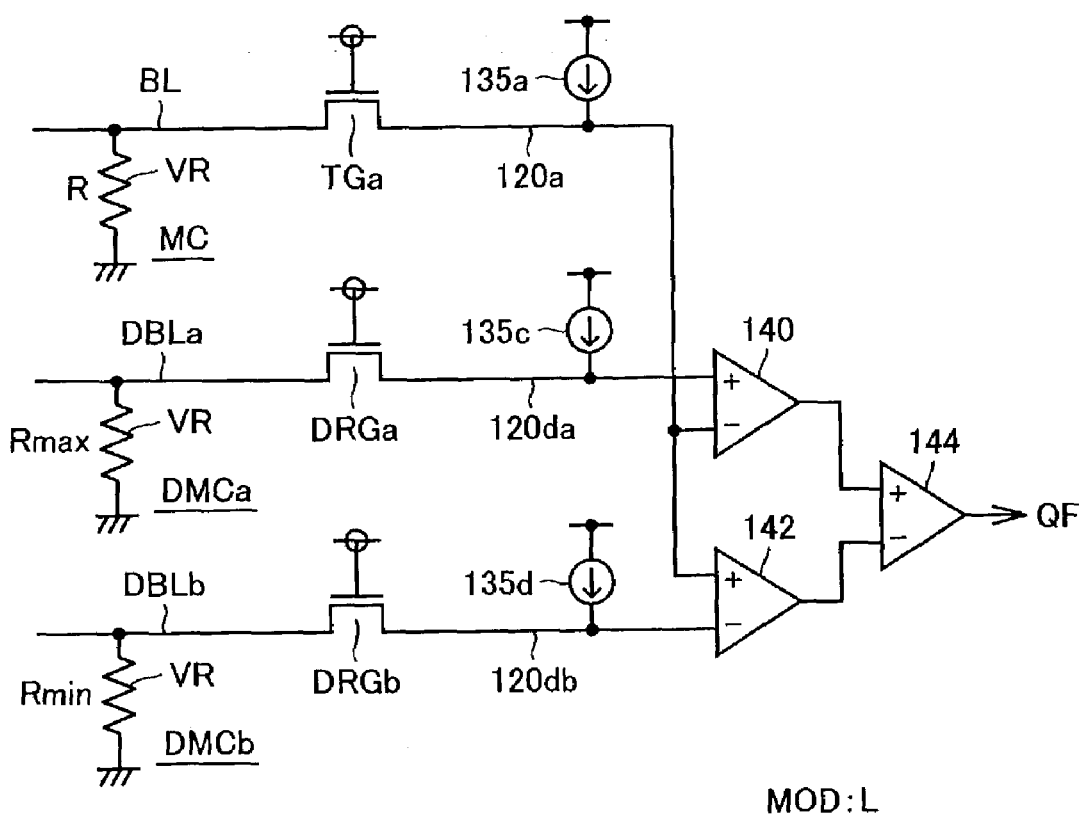
FIG. 24 schematically shows connection of a data readout unit in a 1 bit/1 cell mode.

FIG. 24 schematically shows the connection in the section of data readout of a memory cell in the 1-bit/1-cell mode. FIG. 24 represents connection of the data readout section in the case when the data of memory cells MC connected to a bit line BL are to be read out.

In the 1-bit/1-cell mode, mode designation signal MOD shown in FIG. 21 is fixed at an L level. Referring to FIG. 24, transfer gate TGa is driven to a selected state according to the bit line address signal and receives power supply voltage at its gate to connect bit line BL to internal data line 120a. Dummy bit lines DBLa and DBLb are connected to internal reference data lines 120da and 120db, respectively.

Internal data lines 120a and internal reference data lines 120da and 120db are precharged to a predetermined voltage level prior to conduction of transfer gates TGa, DRGa and DRGb, by current source transistors 135a, 135c and 135e, respectively. Erroneous read out can be prevented, which would be otherwise caused by generation of current spike on the bit line due to the current flow from the current source upon connection of select bit line BL with internal data line 120a. Specifically, in a column select operation, the word line is in a selected state, and current supplied to the selected bit line is discharged via the selected memory cell. Accordingly, generation of ringing in the selected bit line and excessive increase of the selected bit line potential are prevented.

In memory cell MC, variable resistance element (phase change element) VR has a resistance value R according to stored data. In dummy cell DMCa, the variable resistance element (phase change element) VR has a resistance value of Rmax. In dummy cell DACb, the variable resistance element (phase change element) VR has a resistance value Rmin.

Switch select circuits 137a and 137b shown in FIG. 21 select internal reference data lines 120da and 120db. Differential amplify circuit 140 amplifies differentially the signals of internal data line 120a and internal reference data line 120da. Differential amplify circuit 142 amplifies differentially the signal on data line 120a and the signal on internal reference data line 120db. Differential amplify circuit 140 has its positive input coupled to internal data line 120a. Differential amplify circuit 142 has its negative input coupled to internal data line 120a. Amplify circuit 144 receives the output signal of differential amplify circuit 140 at its positive input and the output signal of differential amplify circuit 142 at its negative input to amplify differentially the received signals to generate internal read out signal QF.

When resistance value R of the variable resistance element (phase change element) VR of selected memory cell MC is substantially equal to resistance value Rmax of variable resistance element (phase change element) VR of dummy cell DMCa, internal data line 120a and internal reference data 120da cause current flows of the same amount, to attain substantially the same voltage level. Therefore, the swing of the output signal of differential amplify circuit 140 is small. In dummy cell DMCb, a current larger than the current flowing through memory cell MC flows, and a larger voltage difference occurs between internal data line 120a and internal reference data line 120db. Thus, the output signal of differential amplify circuit 140 varies significantly. In the significant change of the output signals of differential amplify circuits 140 and 142, the output signal is changed in the same direction as the direction of the small swing signal. By amplifying differentially, at amplify circuit 144, the output signals of differential amplify circuits 140 and 142, the logic level of the output signal from amplify circuit 144 differs according to the differential amplify circuit that generates an output signal exhibiting a great change, whereby internal data can be read out.

Figure 25:
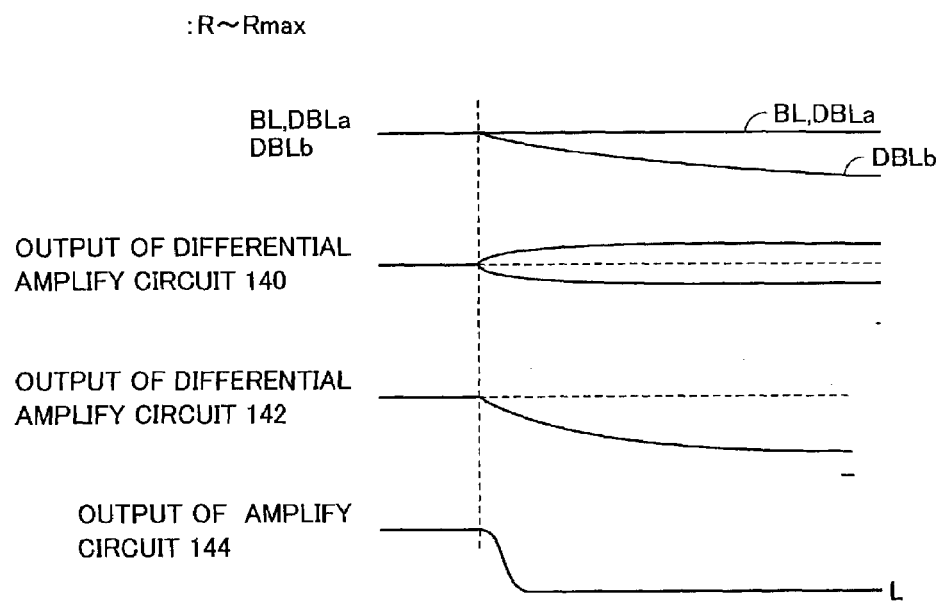
FIG. 25 is a signal waveform diagram representing an operation in reading out memory cell data of a high resistance state.

FIG. 25 represents signal waveforms in data readout when the resistance value R of variable resistance element (phase change element) VR of selected memory cell MC is substantially equal to resistance value Rmax of variable resistance element (phase change element) VR of dummy cell DMCa. FIG. 25 shows the relative relationship of the voltage levels of bit lines BL and dummy bit lines DBLa and DBLb. Depending upon the relationship between the precharge voltage level of bit line BL and dummy bit lines DBLa and DBLb, and the voltage level of the read current source, the voltage change waveform of bit line BL and dummy bit line DBLa and DBLb differ.

FIG. 25 shows the waveforms, for the sake of simplifying the description, of bit line BL and dummy bit lines DBLa and DBLb being precharged to a voltage level identical to the supplying voltage of read current source. The signal waveforms in the case when respective output signals from amplify circuits 140, 142 and 144 are initialized to the intermediate voltage level are indicated.

Similar signal waveforms can be obtained in the case when bit line BL and dummy bit lines DBLa and DBLb are precharged at the ground voltage level at the initial state and amplify circuits 140, 142 and 144 have their output signals set at an L level at the initial state. A precharge operation from the ground voltage level at the initial state to the intermediate voltage level is additionally performed.

Description is given hereinbelow of the case where these signals are precharged to the read out voltage level in the initial state.

When data read out commences, a read out current is supplied to the bit lines by current sources 135a, 135b and 135e shown in FIG. 24. At this stage, bit lines BL and DBLa maintain their voltages at the precharge level since the amount of discharging current via each corresponding selected memory cell is small. The memory cell of dummy bit line DBLb has a small resistance value, so that a large current is discharged. Therefore, dummy bit line DBLb has its voltage level lowered below that of bit lines BL and DBLa.

The output signal of differential amplify circuit 140 changes only slightly from the intermediate voltage level and exhibits a small swing since the potential difference between bit line BL and dummy bit line DBLa is small. It is assumed here that differential amplify circuits 140 and 142 each output a signal of an intermediate voltage level when both inputs are at the same voltage level. In this case, the potential difference of bit line BL and dummy bit line DBLa is determined depending upon the relationship between the actual resistance value R of selected memory cell MC and the actual resistance value Rmax of the variable resistance element (phase change element) VR of selected dummy cell DMCa, and responsively sets the voltage level of the output signal of differential amplify circuit 140. However, the deviation of the output signal of differential amplify circuit 140 from the intermediate voltage level is small.

In contrast, the output signal of differential amplify circuit 142 exhibits a significant change from the intermediate voltage level due to the large potential difference between bit line BL and dummy bit line DBLb. In FIG. 25, differential amplify circuit 142 receives the signal from the dummy bit line at its negative input, and causes the output signal to exhibit a great rise from the intermediate voltage level. Therefore, the output signal of differential amplify circuit 140 attains a voltage level lower than that of the output signal from differential amplify circuit 142.

Amplify circuit 144 receives the output signals of differential amplify circuits 140 and 142 at its positive and negative inputs, respectively, to amplify the input signals to output a signal TF of an L level.

Figure 26:
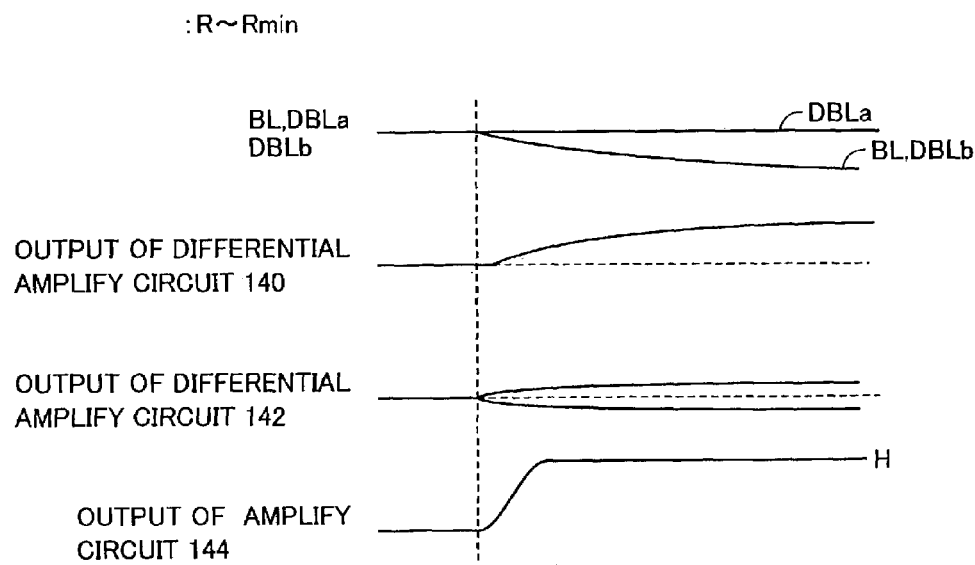
FIG. 26 is a signal waveform diagram representing an operation in reading out memory cell data of a low resistance state.

FIG. 26 represents a read out signal waveforms in the case when resistance value R of variable resistance element (phase change element) VR of selected memory cell MC is equal to resistance value Rmin of variable resistance element (phase change element) VR of dummy cell DMCb.

FIG. 26 represents the operation waveforms for the case where bit line BL and dummy bit line DBLa and DBLb are precharged to the read voltage level, and amplify circuits 140, 142 and 144 have their output signals precharged to the intermediate level.

When resistance value R of selected memory cell MC is substantially equal to resistance value Rmin of dummy cell DMCb, the potentials of bit line BL and dummy bit line DBLb are significantly lower than the voltage level of dummy bit line DBLa. Therefore, differential amplify circuit 140 generates an output signal exhibiting a great change from the intermediate voltage level through differential amplification of the voltages of bit line BL and dummy bit line DBLa. Since differential amplify circuit 140 receives a signal from dummy bit line DBLa at its positive input, the output signal thereof greatly rises from the intermediate voltage level.

In contrast, differential amplify circuit 142 outputs a signal that changes in a small amplitude range from the intermediate voltage level since the voltage difference between bit line BL and dummy bit line DBLb is small. The output signal of differential amplify circuit 140 is sufficiently higher than the output signal of differential amplify circuit 142. Therefore, differential amplify circuit 144 receives the output signal of differential amplify circuit 140 at its positive input and the output signal (internal read data) QF thereof attains an H level.

Thus, even if memory cells MC are ultra-miniaturized and the amount of current flowing through resistance R of the memory cell does not change significantly between resistance value Rmax and resistance value Rmin, the small current difference can be increased reliably by using amplify circuits 140, 142 and 144. Thus, internal read data QF can be generated accurately.

In FIGS. 25 and 26, internal read data QF are driven to an L level and an H level when variable resistance element VR of memory cell MC is in a high resistance state and in a low resistance state, respectively. However, memory cells MC may have the H and L data storage states correlated with a high and a low resistance state, respectively.

Figure 27:
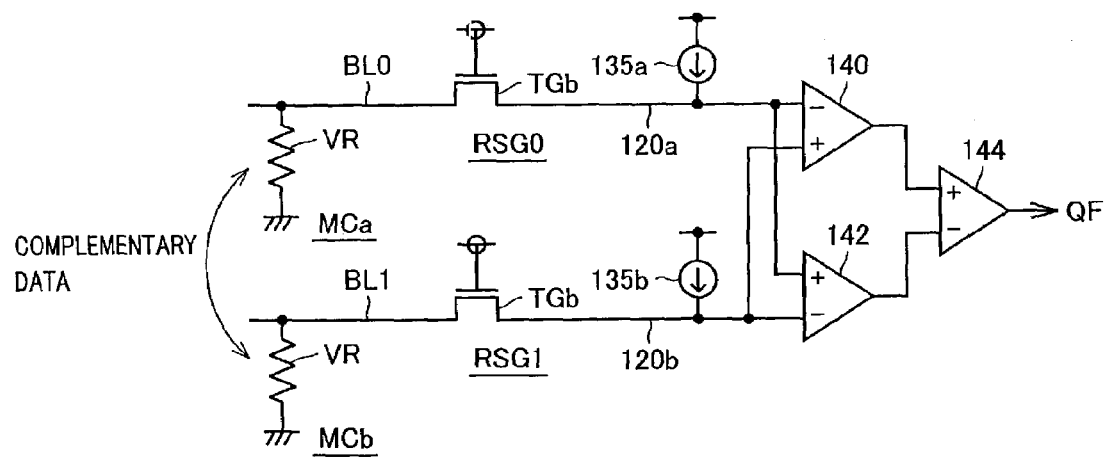
FIG. 27 schematically shows connection of a data readout section in a 1 bit/2-cell mode.

FIG. 27 schematically shows the connection path of the data readout section in a data reading operation in the 1-bit/2-cell mode. In the 1-bit/2cell mode, mode designation signal MOD is set at an H level, whereby decode signals S0 and S1 are fixed at an L level in the arrangement of FIG. 21. Therefore, gate circuit GB (GB0, GB1) of FIG. 21 controls the conduction/non-conduction of transfer gate TGb provided in the corresponding read column select gate RSG (RSG0, RSG1) in accordance with the output signal of a corresponding decode circuit DK (DK0, DK1).

Switch select circuits 137a and 137b shown in FIG. 21 select the internal data lines 120b and 120a, instead of internal reference data line 120da and 120db, respectively, in accordance with mode designation signal MOD. Therefore, differential amplify circuit 140 is connected to internal data lines 120a and 120b. Also, differential amplify circuit 142 is coupled to internal data lines 120a and 120b. Connection of internal data lines 120a and 120b to differential amplify circuits 140a and 142 are complementary to each other. Specifically, in FIG. 27, internal data line 120a is coupled to the negative input of differential amplify circuit 140 and coupled to the positive input of differential amplify circuit 142. Internal data line 120b is coupled to the positive input of differential amplify circuit 140 and to the negative input of differential amplify circuit 142.

It is considered the state where bit lines BL0 and BL1 are selected as shown in FIG. 27. In this case, transfer gates TGb included in read select gates RSG0 and RSG1 are both rendered conductive, whereby bit line BL0 is coupled to internal data line 120a and bit line BL1 is coupled to internal data line 120b. Internal data lines 120a and 120b are coupled to current sources 135a and 135b, to supply reference currents, respectively. Memory cell MCa connected to bit line BL0 and memory cell MCb connected to bit line BL1 store complementary data. Therefore, one of memory cells MCa and MCb is in a high resistance state whereas the other is in a low resistance state.

Figure 28:
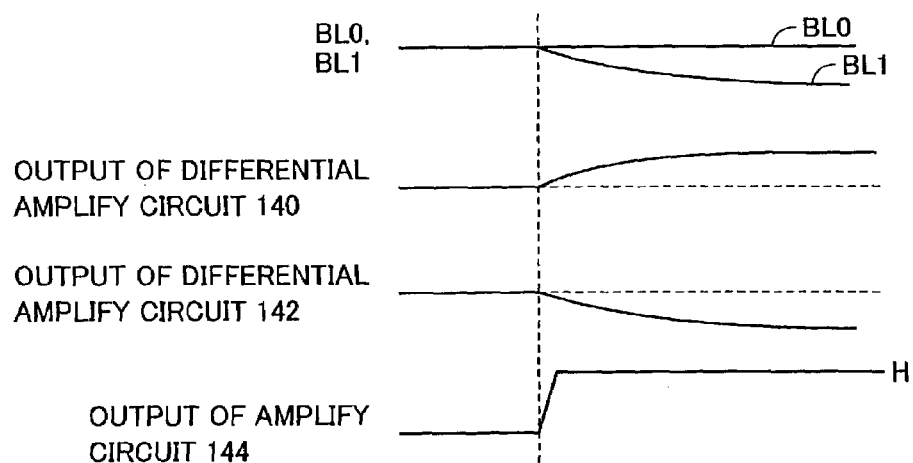
FIG. 28 is a signal waveform diagram representing a data read out operation according to the structure of FIG. 27.

FIG. 28 is a signal waveform diagram representing an operation of data read out when memory cells MCa and MCb shown in FIG. 27 are selected. The data read out operation of memory cells MCa and MCb will be described hereinbelow with reference to FIG. 28. FIG. 28 shows the waveforms for the case in which memory cell MCa is in a low resistance state and memory cell MCb is in a high resistance state by way of example.

When the memory cell data read out operation commences, internal data lines 120a and 120b are precharged by current sources 135a and 135b. Internal data lines 120a and 120b are precharged to a predetermined voltage level by current sources 135a and 135b, and the inputs of differential amplify circuits 140 and 142 are set to the same voltage level.

According to the bit line read out signal, transfer gate TGb is rendered conductive, and bit lines BL0 and BL1 are electrically coupled to internal data lines 120a and 120b, respectively. The current from current sources 135a and 135b flows into memory cells MCa and MCb. Since memory cells MCa and MCb are currently in a low resistance state and in a high resistance state, respectively, a large current flows via memory cell MCa. Thus, bit line BL1 is substantially maintained at the precharged voltage level whereas bit line BL0 is decreased in voltage level from the precharged voltage level. Therefore, potential difference is generated between bit lines BL0 and BL1, and therefore between internal data lines 120a and 120b.

Differential amplify circuits 140 and 142 amplify differentially the voltages on internal data lines 120a and 120b complementarily to each other. Therefore, differential amplify circuit 140 causes the output signal to rise from the initial state whereas differential amplify circuit 142 causes the output signal to lower from the initial state. Amplify circuit 144 amplifies the output signals from differential amplify circuits 140 and 142 to generate internal read data QF of an H level.

In the case in which memory cells MCa and MCb are in a high resistance state and in a low resistance state, respectively, bit line BL0 maintains the precharged voltage level whereas bit line BL1 attains a low level. Therefore, differential amplify circuit 140 provides an output signal of a low level whereas differential amplify circuit 142 provides an output signal of a high level. Accordingly, internal read data QF from amplify circuit 144 attains an L level.

Even if the driving current by memory cells MCa and MCb is small, a potential difference of a sufficient magnitude can be generated between bit lines BL0 and BL1 since complementary data are stored in memory cells MCa and MCb in the 1-bit/2-cell mode. Therefore, the output signals can be changed sufficiently by differential amplify circuits 140 and 142, to allow amplify circuit 144 at the final state to generate internal read data QF accurately.

By setting mode designation signal MOD with an external command or the like, the address region can be divided such that a particular region in the memory cell array is used for storing data in the 1-bit/2-cell mode whereas the other region is used for storing data in the 1-bit/1-cell mode. Thus, a memory of a large capacity with high versatility can be achieved in one non-volatile semiconductor memory device by storing data that is required of high reliability in the 1-bit/2-cell mode and storing data that is processed in large amounts in the 1-bit/1-cell mode.

By generating mode designation signal MOD using a particular address signal bit, a particular address region can be used to store data in the 1-bit/1-cell mode whereas another address region can be used to store data in the 1-bit/2-cell mode. The data storage mode can be set by just applying an address signal to facilitate control of mode setting.

[Construction of Write Section]

Figure 29:
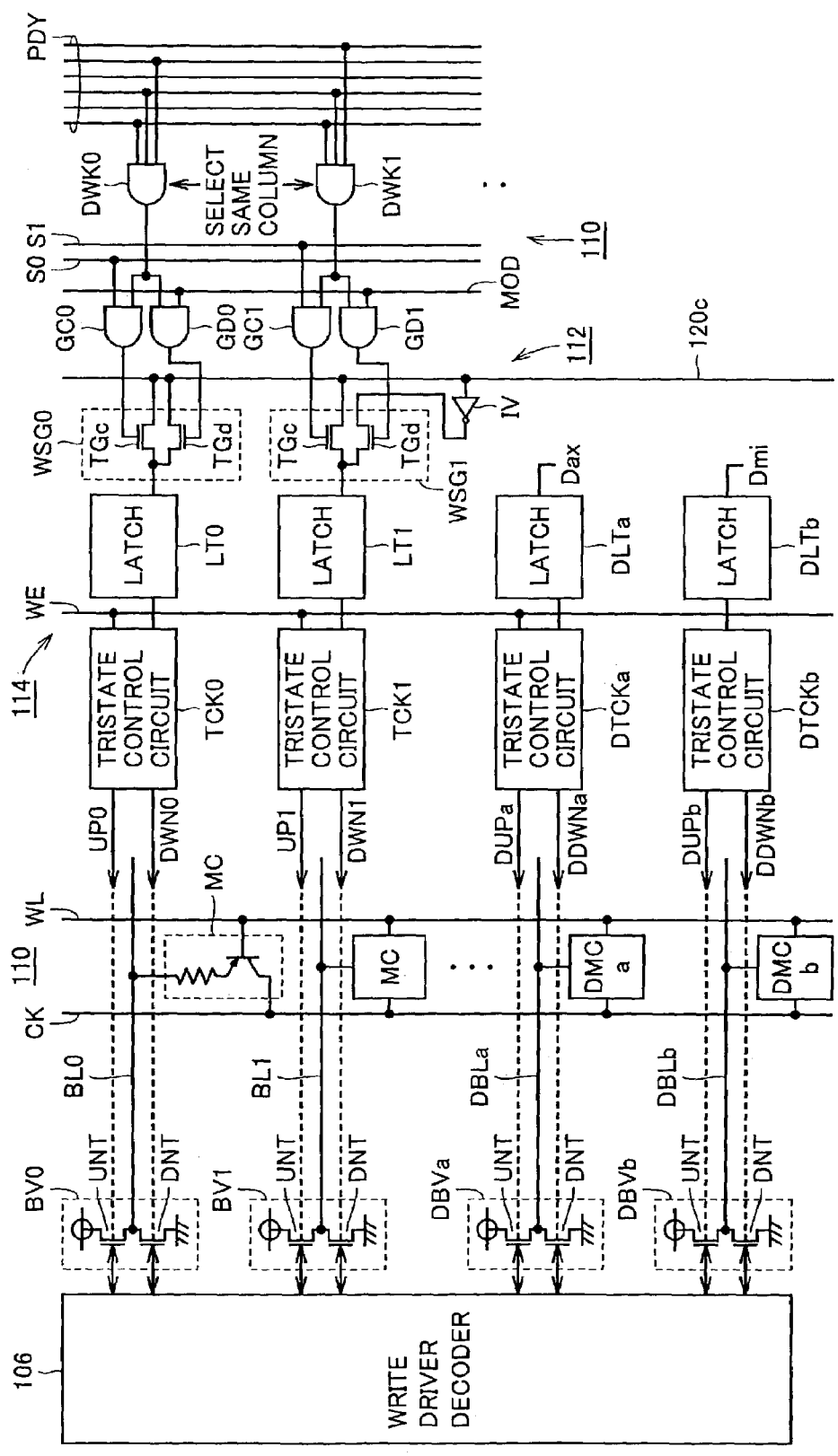
FIG. 29 schematically shows a structure of the write circuit and write column select circuit of FIG. 19.

FIG. 29 shows a structure of the portion of write circuit 114 and the portion of column select circuit 112 and bit line decoder 110 related to write circuit 114 shown in FIG. 19. In memory cell array 100, memory cells MC and dummy cells DMCa and DMCb are arranged in rows and columns. In FIG. 29, memory cell MC and dummy cells DMCa and DMCb arranged in one column are depicted representatively.

Word line WL and collector line CK are provided for a row of memory cells MC and dummy cells DMCa and DMCb. Bit line BL is arranged corresponding to a column of memory cells. In FIG. 29, two bit lines BL0 and BL1 are shown representatively. Dummy bit lines DBLa and DBLb are provided corresponding to dummy cells DMCa and DMCb, respectively.

In bit line decoder 110, decode circuits DWK0 and DWK1 receiving predecode signal PDY are provided corresponding to respective bit lines. Decode circuits DWk0 and DWK1, provided corresponding to bit lines BL0 and BL1, respectively, enter a selected state at the same time. This is identical to the structure of bit line decode circuits in the data readout section. In the 1-bit/2-cell mode, two bit lines are selected at the same time for writing complementary data.

Gate circuits GC and GD are provided corresponding to decode circuit DWK (DWK0, DWK1) to alter the number of bit lines selected at the same time in accordance with the cell operation mode. Decode circuit DWK0 is provided with a gate circuit GC0 receiving the output signal of decode circuit DWK0 and decode signal S0, and a gate circuit GC0 receiving mode designation signal MOD and the output signal of decode circuit DWK0. For decode circuit DWK1, there are provided a gate circuit GC1 receiving the output signal of decode circuit DWK1 and decode signal S1, and a gate circuit GD1 receiving mode designation signal MOD and the output signal of decode circuit DWK1.

Similarly to the structure shown in FIG. 21, mode designation signal MOD specifies the 1-bit/1-cell mode and the 1-bit/2-cell mode. Decode signals S0 and S1 are generated from decoder 130 shown in FIG. 21. Predecode signal PDY is generated from predecoder 132 shown in FIG. 21.

A write column select gate WSG (WSG0, WSG1) is provided corresponding to each respective bit line BL (BL0, BL1). Write column select gates WSG provided corresponding to an even numbered bit line and to an odd numbered bit line are made different in connection path in the 1 bit/2-cell mode. Specifically, write column select gate WSG0 provided corresponding to an even numbered bit line BL0 includes a transfer gate TGc rendered conductive according to an output signal of gate circuit GC0, to couple internal data line 120c with latch circuit LT0, and a transfer gate TGd connecting internal data line 120c to latch circuit LT0 according to an output signal of gate circuit GD0. Write column select gate WSG1 arranged corresponding to an odd numbered bit line BL1 includes a transfer gate TGc coupling internal data line 120c to latch circuit LT1 according to an output signal of gate circuit GC1, and a transfer gate TGa connecting latch circuit LT1 to memory data line 120c via inverter IV according to an output signal of gate circuit GD1.

Latch circuits LT0 and LT1 are provided corresponding to bit lines BL0 and BL1, respectively, and latch data applied via corresponding write column select gates in a data write operation mode. Therefore, latch circuit LT0 of an even number stores data on internal data line 120c whereas latch circuit LT1 of an odd number latches inverted data of the data on internal data line 120c via inverter IV. Therefore, in the 1-bit/2-cell mode, latch circuits LT0 and LT1 store data complementary to each other.

Latch circuits DLTb and DLTa storing dummy data Dax and Dmi, respectively, are provided for dummy bit lines DBLa and DBLb, respectively. Dummy data Dax and Dmi are data complementary to each other. For example, data Dax corresponds to a high resistance state whereas data Dmi corresponds to a low resistance state.

A tristate control circuit TCK (TCK0, TCK1) is provided corresponding to latch circuit LT (LT0, LT1). Tristate control circuits DTCKa and DTCKb are provided corresponding to latch circuits DLTa and DLTb, respectively.

Tristate control circuit TCK (indicating TCK0, TCK1, generically) and DTCKa and DTCKb sets the write line driver control operation of write driver decoder 106 according to the latch data in a corresponding latch circuit. Specifically, tristate control circuit TCK (indicating TCK0 and TCK1 generically) generates and provides to write driver decoder 106 a write control signal UP (indicating UP0, UP1 generically) and DWN (indicating DWN0, DWN1 generically).

Tristate control circuit DTCKa generates, to write driver decoder 106, dummy data write control signals DUPa and DDWNa according to data Dax stored in latch circuit DLTa. Tristate control circuit DTCKa generates, to write driver decoder 106, write control signals DUTb and DDWNb according to data Dmi stored in latch circuit DLTb.

Write driver decoder 106 enables the bit line driver provided corresponding to a selected bit line according to an address signal not shown, and generates an operation control signal to the enabled bit line driver according to write control signals UP, DWN or DUP, DDWN, for supplying a write current pulse to the corresponding bit line.

Bit line driver BV (BV0, BV1) is provided for bit line BL (BL0, BL1). Dummy bit line drivers DBVa and DBVb are provided corresponding to dummy bit lines DBLa and DBLb. Bit line driver BV (BV0, BV1) includes a pull up transistor UNT to pull up a corresponding bit line, and a pull down transistor DNT to pull down a corresponding bit line. Similarly, bit line drivers DBVa and DBVb include a pull up transistor UNT and a pull down transistor DNT.

Write driver decoder 106 selects a bit line driver BV corresponding to a selected bit line according to a bit line address signal, and performs on/off control of pull up transistor UNT and pull down transistor DNT of the selected bit line driver.

Tristate control circuit TCK (indicating TCK0, TCK1, . . . generically) and DTCKa, DTCKb generate corresponding control signals UP and DWN, DUP, DWN according to the latch data in corresponding latch circuits LT (indicating LT10, LT1 generically) and DLTa, DLTb.

Figure 30:
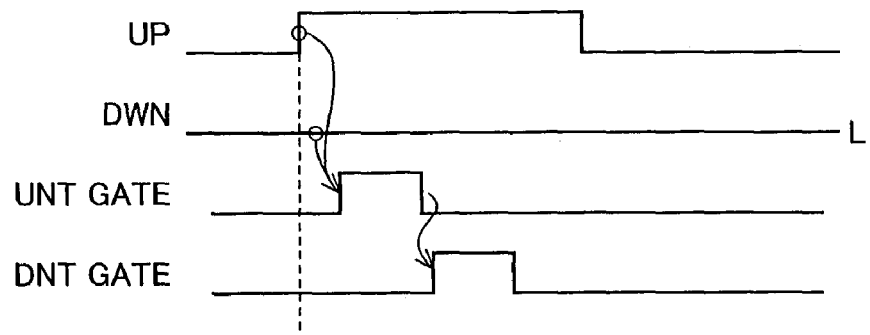
FIG. 30 is a signal waveform diagram representing an operation in writing data of a high resistance state according to the structure shown in FIG. 29.

The operation of tristate control circuit TCK will be described briefly. When data corresponding to a high resistance state is stored in latch circuit LT as shown in FIG. 30, tristate control circuit TCK sets control signal UP at an H level and control signal DWN at an L level. In write drive decoder 106, pull up transistor UNT of corresponding bit line driver BV is made conductive for a predetermined period of time according to control signal UP of an H level and control signal DWN of an L level. Then, this pull up transistor UNT is turned OFF (non-conductive) and pull down transistor DNT is turned ON (conductive). Accordingly, current flows rapidly through the selected bit line. The phase change element in the selected memory cell is rapidly heated and cooled to enter an amorphous state.

Figure 31:
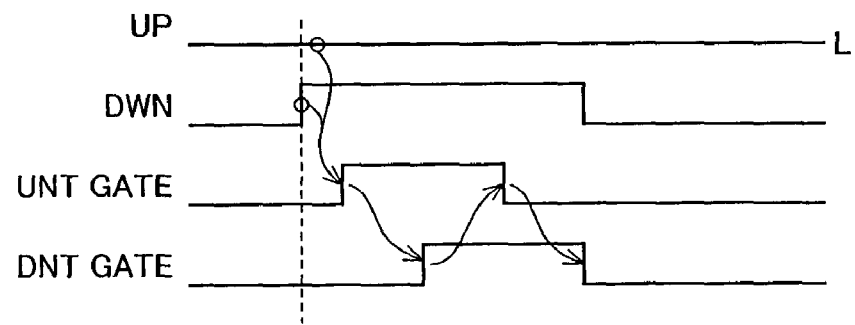
FIG. 31 is a signal waveform diagram representing an operation when data of a low resistance state of the structure shown in FIG. 29 is to be stored.

When storage data of a low resistance state is stored in corresponding latch circuit LT, tristate control circuit TCK sets control signal UP at an L level and control signal DWN at an H level as shown in FIG. 31. In write driver decoder 106, pull up transistor UNT of corresponding bit line driver BV is driven to an ON state in response to control signal UP of an L level and control signal DWN of an H level. The phase change element in the selected memory cell is set to a fused state. Then, write driver decoder 106 turns pull down transistor DNT into an ON state. Accordingly, pull up transistor UNT and pull down transistor DNT both attain an ON state in selected bit line driver BV, whereby the current supplied to the selected bit line is reduced. As a result, the phase change element in the selected memory cell is gradually cooled to enter a polycrystalline state.

When the selected memory cell transitions into a polycrystalline state, pull up transistor UNT is turned into an OFF state. Under this state, pull down transistor DNT maintains an ON state. As a result, the current supply to the selected bit line is ceased, and the phase change element in the selected memory cell is driven to a cooled state speedily. At an elapse of a predetermined period of time, pull down transistor DNT is turned into an OFF state.

In other words, when write data corresponds to a low resistance state, current is supplied to the phase change element of the selected memory cell to drive the phase change element to a fused state. Then, the current is gradually reduced to gradually cool down the phase change element, whereby the phase change element is driven from a fused state (amorphous state) to a polycrystalline state.

Figure 32:
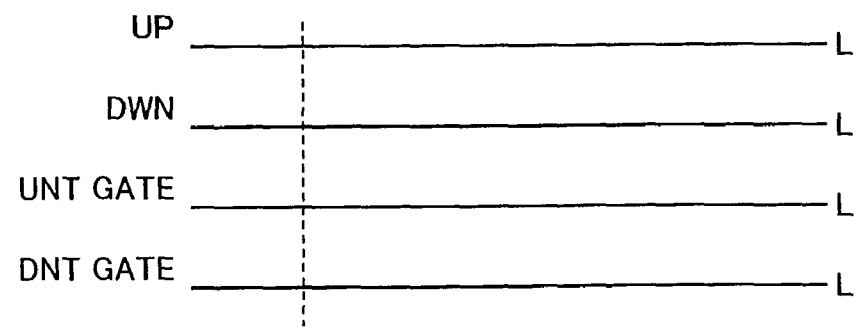
FIG. 32 is a signal waveform diagram representing the state in a write mode according to the structure of FIG. 29.

In operations other than a write operation, write activation signal WE is kept at an L level. Control signals UP and DWN output from tristate control circuit TCK are both set at an L level, as shown in FIG. 32. Write driver decoder 106 sets pull up transistor UNT and pull down transistor DNT of the corresponding bit line driver BV at an OFF state. The bit line is maintained at the floating state.

In a data writing operation, current is supplied to the bit line after the word line is driven to a selected state. When current is supplied to the bit line, the select transistor in the selected memory cell is ON according to the signal on the corresponding word line. Therefore, when the bit line current is supplied, current flows into the collector line via the select transistor of the memory cell in the selected memory cell. This prevents overshooting at the bit line to suppress application of an unnecessarily high voltage to the bit line. Consequently, application of a high voltage or high current to a memory cell can be prevented. Thus, damage of memory cell is obviated. Therefore, the supply of current to the bit line is performed relatively gently, not rapidly, so that the rise of the bit line current is relatively gradual. This gradual rise of the bit line current can be readily implemented by making gradual the rise characteristics of the control signal applied from write driver decoder 106 to the gate of pull up transistor UNT.

Figure 33:
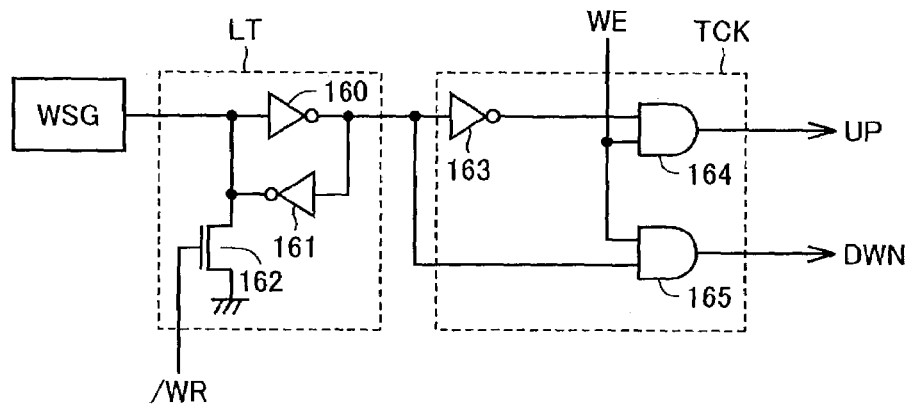
FIG. 33 shows an example of a construction of the tristate control circuit and latch circuit of FIG. 29.

FIG. 33 shows an example of a construction of the latch circuit and the corresponding tristate control circuit shown in FIG. 29. Referring to FIG. 33, latch circuit LT includes an inverter 160 inverting the data applied from write column select gate WSG, an inverter 161 inverting an output signal of inverter 160 and providing the inverted signal to an input of inverter 160, and a reset transistor 162 rendered conductive when the complementary write mode designation signal /WR is inactive, to set the input node of inverter 160 at the ground voltage level. Reset transistor 162 is formed of an N-channel MOS transistor.

Latch circuit LT is formed essentially of an inverter latch, and inverts and latches the signal applied via write column gate WSG. When latch circuit LT is in a non-selected state, the latching data is the data set by reset transistor 162.

Tristate control circuit TCK includes an inverter 163 inverting the latching data of latch circuit LT, an AND gate 164 receiving an output signal of inverter 163 and write activation signal WE to generate control signal UP, and an AND gate 165 receiving the output signal of latch circuit LT and write activation signal WE to generate control signal DWN.

When write activation signal WE is at an L level, control signals UP and DWN are both at an L level. When write activation signal WE is rendered active in a data write mode of operation, control signals UP and DWN are set to complementary voltage levels according to the latching data in latch circuit LT. When inverter 160 of latch circuit LT provides an output signal of an L level, control signals UP and DWN attain an H level and an L level, respectively, to specify a high resistance state. When inverter 160 of latch circuit LT provides an output signal of an H level, control signals UP and DWN attain an L level and an H level, respectively, to specify a low resistance state.

Write activation signal WE is applied commonly to the tristate control circuits provided corresponding to each bit line BL and dummy bit lines DBLa and DBLb, as shown in FIG. 21. Therefore, control signals UP and DWN are output in parallel from these circuits. Write driver decoder 106 drives a bit line driver corresponding to a selected bit line based on bit line address signal and the control signals UP and DWN.

Figure 34:
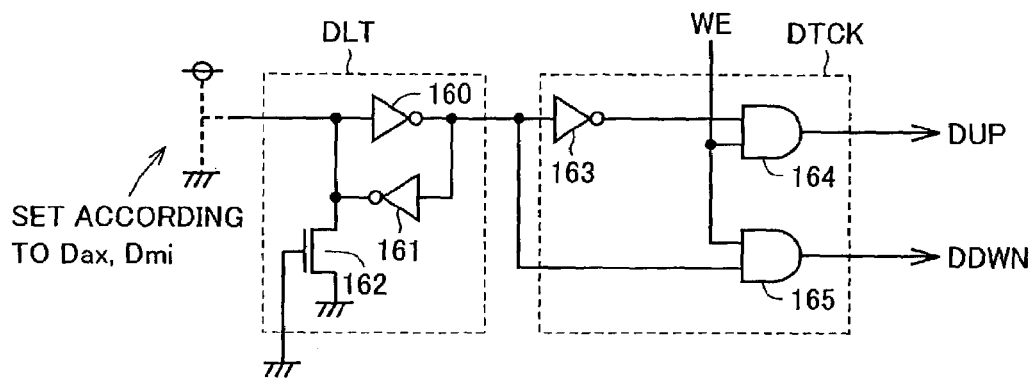
FIG. 34 shows an example of a construction of the latch circuit and the tristate control circuit with respect to the dummy bit line shown in FIG. 29.

FIG. 34 shows a construction of latch circuits DLTa and DLTb and tristate control circuits DTCKa and DTCKb of FIG. 21. Since the latch circuit and the tristate control circuit provided corresponding to dummy bit lines DBLa and DBLb have the same constructions, latch circuit DLT and tristate control circuit DTCK are depicted representatively in FIG. 34. Latch circuit DLT and tristate control circuit DTCK have constructions identical to those of latch circuit LT and tristate control circuit TCK provided corresponding to a normal bit line BL. Therefore, these latch circuit DLT and tristate control circuit DTCK have reference numerals identical to those corresponding to latch circuit LT and TCK allotted to like components, and detailed description thereof will not be repeated.

In latch circuit DLT shown in FIG. 34, the input of inverter 160 is connected selectively and fixedly to the node that supplies power supply voltage or the node that supplies ground voltage according to dummy data Dax or Dmi. The resetting MOS transistor 162 has a gate fixed at the ground voltage level, and maintains a non-conductive state constantly. Therefore, dummy data Dax or Dmi is constantly maintained in latch circuit DLT.

Dummy data Dax and Dmi have their connection paths set according to mask interconnection. This is because dummy cells DMCa and DMCb must be programmed to a high resistance state and a low resistance state after completion of the fabrication process. These dummy cells DMCa and DMCb are subjected to various testing after programmed respectively to a high resistance state and a low resistance state. Data writing to the dummy cells DMCa and DMCb is carried out in a manner similar to that for a normal memory cell MC shown in the below.

Figure 35:
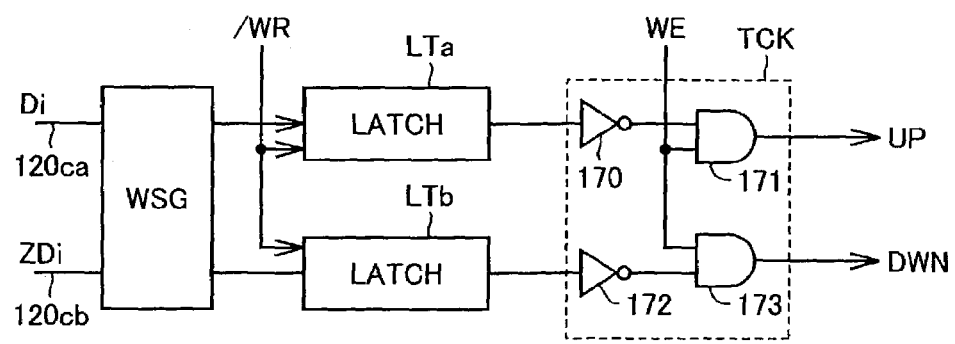
FIG. 35 shows a modification of the latch circuit and tristate control circuit.

FIG. 35 shows a construction of a modification of latch circuit LT and tristate control circuit TCK. According to the construction of FIG. 35, the internal write data line is comprised of complementary data lines 120ca and 120cb, through which complementary write data Di and ZDi are transferred. Therefore, write column select gate WSG includes transfer gates disposed corresponding to complementary write data lines 120ca and 120cb.

Latch circuit LT includes latches LTa and LTb provided corresponding to complementary write data lines 120ca and 120cb, respectively. Latches LTa and LTb each have a construction similar to that of latch circuit LT shown in FIG. 33. In operations other than data writing instructed by activation (L level) of an inverted signal /WR of write mode designation signal WR, latches LTa and LTb have their latching data fixed at the L level.

Tristate control circuit TCK includes an inverter 170 inverting the latched data of latch LTa, an AND gate 171 receiving the output data of inverter 170 and write activation signal WE to generate control signal UP, and an AND gate 172 receiving the latched data of latch LTb and write activation signal WE to generate control signal DWN.

According to the construction shown in FIG. 35, latches LTa and LTb in a non-selected state maintain the initial state unless data writing is carried out in a data writing mode of operation. Therefore, the output data from latches LTa and LTb corresponding to a non-selected bit line is at an H level (latches LTa and LTb each have a circuit configuration identical to that of latch circuit LT shown in FIG. 33).

In tristate control circuit TCK corresponding to a non-selected bit line, the latch data of latches LTa and LTb are inverted by inverters 170 and 172. Therefore, control signals UP and DWN output from AND gates 171 and 173 maintain an L level even when write activation signal WE is raised to an H level. During inactivation of write activation signal WE, control signals UP and DWN are maintained at an L level.

Therefore, when complementary write data lines are used as shown in FIG. 35, control signals UP and DWN corresponding to only the selected bit line have only to be charged/discharged. Therefore, current consumption in a data write operation can be reduced.

When latches LTa and LTb are configured to provide output data of an L level when initialized, inverters 0.170 and 172 in tristate control circuit TCK are not needed. In such a construction of latches LTa and LTb, a resetting transistor 162 of FIG. 33 is needed to dispose at the output instead of the input of latches LTa and LTb.

[Structure of Write Driver Decoder]

Figure 36:
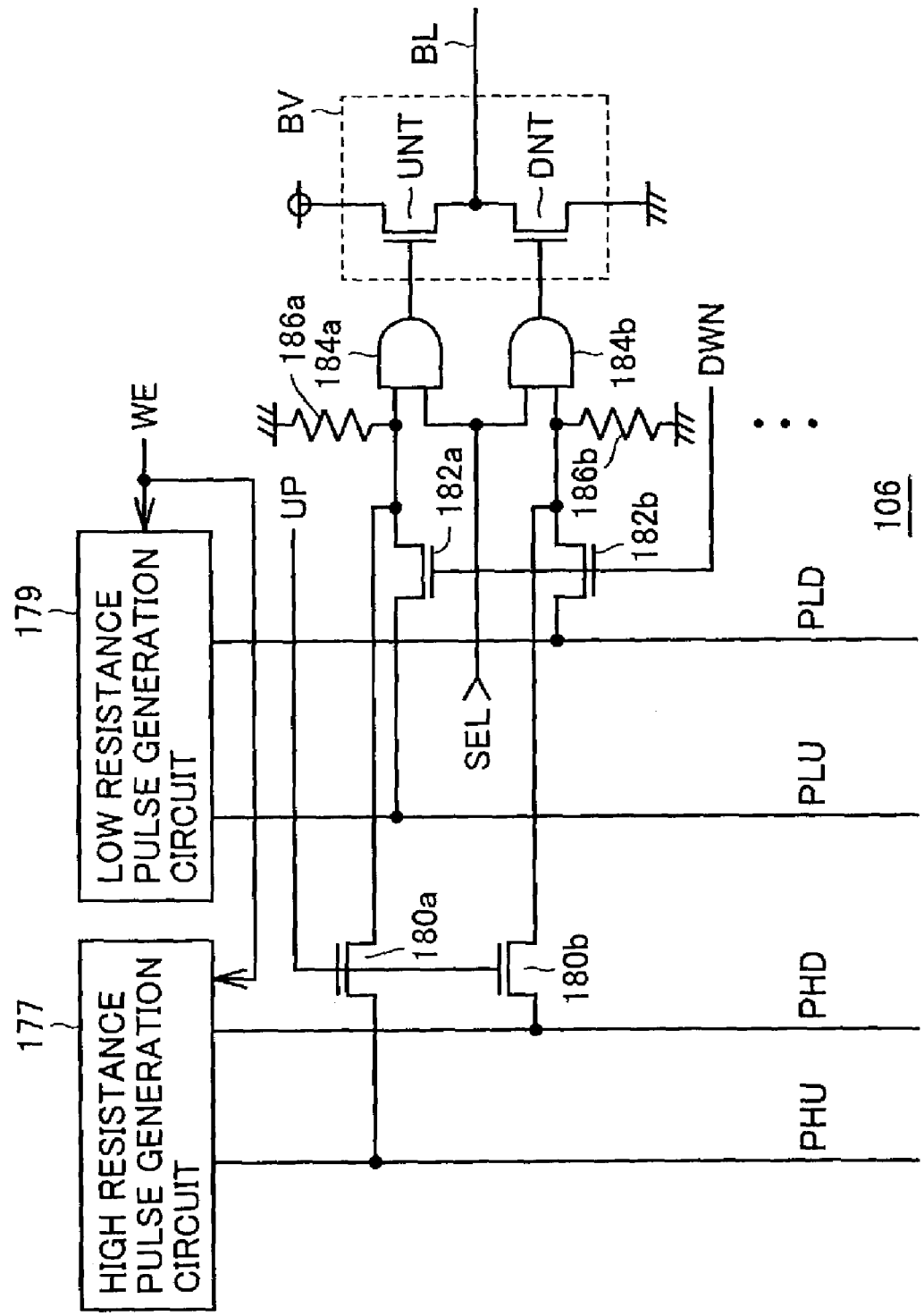
FIG. 36 shows an example of a construction of the write driver decoder of FIG. 29.

FIG. 36 shows an example of a construction of write driver decoder 106 shown in FIG. 20. In FIG. 36, a construction of the portion related to one bit line BL is shown representatively.

Referring to FIG. 36, write driver decoder 106 includes a high resistance pulse generation circuit 177 for generating a high resistance pulse setting a memory cell into a high resistance state in response to activation of write activation signal WE, and a low resistance pulse generation circuit 179 responsive to activation of write activation signal WE for generating a low resistance pulse setting a memory cell into a low resistance state. High resistance pulse generation circuit 177 and low resistance pulse generation circuit 179 are provided in common to the bit line drivers of a corresponding memory array. Alternatively, the memory array may be divided into a plurality of blocks, and high resistance pulse generation circuit 177 and low resistance of generation circuit 179 can be provided for each block. By controlling generation of the write pulse on a block-by-block basis, the charge/discharge current of the signal line can be reduced to reduce current consumption. Furthermore, the write pulse can be changed at high speed. Steep rise characteristic is not required for the write pulse (to prevent rapid charging/discharging of selected bit line BL from causing overshooting/undershooting). Therefore, common provision of high resistance pulse generation circuit 177 and low resistance pulse generation circuit 179 to the bit lines of the corresponding memory array would not cause any disadvantage.

High resistance pulse generation circuit 177 generates a pulse signal PHU to control pull up transistor and a pulse signal PHD to control a pull down transistor in a predetermined sequence. Low resistance pulse generation circuit 179 generates a pulse signal PLU to control a pull up transistor, and a pulse signal PLD to control a pull down transistor DNT.

Write drive decoder 106 further includes transfer gates 180a and 180b selecting the pulse signals PHU and PHD outputted from high resistance pulse generation circuit 177 according to the control signal UP from a corresponding tristate control circuit, and transfer gates 182a and 182b selecting pulse signals PLU and PLD generated from low resistance pulse generation circuit 179 according to the control signal DWN from a corresponding tristate control circuit. Transfer gates 180a and 180b are each depicted being configured of an N-channel MOS transistor that receives control signal UP at its gate. However, transfer gates 180a and 180b each may be formed of an N-channel MOS transistor receiving control signal UP at its gate and a P-channel MOS transistor receiving control signal DWN at its gate. In other words, transfer gates 180a and 180b each may be formed of a CMOS (Complementary MOS) transmission gate.

The same applies to transfer gates 182a and 182b. Transfer gates 182a and 182b each may be formed of an N-channel MOS transistor receiving control signal DWN at its gate, and a P-channel MOS transistor receiving control signal UP at its gate. In other words, transfer gates 182a and 182b each may be formed of a CMOS transmission gate.

Write driver decoder 106 further includes an AND gate 184a receiving a select signal SEL from a decoder not shown and a signal selected by transfer gates 180a and 182a, and an AND gate 184b receiving select signal SEL and a signal selected by control gates 180b and 182b. The output signal of AND gate 184a is applied to the gate of pull up transistor UNT of bit line driver BV whereas the output signal of AND gate 184b is applied to the gate of pull down transistor DNT of bit line driver BV.

The node receiving the pulse signal transferred by transfer gates 180a and 182a is provided with a pull down resistor 186a. The node receiving the pulse signal transferred by transfer gates 180b and 182b is provided with a pull down resistor 186b. These resistors function to prevent the input nodes of AND gates 184a and 184b entering an electrically floating state when control signals UP and DWN both turn L level.

The set of transfer gates 180a, 180, 182a and 182b and AND gates 184a and 184b is provided corresponding to each respective bit line driver BV.

Select signal SEL is generated by decoding a bit line address signal.

According to the construction of write driver decoder 106 of FIG. 36, a pulse determined by control signals UP and DWN is applied to bit line driver BV specified by select signal SEL. When control signal UP is at an H level, the conduction of pull up transistor UNT and pull down transistor DNT of bit line driver BV is controlled according to pulses PHU and PHD from high resistance pulse generation circuit 177. When control signal DWN is at H level, the conduction of pull up transistor UNT and pull down transistor DNT of bit line driver BV is controlled according to the pulses PLU and PLD from low resistance pulse generation circuit 179.

Select signal SEL attains an L level for non-selected bit line driver BV. Therefore, AND gates 184a and 184b provide output signals of an L level. Non-selected bit line driver BV maintains an output high impedance state. Since control signals UP and DWN are both at an L level in non-writing period, the output signals of AND gates 184a and 184b are maintained at an L level by pull down resistors 186a and 186b. Responsively, bit line driver BV is maintained at an output high impedance state.

Figure 37:
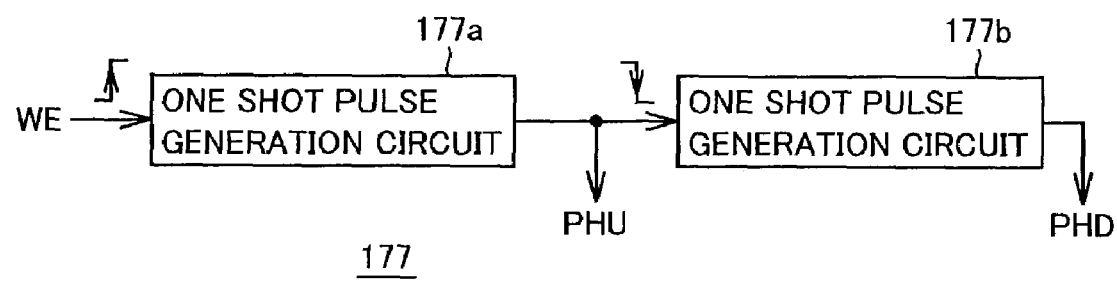
FIG. 37 shows an example of a construction of the high resistance pulse generation circuit of FIG. 36.

FIG. 37 schematically shows an example of a construction of high resistance pulse generation circuit 177 of FIG. 36. Referring to FIG. 37, high resistance pulse generation circuit 177 includes a one shot pulse generation circuit 177a responsive to a rise of write activation signal WE for generating a one shot pulse signal having a predetermined time width, a one shot pulse generation circuit 177b responsive to a fall of the output signal of one shot pulse generation circuit 177a for generating a one shot pulse signal having a prescribed time width. One shot pulse generation circuits 177a and 177b output the pulses PHU and PHD, respectively.

Figure 38:
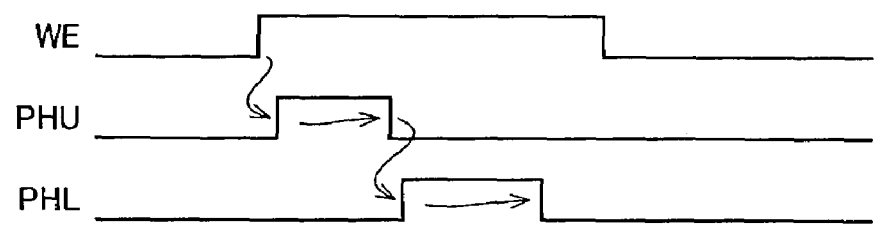
FIG. 38 is a signal waveform diagram representing an operation of the high resistance pulse generation circuit of FIG. 37.

FIG. 38 is a signal waveform diagram representing an operation of high resistance pulse generation circuit 177 of FIG. 37. The operation of high resistance pulse generation circuit 177 of FIG. 37 will be now be described with reference to FIG. 38.

When write activation signal WE rises, one shot pulse generation circuit 177a generates a one shot pulse signal as the pulse PHU. When this pulse PHU falls at an elapse of the predetermined period of time, the pulse PHD from one shot pulse generation circuit 177b turns H level for the prescribed time.

Owing to one shot pulse generation circuits 177a and 177b shown in FIG. 37, pull up transistor UNT can have its gate voltage driven to an H level for the predetermined time to maintain an ON state, and pull down transistor DNT can be driven into an ON state upon transition of pull up transistor UNT to an OFF state in bit line driver BV. Accordingly, fusing through heating and rapid cooling can be performed cell to set the phase change element to an amorphous state in a selected memory.

Figure 39:
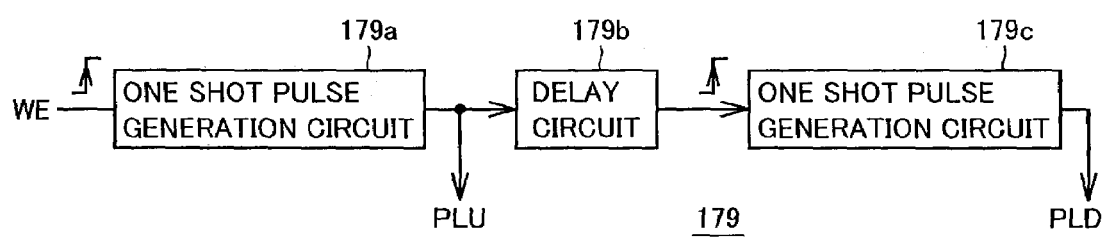
FIG. 39 shows an example of a structure of the low resistance pulse generation circuit of FIG. 36.

FIG. 39 schematically shows a construction of low resistance pulse generation circuit 179 of FIG. 36. Referring to FIG. 39, low resistance pulse generation circuit 179 includes a one shot pulse generation circuit 179a responsive to activation of write activation signal WE for generating a one shot pulse PLU having a predetermined time width, a delay circuit 179b delaying by a predetermined time a pulse PLU outputted from one shot pulse generation circuit 179a, and a one shot pulse generation circuit 179c responsive to a rise of the output signal of delay circuit 179b for generating a one shot pulse PLD having a predetermined time width. By the delay time of delay circuit 179b, the phase change element in the selected memory cell is reliably set to a fused state.

Figure 40:
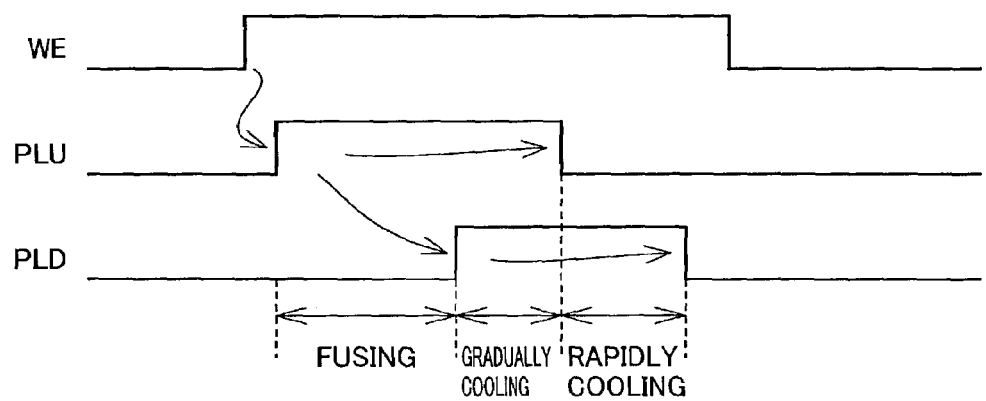
FIG. 40 is a signal waveform diagram representing an operation of the low resistance pulse generation circuit shown in FIG. 39.

FIG. 40 is a signal waveform diagram representing an operation of low resistance pulse generation circuit 179 of FIG. 39. The operation of low resistance pulse generation circuit 179 of FIG. 39 will now be described briefly.

When write activation signal WE attains an active state, one shot pulse generation circuit 179a generates an output pulse PLU of an H level for a predetermined time. In response to this pulse PLU, pull up transistor UNT of a selected bit line driver is rendered conductive, to supply current to the corresponding bit line. The phase change element in the selected memory cell transitions into a fused state.

At an elapse of the delay time of delay circuit 179b, one shot pulse generation circuit 179c generates the pulse PLD having a predetermined time width. While both pulses PLU and PLD are at an H level, the current supply from the selected bit line driver to a corresponding bit line is reduced, whereby the phase change element of the selected memory cell is gradually cooled down (quenched). When the pulse PLU attains an L level and supply of the bit line current is ceased, the selected bit line is driven down to the level of ground voltage by the H level period of the pulse PLD to rapidly cool down the phase change element of the selected memory cell. Therefore, by maintaining only the pulse signal PLD at an H level, the bit line current is discharged through the bit line driver while ceasing the current supply to the memory cell. The phase change element, maintained in the polycrystalline state during the gradual quenching period of the H level period of the pulses PLU and PLD, is rapidly cooled down to maintain the polycrystalline state.

By making the delay time of the delay circuit 179b or the period until transition of the selected memory cell into the fused state trimmable with a laser beam or others, the heating time and gradual cooling time period can be set appropriately depending on the property of the phase change element of the memory cell.

[Modification]

Figure 41:
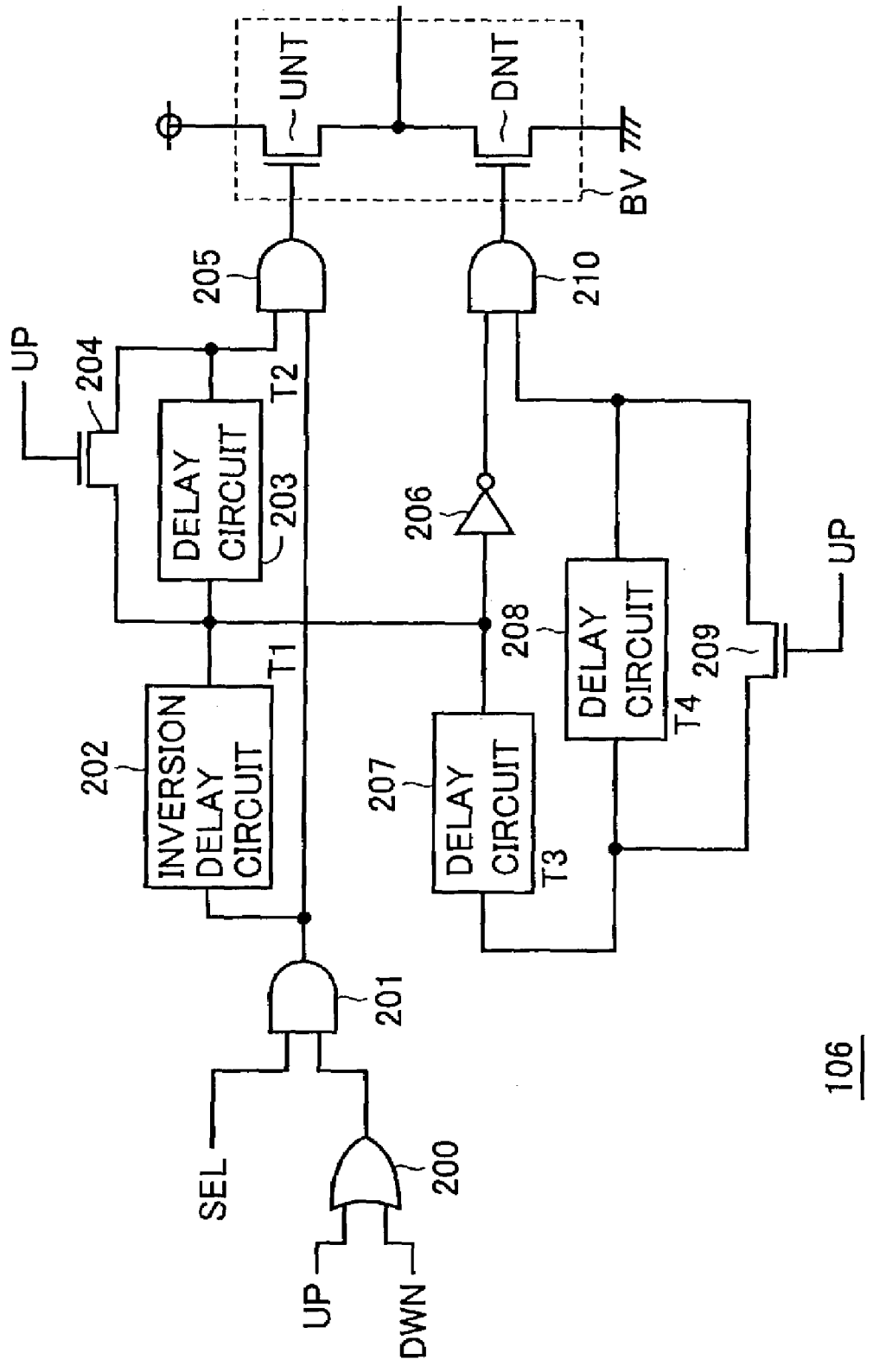
FIG. 41 shows the modification of the write driver decoder of FIG. 29.

FIG. 41 shows a modification of write decoder 106. In FIG. 41, a circuit for generating a control pulse is provided corresponding to each respective bit line driver BV.

Referring to FIG. 41, write driver decoder 106 includes an OR circuit 200 receiving control signals UP and DWN from a corresponding tristate control circuit, an AND circuit 201 receiving an output signal of OR circuit 200 and select signal SEL, an inversion delay circuit 202 for inverting and delaying by a predetermined period of time an output signal from AND circuit 201, a delay circuit 203 for delaying by a predetermined time an output signal from inversion delay circuit 202, a transfer gate 204 for short-circuiting delay circuit 203 when control signal UP from a corresponding tristate control circuit is rendered active, and an AND circuit 205 receiving the output signal of AND circuit 201 and an output signal of delay circuit 203 or transfer gate 204. The output signal from AND circuit 205 is applied to a gate of pull up transistor UNT of a corresponding bit line driver BV.

Delay circuit 202 has a delay time T1, whereas delay circuit 203 has a delay time T2.

Write driver decoder 106 further includes an inverter circuit 206 inverting the output signal of inversion delay circuit 202, a delay circuit 207 delaying the output signal of inversion delay circuit 202 by a predetermined time, a delay circuit 208 delaying the output signal of delay circuit 207, a transfer gate 209 for short-circuiting delay circuit 208 according to control signal UP from a corresponding tristate control circuit, and an AND gate 210 receiving the output signal of inversion circuit 206 and an output signal of delay circuit 208 or transfer gate 209. The output signal of AND circuit 210 is applied to a gate of pull down transistor DNT of the corresponding bit line driver BV.

Delay circuits 207 and 208 have a delay time T3 and a delay time T4, respectively.

Figure 42:
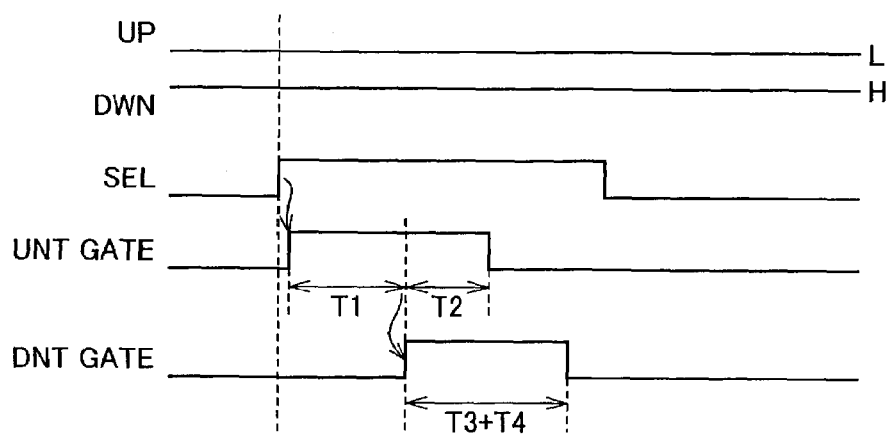
FIG. 42 is a signal waveform diagram representing an operation of the write driver decoder of FIG. 41.

FIG. 42 is a signal waveform diagram representing an operation of write driver decoder 106 shown in FIG. 41 in the case when control signal UP is at an L level and control signal DWN is at an H level. The operation of write driver decoder 106 of FIG. 41 will now be described with reference to FIG. 42.

When control signal UP is at an L level, transfer gates 204 and 209 are in a non-conductive state. When select signal SEL rise to an H level, the output signal of AND circuit 201 goes high since the output signal of OR circuit 200 attains an H level in response to the control signal DWN. In response to the rise of select signal SEL, the output signal of AND circuit 205 goes high. At an elapse of a delay time of T1 of inversion delay circuit 202, the output signal of inverter 206 goes high. In response, the signal applied to the gate of pull down transistor DNT from AND circuit 210 goes high.

At an elapse of delay time T2 of delay circuit 203 since the fall of the output signal of inversion delay circuit 202 to an L level, the output signal of AND circuit 205 attains an L level, and pull up transistor UNT is rendered non-conductive. AND circuit 210 drives its output signal to an L level at an elapse of delay time T3 and T4 of delay circuits 207 and 208 since the rise of the output signal to an H level.

By the period of time of delay time T1 of inversion delay circuit 202, the phase change element in the selected memory cell is driven into a fused state. Then, pull up transistor UNT and pull down transistor DNT are both set to an ON state to reduce the current supplied to the selected memory cell for gradually cooling down the phase change element. Then, the bit line is driven to the level of the ground voltage while pull down transistor DNT is maintained at an ON state, to cool down the phase change element.

Through the above series of operations, the phase change element of the selected memory cell can be set to a low resistance state of a polycrystalline state.

Figure 43:
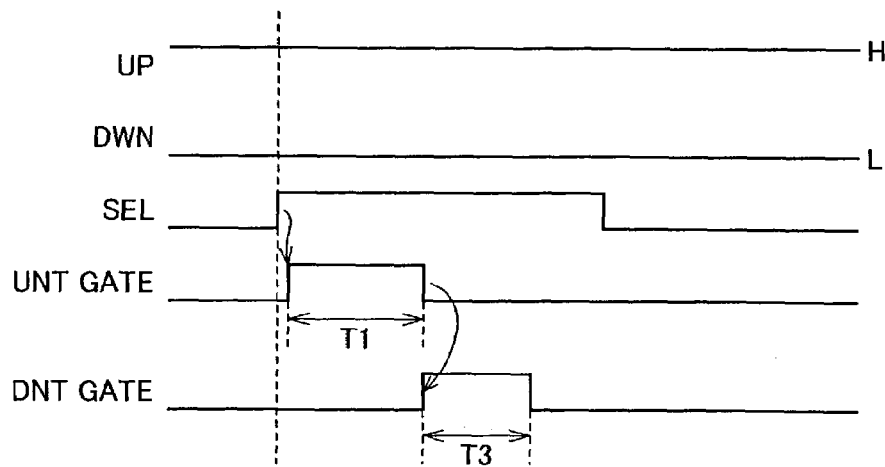
FIG. 43 is a signal waveform diagram showing an operation of the write driver decoder of FIG. 41.
Figure 44:
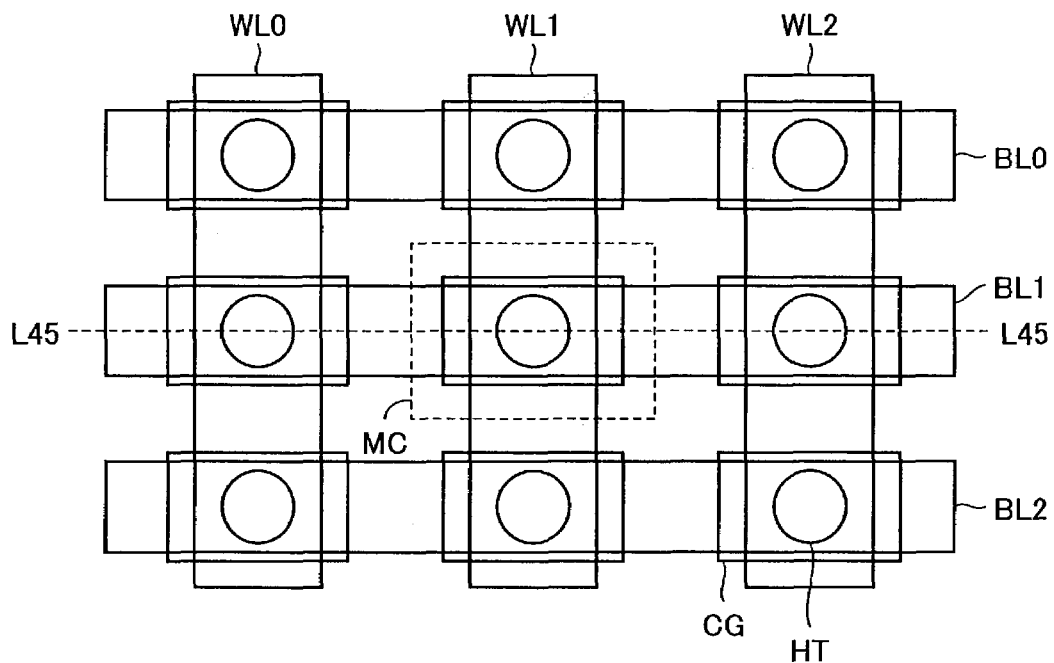
FIG. 44 schematically shows the layout of the memory array in a conventional non-volatile semiconductor memory device.
Figure 45:
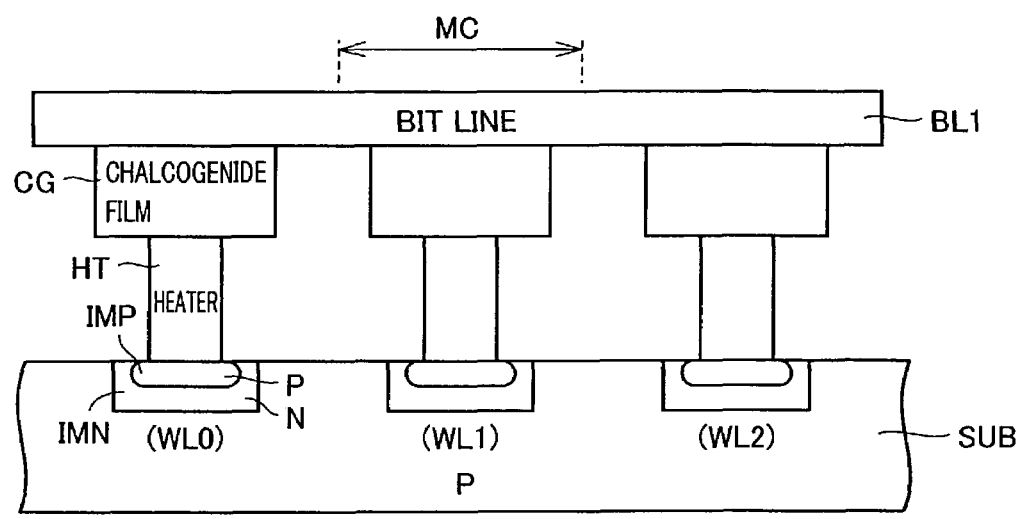
FIG. 45 schematically shows a sectional structure taken along line L45—L45 of FIG. 44.
Figure 46:
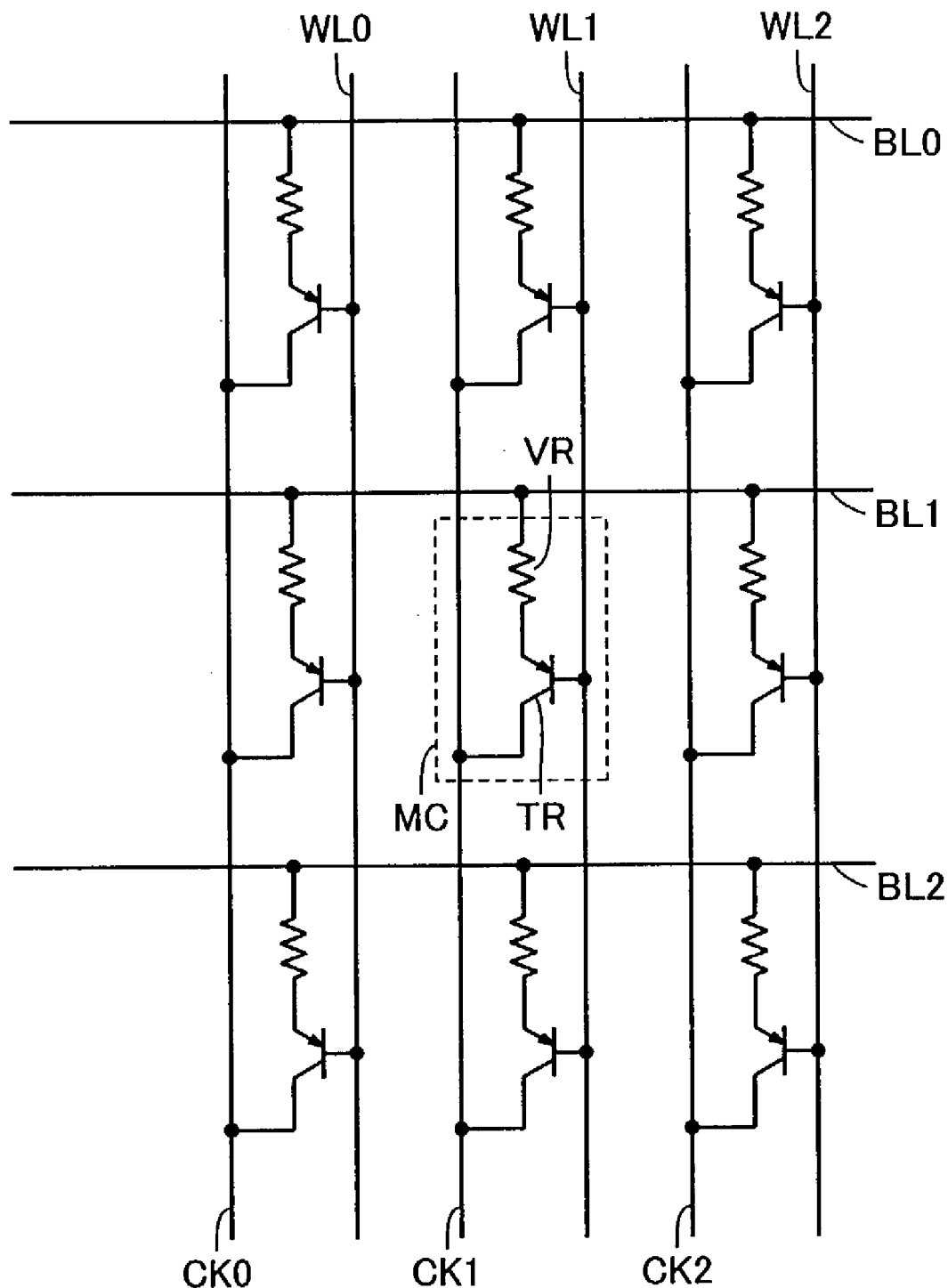
FIG. 46 shows an electrical equivalent circuit of the memory cells of FIG. 44.

FIG. 43 is a signal waveform diagram representing an operation of write drive decoder 106 of FIG. 41 in the case when control signal UP is at an H level and control signal DWN is at an L level. The write operation of high resistance state data will now be described with reference to FIG. 43.

Since control signal UP is at an H level, transfer gates 204 and 209 of FIG. 41 are made conductive to short-circuit delay circuits 203 and 208, respectively. Then, select signal SEL goes high. At an elapse of delay time T1 of inversion delay circuit 202 since the rise of the output signal of AND circuit 205 to an H level, the output signal of AND circuit 205 is driven to an L level. In response to the fall of the output signal of inversion delay circuit 202, AND circuit 210 drives the output signal to an H level, to make pull down transistor DNT conductive.

Under this state, at an elapse of delay time T3 of delay circuit 207, the output signal of AND circuit 210 attains an L level, and pull down transistor DNT is turned OFF. Therefore, when the phase change element of the selected memory cell enters a fused state by the current supply via pull up transistor UNT, current supply is ceased, and the bit line current is drawn via pull down transistor DNT. The phase change element in the fused state is rapidly cooled down, whereby the phase change element of the selected memory cell enters an amorphous state.

When the construction of write driver decoder 106 of FIG. 41 is employed, a bit line driver control circuit can be disposed corresponding to each bit line driver BV. It is not necessary to generate a control pulse commonly to all bit lines in write driver decoder 106, resulting in reduced current consumption.

Select signal SEL is generated from the bit line decoder shown in FIG. 29. In the 1-bit/1-cell mode, select signal SEL specifies one bit line. In the 1-bit/2-cell mode, select signal SEL specifies two bit lines. Therefore, data is written on a bit line basis in the 1-bit/1-cell mode, and data is written on a bit line pair basis in 1-bit/2-cell mode.

By sequentially updating select signal SEL under the state in which the control signals UP and DWN are fixed, i.e., while write activation signal WE is maintained at an active state, data can be sequentially written into the memory cells on a selected row under the state in which the write data are latched in latch circuits LT shown in FIG. 29.

When there is margin in terms of current consumption and heat generation, data can be written simultaneously to memory cells of one row by substituting select signal SEL with the write activation signal WE.

When a column select signal transition detection signal (address transition detection signal in data writing) is used instead of write activation signal WE in the construction of the write driver decoder of FIGS. 36 to 39, either, data can be written in to memory cells by generating the high resistance pulses PHU and PHD and the low resistance pulses PLU and PLD in each writing operation and sequentially selecting the memory cells on a selected row.

A construction similar to that shown in FIG. 41 is provided also for dummy cells DMCa and DMCb. Select signal SEL is so set as to select dummy bit lines DBLa and DBLb when dummy cells DMCa and DMCb are programmed. Since dummy cells DMCa and DMCb already store data in a non-volatile manner in a normal operation mode, no particular problem will occur even if select signal SEL is maintained at a non-select state for dummy bit lines DBLa and DBLb in the normal mode of operation.

According to the construction of FIG. 29, internal data line 120c is provided separately from the data line for data reading. Internal data lines 120a and 120b for data reading are provided. Therefore, when these internal data lines 120a and 120b are configured to receive complementary data in a data writing operation, the column select circuit and bit line decoder can be shared between data writing and data reading. In such an arrangement, it is required to maintain all current sources 35a–35b in the internal data lines in an inactive state in data writing mode.

In the bit line driver BV, pull up transistor UNT and pull down transistor DNT may be formed of a plurality of unit transistors provided in parallel. These plurality of unit transistors are sequentially turned ON. In the transition into an OFF state, these unit transistors may be driven to an OFF state simultaneously or at different timings. A gate control signal is applied to the gate of each unit transistor via a delay circuit. Thus, the bit line current can be gradually increased or gradually reduced.

According to the third embodiment of the present invention, data storage can be performed in any of the 1-bit/1-cell mode and 1-bit/2-cell mode. Therefore, data can be stored accurately even for ultra-miniaturized memory cells. Particularly, a memory of high versatility occupying only a small area can be implemented by storing data, such as code data, required of reliability in the 1-bit/2-cell mode and by storing data, such as a large volume of data, required of less reliability in the 1-bit/1-cell mode respectively.

The above-described first to third embodiments may be employed individually or in combination.

According to the present invention, data can be stored stably using fine-processed memory cells. Moreover, data can be accessed at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a plurality of bit lines each arranged extending in a column direction;
    a plurality of memory cells, arranged in rows and columns and disposed such that said plurality of bit lines are arranged corresponding to the respective columns of the memory cells, each being connected to the bit line of a corresponding column, and including a phase change element being substantially identical in width in a row direction to the bit line on a corresponding column and having a crystalline state thereof changed according to stored data; and
    a plurality of word lines arranged corresponding to the rows of the memory cells, each coupled to the memory cells on a corresponding row and formed of an impurity region coupled to the phase change elements on the corresponding row.

2. The non-volatile semiconductor memory device according to claim 1, wherein said phase change element of each memory cell is formed in self alignment to the bit line on a corresponding column.

3. A non-volatile semiconductor memory device comprising:
    a plurality of memory cells, arranged in rows and columns, each including a variable resistance element having a resistance value set in accordance with stored data to store data in a non-volatile manner;
    a plurality of word lines, arranged corresponding to the respective rows of the memory cells, each formed of a first impurity region formed on a semiconductor substrate region and coupled to the resistance elements of the memory cells of a corresponding row;
    a plurality of dummy cells, arranged in alignment with the memory cells in at least one of a row direction and a column direction, each including a variable resistance element being the same in number as each memory cell and suppressing means for preventing a current flow between a corresponding resistance element and the semiconductor substrate region, said semiconductor substrate region being coupled in common to the memory cells and the dummy cells.

4. The non-volatile semiconductor memory device according to claim 3, wherein the dummy cells are arranged in the row direction, and the suppressing means of each dummy cell comprises a high resistor of a high resistance provided between the corresponding resistance element and the semiconductor substrate region, said high resistance being higher than a resistance between the variable resistance element and the substrate region of each memory cell.

5. The non-volatile semiconductor memory device according to claim 3, wherein said preventing means comprises a second impurity region formed on said semiconductor substrate region and coupled to the corresponding resistance element, said second impurity region being opposite in conductivity type to said semiconductor substrate region and fixed to a bias potential for preventing the current flow between the corresponding resistance element and the semiconductor substrate region.

6. A non-volatile semiconductor memory device comprising:
    a plurality of memory cells, arranged in rows and columns, each including a variable resistance element having a resistance value set in accordance with stored data to store data in a non-volatile manner;
    a plurality of word lines, arranged corresponding to the respective rows of the memory cells, each formed of a first impurity region formed on a semiconductor substrate region and coupled to the resistance elements of the memory cells of a corresponding row;
    a plurality of dummy cells, arranged adjacently to memory cells, each including a variable resistance element being the same in number as each memory cell,
    each memory cell further comprising a transistor switch having said first impurity region as a control electrode and selectively made conductive, in accordance with a signal potential on a corresponding word line, to electrically couple the resistance element to said semiconductor substrate region,
    said plurality of dummy cells comprising dummy cells arranged in a line in alignment along the row direction, and
    a substrate shunting line arranged along and adjacent to a row of the dummy cells arranged in a line, and electrically connected to said semiconductor substrate region of the dummy cells arranged in a line at an interval covering a plurality of the dummy cells.

7. The non-volatile semiconductor memory device according to claim 3, wherein said variable resistance element includes a phase change element having a resistance value changing according to a crystalline state thereof.

8. The non-volatile semiconductor memory device according to claim 6, further comprising a word line shunting line, arranged extending in the row direction and corresponding to each memory cell row, and connected to the first impurity region of a corresponding row at an interval covering a plurality of the memory cells arranged in the row direction, said word line shunting line and said substrate shunting line formed separately and individually on a same interconnection layer.

9. The non-volatile semiconductor memory device according to claim 6, wherein said plurality of dummy cells comprises first dummy cells arranged in a line in alignment along a row direction, and second dummy cells arranged in a line in alignment along a column direction, and
    the memory cells are arranged in alignment with the first and second dummy cells, and the first and second dummy cells are arranged in an array of the memory cells so as to be sandwiched by the memory cells.

10. The non-volatile semiconductor memory device according to claim 5, wherein
    the dummy cells comprises cells arranged in alignment in a column direction in at least two columns;

said non-volatile semiconductor memory device further comprises a substrate shunting line arranged extending in a column direction and electrically connected to a substrate region for forming the memory cells at intervals covering a plurality of the memory cells arranged in the row direction in a region between the columns of the dummy cells.

11. A non-volatile memory device comprising:

a plurality of memory cells, arranged in rows and columns, each including (1) a phase change element having a crystalline state changing according to stored data, (2) a heater element coupled to said phase change element, for heating said phase change element and (3) a heat blocking layer formed at a region in at least one of a) a region between said heater element and a semiconductor substrate region and b) a region between said phase change element and a data transfer line, for suppressing heat from propagating from said heater elements; and a plurality of bit lines, arranged corresponding to the columns of the memory cells, each connected to the memory cells on a corresponding column, and serving as said data transfer line, data stored in each memory cell determining an amount of current flow between a corresponding bit line and said semiconductor substrate region through said heat blocking layer.

* * * * *